US 6,870,598 B2

(12) United States Patent
Nishi

(10) Patent No.: US 6,870,598 B2
(45) Date of Patent: Mar. 22, 2005

(54) PROJECTION EXPOSURE APPARATUS

(75) Inventor: Kenji Nishi, Kanagawa-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/378,932

(22) Filed: Mar. 5, 2003

(65) Prior Publication Data

US 2003/0151728 A1 Aug. 14, 2003

Related U.S. Application Data

(60) Division of application No. 09/722,540, filed on Nov. 28, 2000, now Pat. No. 6,545,746, which is a continuation of application No. 09/123,449, filed on Jul. 28, 1998, now abandoned, which is a continuation-in-part of application No. 08/813,968, filed on Mar. 3, 1997, now abandoned.

(30) Foreign Application Priority Data

Mar. 4, 1996 (JP) .............................................. 8-45795
Mar. 4, 1996 (JP) .............................................. 8-45796
Aug. 25, 1997 (JP) ............................................. 9-227712

(51) Int. Cl.$^7$ ........................ G03B 27/52; G03B 27/42; G03B 27/32
(52) U.S. Cl. .............................. 355/30; 355/53; 355/77
(58) Field of Search ............................. 355/30, 53, 77; 250/548

(56) References Cited

U.S. PATENT DOCUMENTS 4,704,348 A   11/1987  Koizumi et al.
4,907,021 A   3/1990   Yabu
4,989,031 A   1/1991   Kamiya
5,559,584 A   9/1996   Miyaji et al.
5,691,802 A   11/1997  Takahashi
5,696,623 A * 12/1997  Fujie et al. ................... 359/350
5,801,816 A   9/1998   Shiraishi
6,295,121 B1 * 9/2001   Nakamura ..................... 355/67
6,341,006 B1 * 1/2002   Murayama et al. ........... 355/53

FOREIGN PATENT DOCUMENTS

JP          61-079228          4/1986

* cited by examiner

Primary Examiner—Henry Hung Nguyen
(74) Attorney, Agent, or Firm—Westerman, Hattori, Daniels & Adrian, LLP

(57) ABSTRACT

A projection optical system includes a first objective portion and an optical axis turn portion, each having an optical axis perpendicular to a reticle; an optical axis deflecting portion having an optical axis perpendicularly intersecting the above optical axis; and a second objective portion having an optical axis parallel to the above optical axis. An image-forming light beam from the reticle is returned toward the reticle by the first objective portion and a concave mirror provided in the optical axis turn portion to form a one-to-one image of the reticle. The returned image-forming light beam is led to the second objective portion through the optical axis deflecting portion to form a demagnified image on a wafer.

9 Claims, 21 Drawing Sheets

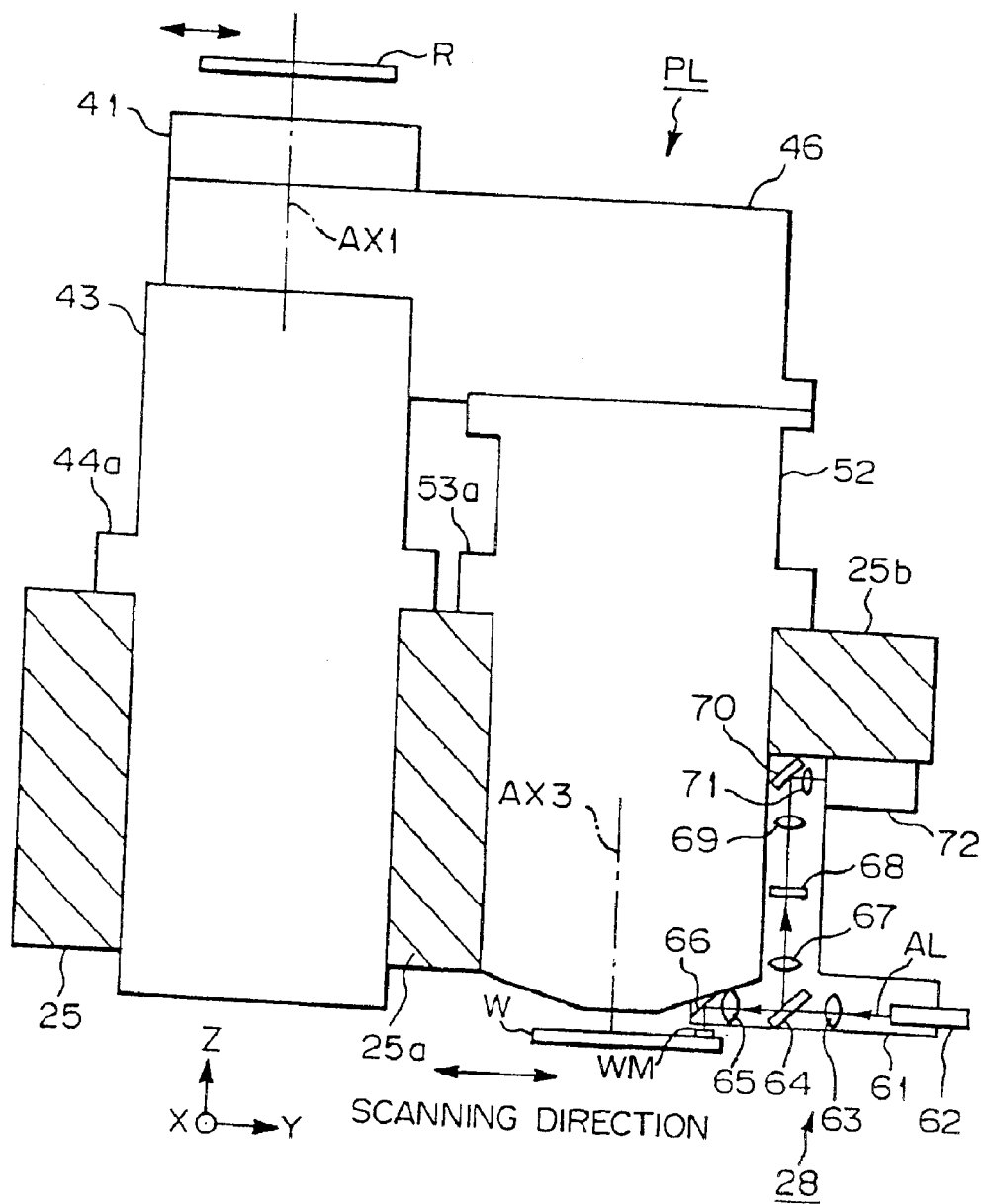

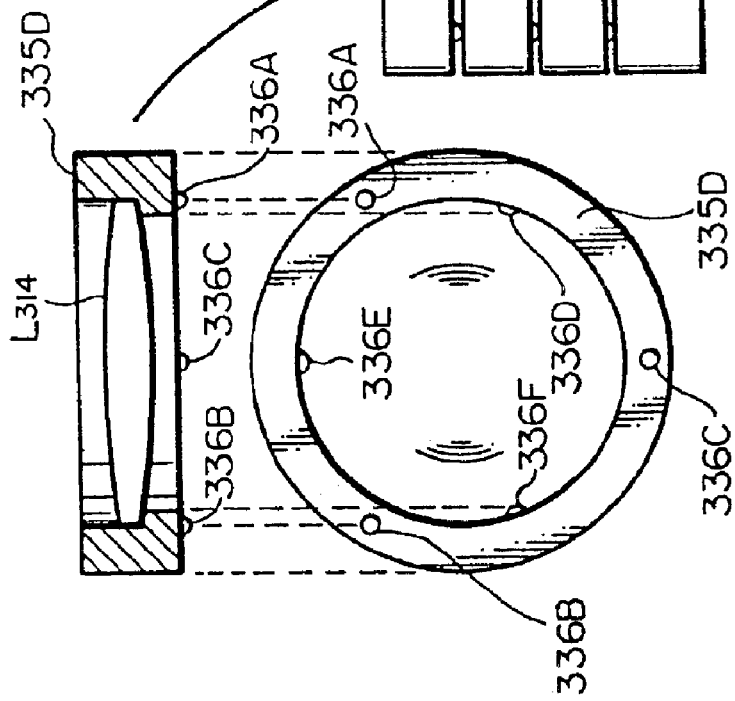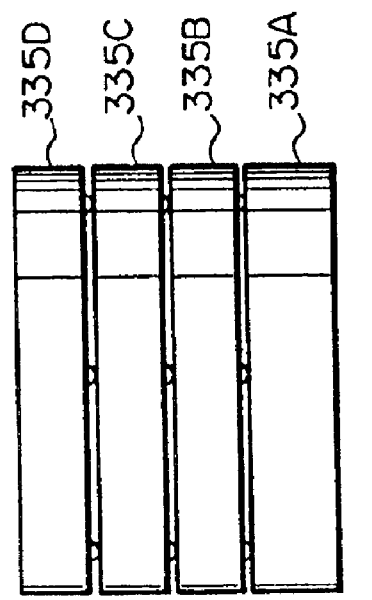

Fig. 18
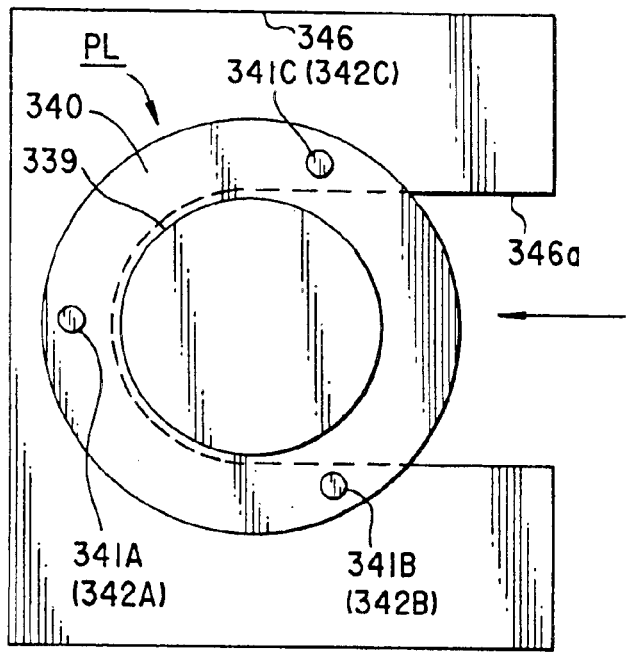
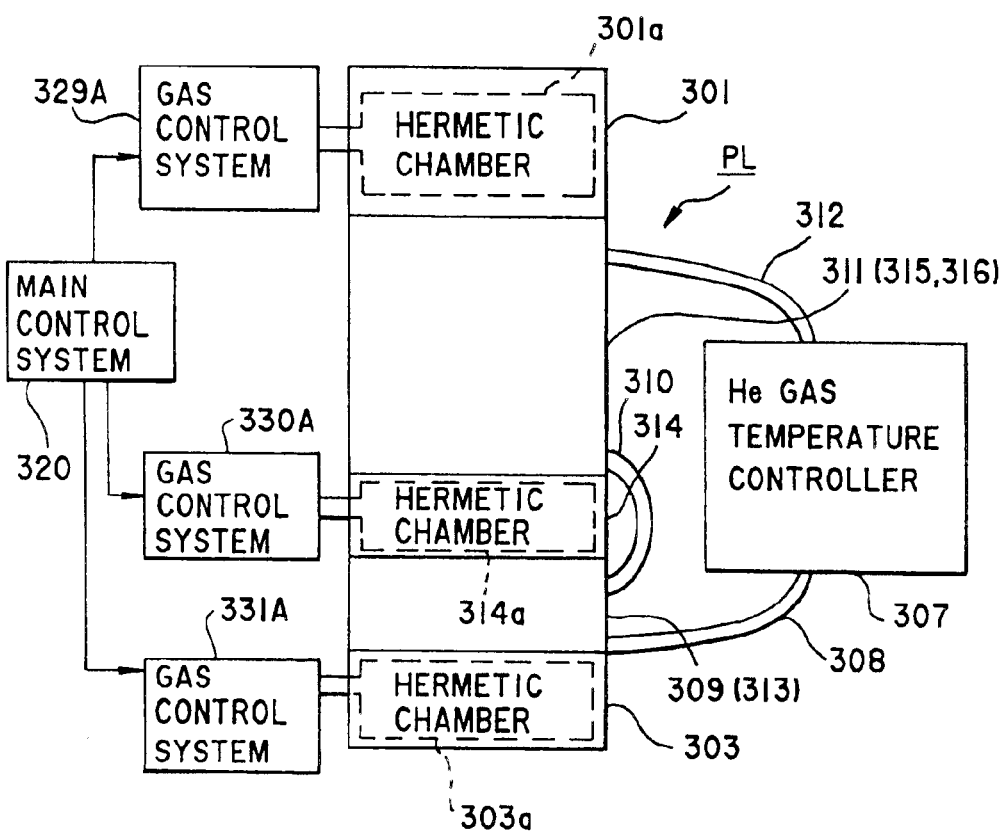
Fig. 19

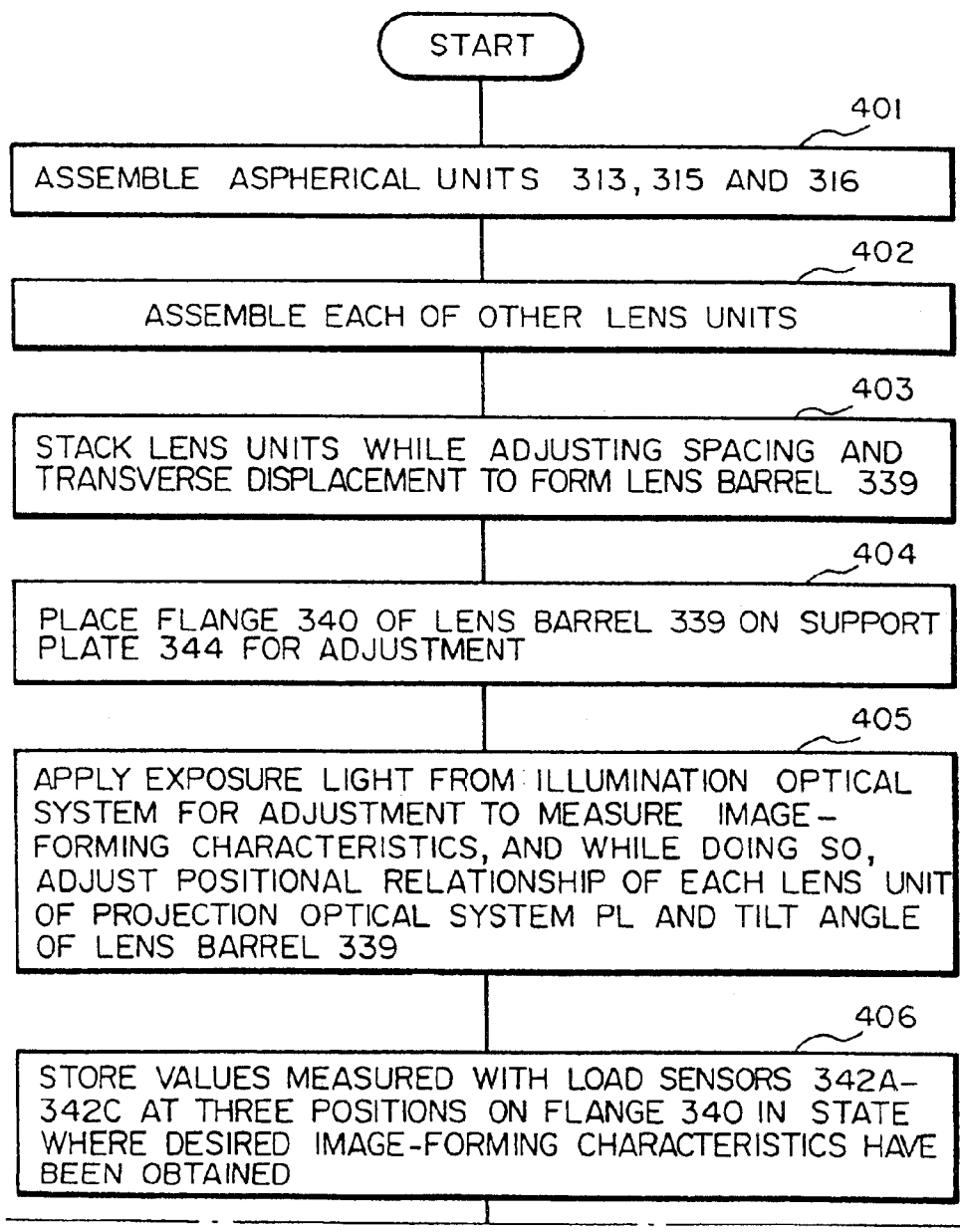

PROJECTION EXPOSURE APPARATUS

This application is a Division of prior application Ser. No. 09/722,540 filed Nov. 28, 2000 now U.S. Pat. No. 6,545,746, which is a Continuation of prior application Ser. No. 09/123,449 filed Jul. 28, 1998 (now abandoned), which is a Continuation-in-part of prior application Ser. No. 08/813,968 filed Mar. 3, 1997 (now abandoned).

BACKGROUND OF THE INVENTION

The present invention relates to a projection exposure apparatus used to transfer a mask pattern onto a photosensitive substrate in a photolithography process for producing, for example, semiconductor devices, image pickup devices (CCDs, etc.), liquid-crystal display devices, or thin-film magnetic heads.

To produce semiconductor devices, for example, a projection exposure apparatus is used to transfer a pattern formed on a reticle as a mask onto each shot area on a wafer coated with a photoresist. Hitherto, a step-and-repeat type (one-shot exposure type) reduction projection exposure apparatus (stepper) has frequently been used as a projection exposure apparatus for the pattern transfer process. On the other hand, to meet the demand that the area of a pattern to be transferred should be increased without substantially increasing the load on the projection optical system, attention has recently been paid to a step-and-scan type projection exposure apparatus wherein a reticle and a wafer are synchronously scanned relative to a projection optical system in a state where a part of a pattern on the reticle is projected as a reduced (demagnified) image on the wafer, thereby sequentially transferring the demagnified image of the reticle pattern onto each shot area on the wafer. The step-and-scan method has been developed by combining the advantage of the transfer method of the aligner (slit scan method) that transfers a pattern on the whole surface of a reticle onto the whole surface of a wafer in the magnification ratio of 1:1 by one scanning exposure with the advantage of the transfer method of the stepper.

In general, it is a requirement that resolution of projection exposure apparatuses be increased. One approach to increasing resolution is to use a light beam of a shorter wavelength as an illuminating light for exposure. Accordingly, use has recently been made of excimer laser light in the ultraviolet and far-ultraviolet regions as illuminating light for exposure, such as KrF excimer laser light (wavelength: 248 nm) or ArF excimer laser light (wavelength: 193 nm). The use of metal vapor laser light, higher harmonics of YAG laser light, etc. has also been examined.

When excimer laser light is used as illuminating light for exposure, for example, broad band laser light sources and narrow band laser light sources are available as excimer laser light sources. The term "narrow band laser light source" means a laser light source in which the spectral half-width of laser light is not more than 2 pm to 3 pm. The term "broad band laser light source" means a laser light source in which the spectral half-width of laser light is not less than 100 pm. When illuminating light of a short wavelength in the ultraviolet region or shorter wavelength region, such as excimer laser light, is used, vitreous materials usable for refracting lenses of projection optical systems are limited to materials such as quartz and fluorite. Therefore, as the wavelength of illuminating light used shortens as described above, it becomes more difficult to achromatize the projection optical system. Accordingly, it is desirable to use a narrow band laser light source in order to facilitate achromatization of the projection optical system.

However, the band of excimer laser light is originally broad. Therefore, in narrow band laser light sources, the oscillation spectral width of excimer laser light is narrowed by injection locking or the like. For this reason, the laser output of narrow band laser light sources is lower than that of broad band laser light sources. Further, narrow band laser light sources are inferior to broad band laser light sources in terms of lifetime and production cost. Therefore, in terms of the laser output, lifetime and production cost, broad band laser light sources are more advantageous than narrow band laser light sources. Accordingly, attempts have recently been made to use a broad band laser light source in a projection exposure apparatus having a projection optical system structured such that achromatization can be readily achieved.

Incidentally, projection optical systems usable in scanning exposure type projection exposure apparatuses (scanning projection exposure apparatuses) such as step-and-scan type projection exposure apparatuses include a catadioptric system that uses a concave mirror, and a refracting optical system formed from a combination of refracting lenses only, as disclosed in Japanese Patent Application Unexamined Publication (KOKAI) No. 6-132191. When such a catadioptric system is used, achromatization can be readily achieved by disposing a concave mirror in a group of refracting lenses because concave mirrors are free from chromatic aberrations. Consequently, it becomes possible to use a broad band laser light source, which is advantageous in terms of laser output, lifetime, etc.

Even in the case of using the second-mentioned refracting optical system, it is possible to use a broad band laser light source because the range of achromatization can be widened by increasing the proportion of fluorite in the entire refracting lens system.

In the above-described prior art, when the second-mentioned refracting optical system is used as a projection optical system, it is necessary to use fluorite for ten-odd lens elements in a total of twenty-odd lens elements, for example, in order to achieve achromatization over a wavelength width of the order of 100 pm to use a broad band laser light source. However, fluorite has the following properties: it is difficult to machine; the yield after the machining is unfavorably low; the change of refractive index with temperature is large; and the coefficient of thermal expansion is high, so that deformation occurs to a considerable extent in response to changes in temperature. Therefore, if many fluorite lenses are used, the temperature dependence of the image-forming characteristics of the projection optical system becomes unfavorably high.

When the first-mentioned catadioptric system is used as a projection optical system, it is possible to achieve achromatization over a wavelength width of the order of 100 pm by disposing a concave mirror in a predetermined position in a group of a predetermined number of refracting lenses, for example, because concave mirrors are free from chromatic aberrations. However, it is necessary in a scanning projection exposure apparatus to set the demagnification ratio for a pattern transferred from a reticle to a wafer on the order of from ¼ to ⅕, for example, and if a concave mirror is merely disposed in such a group of refracting lenses, the range in which favorable image-forming characteristics can be obtained becomes an arcuate area. Since the pattern areas on reticles have a rectangular external shape, if scanning exposure is carried out with such an arcuate area, the reticle scanning distance must be set to use considerably greater than the width of the pattern area. This causes the reticle-side stage to increase in size, unfavorably.

Further, when such an arcuate area is used, it is also necessary to use a lens that is not axially symmetric, and it is not easy to machine a non-axially symmetric lens with the desired accuracy.

Moreover, when a catadioptric system is used as a projection optical system, the projection optical system becomes large in size and complicated in arrangement because of routing of the image-forming light beam. Therefore, it is desirable to form the whole projection exposure apparatus in as compact a structure as possible by taking into consideration the reticle scanning direction, etc.

Further, it has been pointed out that when ultraviolet light such as excimer laser light is used as illuminating light for exposure, it is necessary to circulate nitrogen ($N_2$) gas or a gas (e.g. air) having ozone removed therefrom in the projection exposure apparatus in consideration for the absorption of ultraviolet light by ozone and also the properties of photoresist. However, if all the gas in a chamber in which the projection exposure apparatus is installed is merely replaced by nitrogen gas or the like, for example, a problem arises in terms of worker safety during maintenance and the like.

Further, it is necessary in a projection exposure apparatus to control the amount of exposure light applied to a wafer according to the sensitivity, etc. of a photoresist used. In this regard, with a method wherein the amount of ultraviolet light emitted as pulsed light, such as excimer laser light, is reduced through an ND filter plate, for example, the ND filter plate may be damaged by intense pulsed light. Further, it is desirable that the amount of ultraviolet light should be capable of being controlled continuously and accurately. However, with the method wherein the amount of ultraviolet light is controlled by using a light-reducing plate such as an ND filter, the amount of light cannot always be continuously set, depending upon the positioning accuracy of the light-reducing plate.

Furthermore, in the conventional step-and-scan type projection exposure apparatus, the projection optical system and the reticle-side stage are secured to a column stood on a surface plate to which a stage (wafer stage) for holding a wafer is secured. Accordingly, when the reticle and wafer are synchronously scanned during exposure, vibrations of the stages affect the projection optical system, which should essentially be stationary. This may degrade the image-forming characteristics.

In general, conventional projection optical systems are refracting systems using spherical lenses or reflecting systems using spherical mirrors. Assuming that λ is the wavelength of exposure light (exposure light wavelength), NA is the numerical aperture of a projection optical system, and k is a process factor determined, for example, by a resist used, the line width of line-and-space patterns that can be transferred with high accuracy by a projection exposure apparatus is expressed by $$\text{Line width} = k \cdot \lambda / NA \tag{1}$$

Recently, use has been made of KrF excimer laser light (wavelength: 248 nm) and even ArF excimer laser light (wavelength: 193 nm), and it has become possible to achieve a process factor k of the order of 0.45 by improving resists, applying high-resolution techniques, e.g. modified illumination, and utilizing a wafer planarization technique. The numerical aperture of the conventional projection optical systems is of the order of 0.6 at maximum. Substituting these values into Eq. (1) reveals that the minimum line width of patterns capable of being transferred by the conventional systems is about 150 nm as given by $$0.45 \cdot 193 / 0.6 \approx 145 \text{ (nm)}$$

As stated above, the conventional one-shot transfer type projection exposure apparatuses (steppers) use as short an exposure light wavelength as 193 nm. However, because the numerical apertures of projection optical systems using spherical lenses or spherical mirrors are of the order of 0.6 at maximum, the minimum line width of transferable patterns is about 150 nm. As device patterns are becoming even finer, projection exposure apparatuses have recently been required to transfer line-and-space patterns of from 150 nm to 90 nm in line width with accuracy. In this case, if ArF excimer laser light (wavelength: 193 nm) is used as exposure light, the numerical aperture of the projection optical system must be further raised to a level of from 0.65 to 0.85.

However, if a projection optical system having a wide exposure area to effect one-shot transfer and further having a high numerical aperture is realized by using spherical lenses or spherical mirrors, the diameter of each indivisual lens becomes excessively large, giving rise to problems. Under these circumstances, two techniques have been proposed to increase the numerical aperture without causing the projection optical system to become so large in size. The first technique is a step-and-scan type projection exposure apparatus in which a reticle and a wafer are synchronously scanned relative to a projection optical system with a speed ratio corresponding to the projection magnification used, thereby sequentially transferring a pattern on the reticle onto the wafer. By introducing this technique and using a rectangular or arcuate slit-shaped exposure area elongated in the diametrical direction of the effective field of the projection optical system, it is possible to ensure an exposure field of a given width by using a projection optical system in which the diameter of the effective field is $\frac{1}{2}^{1/2}$ of that in a case where an approximately square exposure area is used in the one-shot transfer system.

According to the second technique, about 1 to 5 optical members (aspherical members), e.g. lenses, which have aspherized surfaces are inserted in a projection optical system. The use of the aspherical members makes it possible to shorten the overall distance, minimize the number of lenses required and reduce the lens diameter even when the numerical aperture of the projection optical system is increased. Vitreous materials usable in an extreme ultraviolet region of 200 nm or shorter are limited to quartz and fluorite in the present state of art. Fluorite has a relatively high production cost. Moreover, fluorite has a larger coefficient of linear expansion than quartz and is sensitive to variations in temperature. Therefore, it is desirable to minimize the number of fluorite lenses used by narrowing the wavelength band of exposure light as much as possible to reduce the load of achromatizing the projection optical system. By introducing this technique, it is possible to design and produce a practical projection optical system having a high numerical aperture and capable of effecting exposure over a wide exposure field.

However, the use of such an aspherical member involves a problem. That is, if the refractive index of a gas around the aspherical member changes in accordance with variations in the temperature, humidity and pressure (atmospheric pressure) of the environment of the projection optical system, distortion and other aberrations that are difficult to correct occur. This causes the image-forming characteristics to be deteriorated. In this regard, in the case of a spherical lens, the way in which aberrations change with variations in the environmental conditions can be predicted fairly accurately by simulation or the like. Therefore, it is possible to effect control such that predetermined image-forming characteristics are maintained, for example, by finely moving the position of the spherical lens. However, in the case of an aspherical member, the change of aberrations is complicated, and it becomes difficult to correct aberrations when the change of aberrations is large. Even if the amount of aberration change is small, the aberration correcting mechanism may become complicated.

Furthermore, there are cases where fluorite lenses are used to achieve achromatization to a certain extent depending upon the level of narrowing the wavelength band of exposure light. There are also cases where a large amount of fluorite is used as a vitreous material to cope with the situation that the wavelength of exposure light is becoming shorter. In these cases, because fluorite has a large coefficient of linear expansion, aberrations are likely to change to a considerable extent with variations in temperature.

In view of the above-described circumstances, a first object of the present invention is to provide a scanning projection exposure apparatus capable of using as a projection optical system a catadioptric system formed from a combination of refracting lenses which are all axially symmetric and a reflecting optical member, and also capable of obtaining favorable image-forming characteristics.

A second object of the present invention is to provide a projection exposure apparatus designed so that the whole structure of the apparatus can be made compact even when a projection optical system is employed consisting essentially of the above-described catadioptric system.

A third object of the present invention is to provide a projection exposure apparatus designed so that during exposure, the absorption of illuminating light for exposure is minimized, and during maintenance, the safety of workmen can be ensured.

A fourth object of the present invention is to provide a projection exposure apparatus using ultraviolet light as illuminating light for exposure and capable of accurately controlling the amount of ultraviolet light for exposure at all times.

A fifth object of the present invention is to provide a projection exposure apparatus capable of obtaining favorable image-forming characteristics independently of vibrations caused by the synchronous scanning of a reticle and a wafer.

A sixth object of the present invention is to provide a projection exposure apparatus having a projection optical system capable of obtaining high image-forming characteristics.

A seventh object of the present invention is to provide a projection exposure apparatus having a projection optical system capable of obtaining high image-forming characteristics and capable of maintaining the high image-forming characteristics independently of variations in environmental conditions such as atmospheric pressure.

SUMMARY OF THE INVENTION

A projection exposure apparatus according to the present invention includes a light source; a mask having a transfer pattern; a projection optical system that projects an image of a part of the transfer pattern onto a photosensitive substrate by light from the light source; and a device that transfers the transfer pattern on the mask onto the photosensitive substrate by synchronously scanning the mask and the photosensitive substrate relative to the projection optical system. The projection optical system includes a first optical system having a concave mirror and is arranged to reflect and condense a light beam from the mask such that the light beam returns toward the mask; a second optical system that directs the light beam, which is returned toward the mask by the first optical system, toward the photosensitive substrate; and a third optical system that forms an image of a part of the transfer pattern of the mask on the photosensitive substrate by the light beam from the second optical system.

The first and third optical systems may be disposed along the scanning direction of the mask and the photosensitive substrate, and the center of gravity of the projection optical system may lie outside the optical path of the image-forming light beam passing through the first and third optical systems.

The projection exposure apparatus may further include an off-axis alignment sensor for detecting the position of a mark for alignment on the photosensitive substrate. The alignment sensor may have an optical system arranged such that an optical axis of the optical system is substantially parallel to the optical axis of the third optical system and a predetermined distance away from the optical axis of the third optical system in the scanning direction of the photosensitive substrate.

The arrangement may be such that the optical axes of the first and third optical systems are parallel to each other, and a surface position detecting system is disposed to lie in a direction perpendicularly intersecting a plane containing the optical axes of the first and third optical systems. The surface position detecting system includes an irradiation optical system that applies a light beam obliquely to the surface of the photosensitive substrate, and a light-receiving optical system that photoelectrically converts the light beam reflected from the photosensitive substrate to obtain a photoelectrically converted signal. The surface position detecting system detects a displacement of the surface of the photosensitive substrate on the basis of the photoelectrically converted signal from the light-receiving optical system.

The arrangement may be such that the second optical system has a partially transmitting mirror that directs the light beam from the first optical system toward the photosensitive substrate and that transmits a part of a light beam from the photosensitive substrate, and that a photoelectric detector is provided to receive that part of the light beam from the photosensitive substrate which passes through the partially transmitting mirror.

The photoelectric detector may be a light-receiving, element that photoelectrically converts reflected light from the photosensitive substrate.

The photoelectric detector may be an image pickup device that picks up an image of a fiducial mark in the vicinity of the photosensitive substrate.

The projection optical system may be an image-forming optical system that forms an intermediate image of a part of the transfer pattern of the mask between the mask and the photosensitive substrate. A device for correcting image-forming characteristics of the projection optical system may be provided in the vicinity of a position where the intermediate image is formed.

A projection exposure apparatus according to another aspect of the present invention includes an illumination optical system that illuminates a mask having a transfer pattern formed thereon by illuminating light from a light source; a projection optical system that projects an image of the pattern on the mask onto a photo-sensitive substrate under the illuminating light; a substrate stage that moves the photosensitive substrate; a plurality of casings that accommodate the illumination optical system, the projection optical system, and the substrate stage independently of each other; and a gas supply device that selectively supplies a plurality of different kinds of gas into at least one of the casings.

The plurality of different kinds of gas may be gases selected from the group consisting of nitrogen, air, and air having ozone removed therefrom.

The gas supply-device may be provided with a device for confirming that a gas in a casing to be supplied with another gas has been substantially completely replaced by the substituting gas.

A projection exposure apparatus according to still another aspect of the present invention includes an illumination optical system that illuminates a mask having a transfer pattern formed thereon by illuminating light from a light-source; a projection optical system that projects an image of the pattern on the mask onto a photosensitive substrate under the illuminating light; a casing having light-transmitting windows disposed in the optical path of the illuminating light between the light source and the photosensitive substrate; and a gas controller that supplies into the casing a gas in which the amount of ozone per unit volume is variable; wherein the illuminance of illuminating light emitted from the light source and applied to the photosensitive substrate is controlled by changing the amount of ozone in the gas supplied into the casing from the gas controller.

A projection exposure apparatus according to a further aspect of the present invention includes a light source; a mask having a transfer pattern; a projection optical system that projects an image of a part of the transfer pattern onto a photosensitive substrate by light from the light source; a device having a mask-side stage that scans the mask relative to the projection optical system, and a substrate-side stage that scan the photosensitive substrate relative to the projection optical system in synchronism with the mask-side stage, so that the transfer pattern on the mask is transferred onto the photosensitive substrate by synchronously scanning the mask and the photosensitive substrate relative to the projection optical system; an antivibration plate to which a movable part that moves synchronously with scanning exposure is secured; and another antivibration plate to which a stationary part that is not synchronous with scanning exposure is secured.

The projection exposure apparatus may be provided with an interferometer to measure the position of the mask-side stage or the substrate-side stage. The interferometer has a moving mirror mounted on the mask-side stage or the substrate-side stage; a reference mirror mounted on the antivibration plate to which the stationary part is secured; and an interferometer body part that detects a relative displacement between the moving mirror and the reference mirror by using a light beam.

A projection exposure method according to the present invention includes the step of preparing a projection optical system including at least three optical systems, and the step of projecting an image of the pattern on the above-described mask onto the above-described substrate after forming an intermediate image of the pattern in the projection optical system.

In addition, the present invention provides a method of controlling an environment of an exposure apparatus in which an image of a pattern on a mask is projected onto a substrate. The method includes the step of casing at least a part of constituent portions of the exposure apparatus, and the step of supplying a plurality of different kinds of gas into the cased constituent portion of the exposure apparatus.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member drives a predetermined member in the second optical members to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member drives a predetermined optical member in the second optical members to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members made of fluorite, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member drives a predetermined optical member in the second optical members to correct image-forming characteristics of the projection optical system.

A projection exposure apparatus according to a further aspect of the present invention includes a projection optical system that projects an image of a pattern formed on a mask onto a substrate, and an image forming characteristic correcting member. The projection optical system includes first optical members made of fluorite, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member drives a predetermined optical member in the second optical members to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image characteristic correcting member controls the pressure of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the pressure of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members made of fluorite, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the pressure of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members made of fluorite, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the pressure of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the temperature of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the temperature of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members made of fluorite, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the temperature of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members made of fluorite, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the temperature of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the humidity of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members having aspherized surfaces, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the humidity of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members made of fluorite, and second optical members having spherical surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the humidity of a part of the second gas to correct image-forming characteristics of the projection optical system.

A projection exposure apparatus according to a further aspect of the present invention includes a projection optical system that projects an image of a pattern formed on a mask onto a substrate, and an image-forming characteristic correcting member. The projection optical system includes first optical members made of fluorite, and second optical members having planarized surfaces. At least a part of the first optical members are placed in an atmosphere of a first gas that is not readily affected by variations in atmospheric conditions. At least a part of the second optical members are placed in an atmosphere of a second gas different from the first gas. The image-forming characteristic correcting member controls the humidity of a part of the second gas to correct image-forming characteristics of the projection optical system.

A projection exposure apparatus according to a further aspect of the present invention includes a projection optical system that projects an image of a pattern formed on a mask onto a substrate. The projection optical system includes first optical members having aspherized surfaces, and second optical members having spherical surfaces. The projection optical system further includes a first lens barrel that accommodates at least a part of the first optical members, and a second lens barrel that accommodates optical members other than the optical members accommodated in the first lens barrel. The second lens barrel is separable from the first lens barrel. The first lens barrel is a double structure having an optical member retaining frame that retains optical members accommodated therein, and an outer casing that retains the optical member retaining frame with a predetermined gap therebetween. The gap in the first lens barrel is supplied with a first gas that is not readily affected by variations in atmospheric conditions. At least a part of the second lens barrel is supplied with a second gas different from the first gas.

A projection exposure apparatus according to a further aspect of the present invention includes a projection optical system that projects an image of a pattern formed on a mask onto a substrate. The projection optical system includes first optical members made of fluorite, and second optical members having spherical surfaces. The projection optical system further includes a first lens barrel that accommodates at least a part of the first optical members, and a second lens barrel that accommodates optical members other than the optical members accommodated in the first lens barrel. The second lens barrel is separable from the first lens barrel. The first lens barrel is a double structure having an optical member retaining frame that retains optical members accommodated therein, and an outer casing that retains the optical member retaining frame with a predetermined gap therebetween. The gap in the first lens barrel is supplied with a first gas that is not readily affected by variations in atmospheric conditions. At least a part of the second lens barrel is supplied with a second gas different from the first gas.

A projection exposure apparatus according to a further aspect of the present invention includes a projection optical system that projects an image of a pattern formed on a mask onto a substrate. The projection optical system includes first optical members having aspherized surfaces, and second optical members having planarized surfaces. The projection optical system further includes a first lens barrel that accommodates at least a part of the first optical members, and a second lens barrel that accommodates optical members other than the optical members accommodated in the first lens barrel. The second lens barrel is separable from the first lens barrel. The first lens barrel is a double structure having an optical member retaining frame that retains optical members accommodated therein, and an outer casing that retains the optical member retaining frame with a predetermined gap therebetween. The gap in the first lens barrel is supplied with a first gas that is not readily affected by variations in atmospheric conditions. At least a part of the second lens barrel is supplied with a second gas different from the first gas.

A projection exposure apparatus according to a further aspect of the present invention includes a projection optical system that projects an image of a pattern formed on a mask onto a substrate. The projection optical system includes first optical members made of fluorite, and second optical members having planarized surfaces. The projection optical system further includes a first lens barrel that accommodates at least a part of the first optical members, and a second lens barrel that accommodates optical members other than the optical members accommodated in the first lens barrel. The second lens barrel is separable from the first lens barrel. The first lens barrel is a double structure having an optical member retaining frame that retains optical members accommodated therein, and an outer casing that retains the optical member retaining frame with a predetermined gap therebetween. The gap in the first lens barrel is supplied with a first gas that is not readily affected by variations in atmospheric conditions. At least a part of the second lens barrel is supplied with a second gas different from the first gas.

The first gas that is not readily affected by variations in atmospheric conditions may be helium gas.

A projection exposure apparatus according to a further aspect of the present invention includes a projection optical system that projects an image of a pattern formed on a mask onto a substrate. The projection optical system includes a flange member integrated with a lens barrel of the projection optical system, and a plurality of position adjusting members mounted on the flange member. The position of each of the position adjusting members is adjustable in the direction of an optical axis of the projection optical system. A plurality of pressure sensors are incorporated in correspondence with the position adjusting members. The position adjusting members are subjected to position adjustment such that pressures detected with the pressure sensors are equal to corresponding pressures detected during adjustment of the projection optical system as a single element.

BRIEF DESCRIPTION OF THE DRAWINGS

FIG. 4 is a fragmentary sectional view showing the arrangement of an off-axis alignment sensor in FIG. 1.

FIGS. 15(a), 15(b) and 15(c) are diagrams for explaining a method of assembling lenses constituting an aspherical unit in FIG. 13 by a split lens barrel system.

FIG. 18 is a plan view showing the projection optical system shown in FIGS. 17(a) and 17(b), which is mounted in the projection exposure apparatus.

FIG. 19 is a diagram schematically showing the arrangement of an essential part of a modification of the projection exposure apparatus shown in FIG. 13.

DETAILED DESCRIPTION OF PREFERRED EMBODIMENTS

One embodiment of the projection exposure apparatus according to the present invention will be described below with reference to the accompanying drawings. In this embodiment, the present invention is applied to a step-and-scan type projection exposure apparatus that uses an excimer laser light source as an exposure light source and also uses a catadioptric system as a projection optical system.

Figure 1:
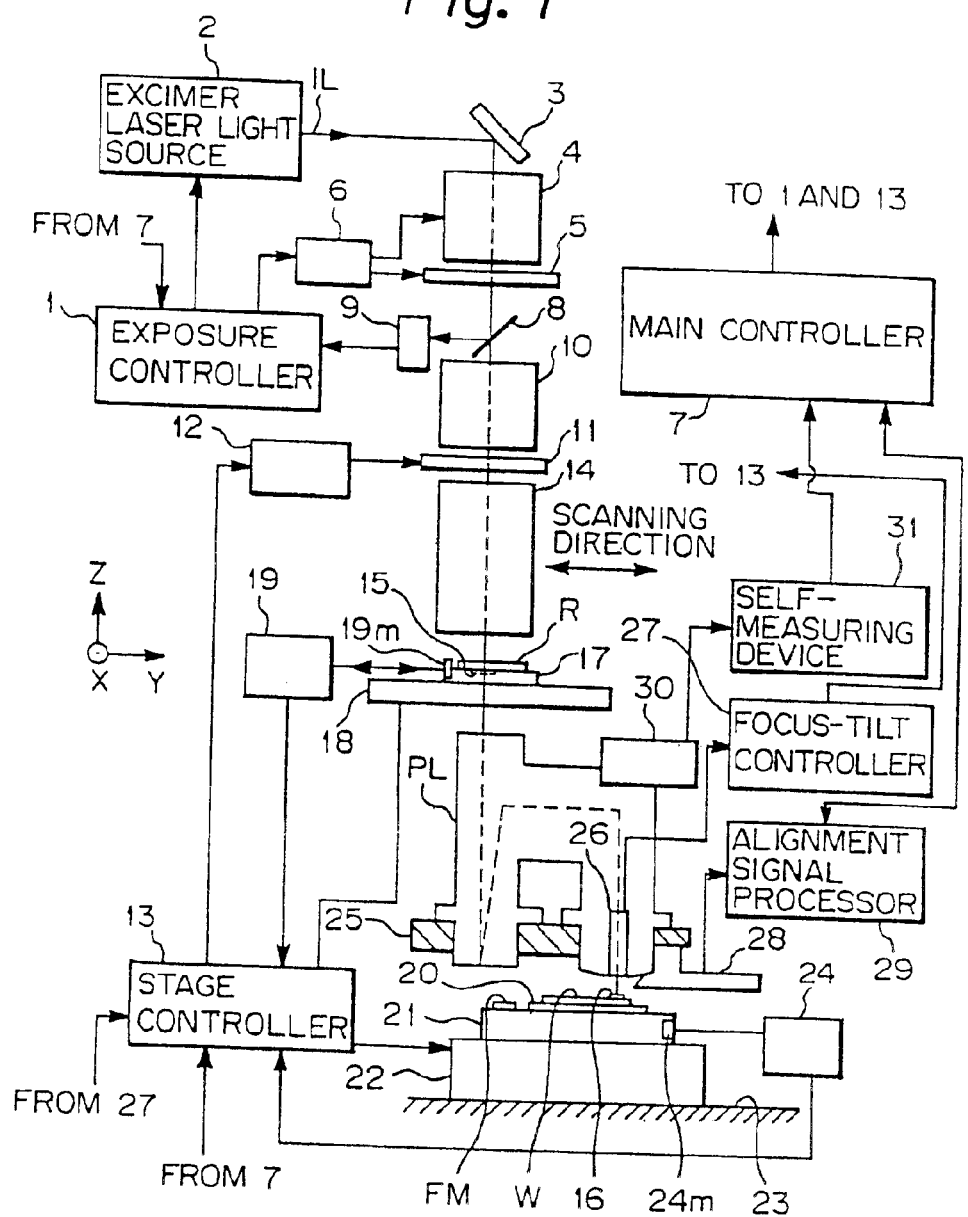
FIG. 1 schematically shows the arrangement of one embodiment of the scanning projection exposure apparatus according to the present invention.

FIG. 1 schematically shows the arrangement of a projection exposure apparatus according to this embodiment. In FIG. 1, an exposure controller 1 controls the emission condition of an excimer laser light source 2. The excimer laser light source 2 emits pulsed laser light used as illuminating light IL. The illuminating light IL is deflected by a deflection mirror 3 to reach a first illumination system 4. In this embodiment, the excimer laser light source 2 is a broad band laser light source of KrF excimer laser (wavelength: 248 nm)in which the half-width of the oscillation spectrum is broadened to 100 pm or more. It should, however, be noted that a broad band laser light source of ArF excimer laser (wavelength: 193 nm) may also be used as a light source for exposure. It is also possible to use a metal vapor laser light source, a harmonics generator of YAG laser, or an emission-line lamp such as a mercury lamp.

The first illumination system 4 includes a beam expander; a light quantity varying mechanism; an illumination switching mechanism for switching the amounts of illuminating light from one to another when the coherence factor (so-called σ value) of the illumination optical system is changed; and a fly's-eye lens. The first illumination system 4 forms two-dimensionally distributed secondary light sources of illuminating light IL on an exit plane thereof. A switching revolver 5 for an illumination system aperture stop is disposed in the plane where the secondary light sources are formed. The switching revolver 5 is used to switch over various illumination conditions from one to another. The switching revolver 5 is provided in a side surface thereof with various aperture stops such as an ordinary circular aperture stop; an aperture stop for modified illumination which consists of a plurality of apertures decentered from the optical axis; an annular zone-shaped aperture stop; and an aperture stop for small σ value which consists of a relatively small circular aperture. Thus, a desired illumination system aperture stop (σ stop) can be disposed in the exit plane of the first illumination system 4 by revolving the switching revolver 5 through a switching device 6. When illumination system aperture stops have been switched over from one to another as stated above, the illumination switching mechanism in the first illumination system 4 is synchronously switched through the switching device 6 so that the light quantity is maximized.

The operation of the switching device 6 is controlled by the exposure controller 1. The operation of the exposure controller 1 is controlled by a main controller 7 that controls operations of the whole apparatus.

Illuminating light IL passing through an illumination system aperture stop set by the switching revolver 5 enters a beam splitter 8 having a high transmittance and a low reflectivity. Illuminating light reflected by the beam splitter 8 is received by an integrator sensor 9 consisting essentially of a photoelectric detector such as a photodiode. The integrator sensor 9 photoelectrically converts the received illuminating light to obtain a detection signal, which is supplied to the exposure controller 1. The relationship between the detection signal and the amount of exposure light applied to the surface of a wafer has previously been measured and stored. The exposure controller 1 monitors the integral of the amount of exposure light applied to the surface of the wafer from the detection signal. The detection signal is also used to normalize output signals from various sensor systems that use the exposure illuminating light IL.

Illuminating light IL passing through the beam splitter 8 illuminates an illumination field stop system (reticle blind system) 11 through a second illumination system 10. A plane where the illumination field stop system 11 is placed is conjugate with the entrance plane of the fly's-eye lens in the first illumination system 4. The illumination field stop system 11 is illuminated by an illumination area approximately similar in sectional configuration to each lens element of the fly's-eye lens. The illumination field stop system 11 is divided into a movable blind and a fixed blind. The fixed blind is a fixed field stop having a rectangular aperture. The movable blind comprises two pairs of movable blades capable of being opened and closed and also capable of independently moving in a reticle scanning direction and a non-scanning direction, respectively. The fixed blind determines a configuration of an illumination area on a reticle, and the movable blind performs an operation of gradually opening the cover of the aperture of the fixed blind at the time of starting scanning exposure and also performs an operation of gradually closing the cover at the time of terminating the scanning exposure. Thus, areas on a wafer other than a proper shot area to be exposed are prevented from being illuminated by illuminating light.

The operation of the movable blind in the illumination field stop system 11 is controlled by a driver 12. When synchronous scanning of a reticle and a wafer is carried out by a stage controller 13 as described later, the stage controller 13 synchronously drives the movable blind that is movable in the scanning direction through the driver 12. Illuminating light IL passing through the illumination field stop system 11 passes through a third illumination system 14 and illuminates a rectangular illumination area 15 on a pattern surface (lower surface) of a reticle R with a uniform illuminance distribution. A plane where the fixed blind of the illumination field stop system 11 is placed is conjugate with the pattern surface of the reticle R. The configuration of the illumination area 15 is determined by the aperture of the fixed blind.

In the following description, an X-axis is taken in a direction perpendicular to the plane of FIG. 1 in a plane parallel to the pattern surface of the reticle R; a Y-axis is taken in a direction parallel to the plane of FIG. 1; and a Z-axis is taken in a direction perpendicular to the pattern surface of the reticle R. Under these conditions, the illumination area 15 on the reticle R is a rectangular area longer in the direction X. During scanning exposure, the reticle R is scanned in the direction +Y or −Y relative to the illumination area 15. In other words, the scanning direction is set in the direction Y.

An image of a pattern in the illumination area 15 on the reticle R is projected onto an exposure area 16 on a photoresist-coated surface of a wafer W as a demagnified image through a projection optical system PL with a projection magnification β (β is ¼ or ⅕, for example) which is telecentric on both sides (or on the wafer side only).

The reticle R is held on a reticle stage 17. The reticle stage 17 is mounted through an air bearing on a guide extending in the direction Y on a reticle support 18. The reticle stage 17 is capable of scanning across the reticle support 18 in the direction Y at a constant speed by the operation of a linear motor, and has an adjusting mechanism capable of adjusting the position of the reticle R in the directions X and Y and also in the direction of rotation (direction O-). The position of the reticle stage 17 (reticle R) in each of the directions X and Y is constantly measured at a resolution of the order of 0.001 μm by a combination of a moving mirror 19m secured to an end portion of the reticle stage 17 and a laser interferometer (only the laser interferometer for the Y-axis is shown in the figure) 19 secured to a column (not shown). The angle of rotation of the reticle stage 17 is also measured by the combination of the moving mirror 19m and the laser interferometer 19. The measured values are supplied to the stage controller 13. The stage controller 13 controls the operation of the linear motor, etc. on the reticle support 18 according to the measured values supplied thereto.

The wafer W is held through a wafer holder 20 on a sample table 21. The sample table 21 is mounted on a wafer stage 22. The wafer stage 22 is mounted through an air bearing on a guide extending over a surface plate 23. The wafer stage 22 is arranged so as to be capable of scanning at a constant speed and stepping in the direction Y and also stepping in the direction X over the surface plate 23 by the operation of a linear motor. The wafer stage 22 has a Z-stage mechanism and a tilt mechanism (leveling mechanism) incorporated therein. The Z-stage mechanism causes the sample table 21 to move in the direction Z within a predetermined range. The tilt mechanism adjusts the tilt angle of the sample table 21.

The position of the sample table 21 (wafer W) in each of the directions X and Y is constantly measured at a resolution of the order of 0.001 μm by a combination of a moving mirror 24m secured to a side of the sample table 21 and a laser interferometer (only the laser interferometer for the Y-axis is shown in the figure) 24 secured to a column (not shown). The rotation angle and tilt angle of the sample table 21 are also measured by the combination of the moving mirror 24m and the laser interferometer 24. The measured values are supplied to the stage controller 13. The stage controller 13 controls the operation of the linear motor, etc. for driving the wafer stage 22 according to the measured values supplied thereto.

To carry out scanning exposure, the main controller 7 sends an exposure start command to the stage controller 13. In response to the command, the stage controller 13 causes the reticle R to be scanned in the direction Y at a speed VR through the reticle stage 17 and also causes the wafer W to be scanned in the direction Y at a speed $V_W$ through the wafer stage 22 synchronously with the scanning of the reticle R. The scanning speed $V_W$ of the wafer W is set at $\beta \cdot V_R$ by using the projection magnification β for the pattern transfer from the reticle R to the wafer W.

The projection optical system PL is held in a U-shaped column 25 stood on the surface plate 23. An oblique incidence multipoint autofocus sensor (hereinafter referred to as "AF sensor") 26 is disposed on that side of the projection optical system PL which faces in the direction X. The AF sensor 26 obliquely projects a slit image or the like onto a plurality of measuring points on the surface of the wafer W and outputs a plurality of focus signals corresponding to positions (focus positions) of the wafer surface in the direction Z at the measuring points. The focus signals from the multipoint AF sensor 26 are supplied to a focus-tilt controller 27. The focus-tilt controller 27 obtains a focus position and tilt angle of the surface of the wafer W from the focus signals and supplies the results thus obtained to the stage controller 13.

The stage controller 13 drives the Z-stage mechanism and tilt mechanism in the wafer stage 22 by a servo system such that the supplied focus position and tilt angle coincide with the focus position and tilt angle, respectively, of the image-formation plane of the projection optical system PL, which have previously been obtained. Thus, the surface of the wafer W within the exposure area 16 is controlled by autofocus and autoleveling systems such that the wafer surface coincides with the image-formation plane of the projection optical system PL even during scanning exposure.

Further, an off-axis alignment sensor 28 is secured to that side of the projection optical system PL which faces in the direction +Y. During alignment, the alignment sensor 28 detects the position of a wafer mark for alignment attached to each shot area on the wafer W, and supplies a detection signal to an alignment signal processor 29. The alignment signal processor 29 is also supplied with the measured values from the laser interferometer 24. The alignment signal processor 29 calculates coordinates in a stage coordinate system (X, Y) of a wafer mark to be detected from the detection signal and the measured values from the laser interferometer 24, and supplies the calculated coordinates to the main controller 7. The term "stage coordinate system (X, Y)" means a coordinate system determined on the basis of the X–and Y-coordinates of the sample table 21 measured by the laser interferometer 24. The main controller 7 obtains array coordinates in the stage coordinate system (X, Y) of each shot area on the wafer W from the supplied coordinates of the associated wafer mark, and supplies the array coordinates to the stage controller 13. The stage controller 13 controls the position of the wafer stage 22 when scanning exposure is carried out for each shot area on the basis of the array coordinates supplied thereto.

A fiducial mark member FM is secured to the surface of the sample table 21. The fiducial mark member FM is provided on the surface thereof with various fiducial marks serving as position references for the alignment sensor and a reference reflecting surface serving as a reference of the reflectivity of the wafer W. A reflected light detecting system 30 is mounted on an upper end portion of the projection optical system PL to detect a light beam reflected from the wafer W through the projection optical system PL. A detection signal from the reflected light detecting system 30 is supplied to a self-measuring device 31. Under the control of the main controller 7, the self-measuring device 31 performs monitoring of the amount of reflected light from the wafer W (reflectivity of the wafer surface), measurement of illuminance nonuniformity, and measurement of a spatial image, as described later.

Next, the arrangement of the projection optical system PL according to this embodiment, shown in FIG. 1, will be described in detail with reference to FIG. 2.

Figure 2:
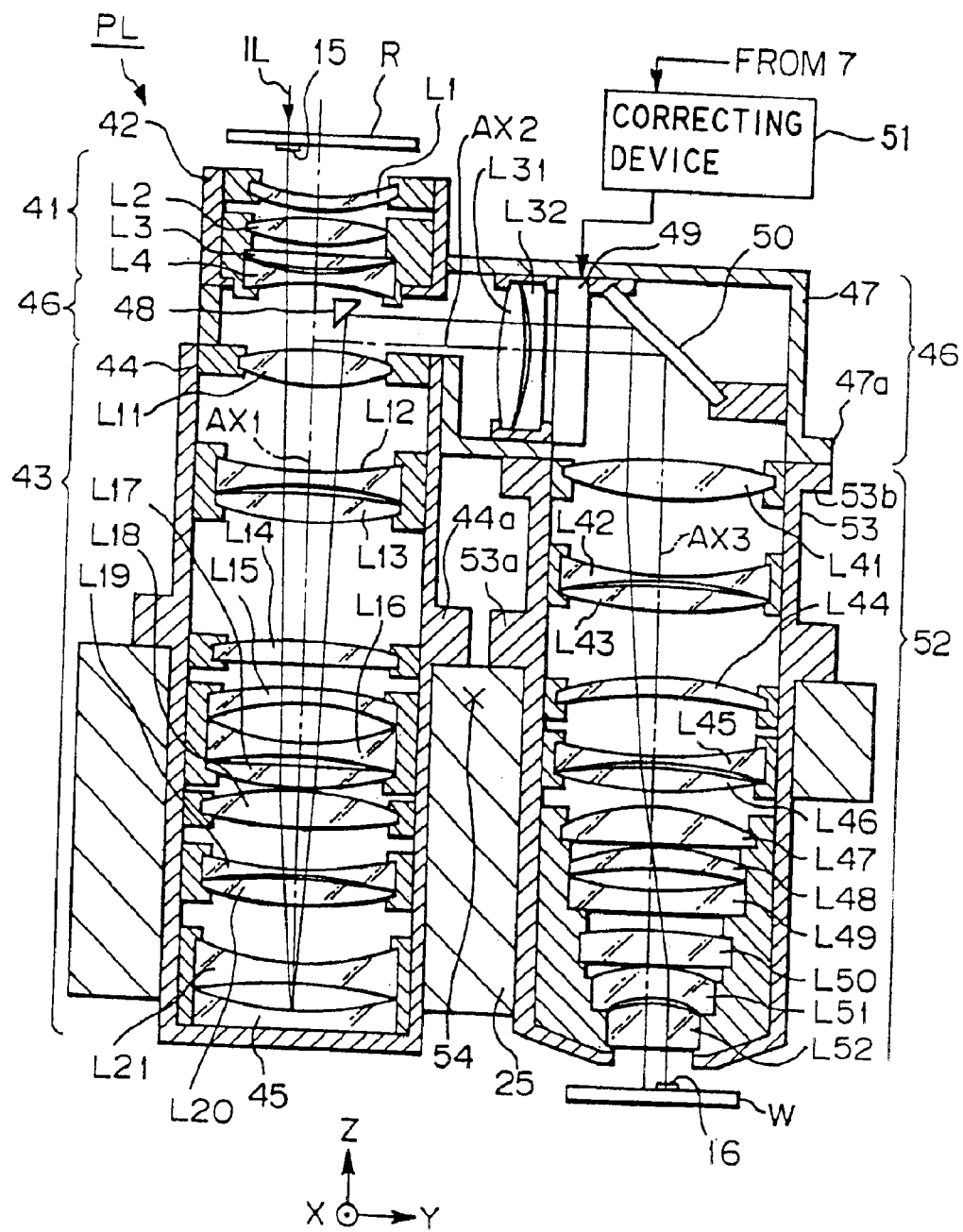
FIG. 2 is a longitudinal sectional view showing the arrangement of a projection optical system in FIG. 1.

FIG. 2 is a sectional view showing the projection optical system PL. In FIG. 2, the projection optical system PL mechanically consists essentially of four portions, i.e. a first objective portion 41, an optical axis turn portion 43, an optical axis deflecting portion 46, and a second objective portion 52. A concave mirror 45 is disposed in the optical axis turn portion 43.

The use of broad band laser light as illuminating light IL as in this embodiment is advantageous in that the light quantity can be increased without increasing the electric power supplied and the throughput can be increased, and that coherency reduces and thus adverse effects of interference can be reduced. However, when illuminating light in the ultraviolet region, such as KrF excimer laser light or ArF excimer laser light, is used as in this embodiment, vitreous materials usable for refracting lenses in the projection optical system PL are limited to such materials as quartz and fluorite. Therefore, it is difficult to design the projection optical system PL using only a refracting optical system. For this reason, in this embodiment, broad-band achromatization is effected by jointly using a refracting optical system and a reflecting optical system such as a concave mirror, in which no chromatic aberration is produced. However, a general reflecting optical is a 1:1 optical system (with a magnification ratio of 1:1). Therefore, when reduction projection with a demagnification ratio of ¼ or ⅕ is performed as in this embodiment, it is necessary to devise a special scheme for the arrangement of the optical system as stated below. First, the first objective portion 41 is disposed directly below the reticle R. The first objective portion 41 includes lenses L1, L2, L3 and L4 in order from the reticle R side. The lenses L1, L2, L3 and L4 are secured in a lens barrel 42 through lens frames. Below the lens barrel 42, a lens barrel 44 of the optical axis turn portion 43 is disposed through a lens barrel 47 of the optical axis deflecting portion 46. The optical axis turn portion 43 includes, in order from the reticle R side, lenses L11, L12, . . . , L20 and L21, and a concave mirror 45, which are secured in the lens barrel 44 through lens frames. The first objective portion 41 and the optical axis turn portion 43 are coaxial with respect to each other. Let us assume the common axis to be an optical axis AX1. The optical axis AX1 is perpendicular to the pattern surface of the reticle R.

A small-sized mirror 48 is disposed in the lens barrel 47 of the optical axis deflecting portion 46 between the lens barrels 42 and 44 at a position decentered in the direction +Y from the optical axis AX1. The small-sized mirror 48 has a reflecting surface tilted in the direction +Y at approximately 45° to the optical axis AX1. In the lens barrel 47, lenses L31 and L32, a correcting optical system 49, and a beam splitter 50 are disposed in order from the small-sized mirror 48 in the direction +Y. The optical axis AX2 of the optical axis deflecting portion 46 perpendicularly intersects the optical axis AX1. The beam splitter 50 has a reflecting surface tilted at approximately 45° to the optical axis AX2 so that the reflecting surface perpendicularly intersects the reflecting surface of the small-sized mirror 48. The beam splitter 50 has a transmittance of 5% and a high reflectivity of the order of 95%. A method of utilizing a light beam passing through the beam splitter 50 will be described later. The correcting optical system 49 includes a lens unit capable of slightly moving in a direction parallel to the optical axis AX2. Moreover, the tilt angle of the lens unit with respect to a plane perpendicular to the optical axis AX2 can be finely adjusted. The position and tilt angle of the correcting optical system 49 are controlled by an image-forming characteristic correcting device 51. The operation of the image-forming characteristic correcting device 51 is controlled by the main controller 7, shown in FIG. 1. The position where the correcting optical system 49 is disposed is approximately conjugate with the pattern surface of the reticle R. The correcting optical system 49 can correct mainly distortions such as a magnification error. A lens barrel 53 of the second objective portion 52 is disposed in contact with the lens barrel 47 to extend in a direction in which the optical axis AX2 bent by the beam splitter 50 extends. In the lens-barrel 53, lenses L41, L42, L43, . . . , L52 are disposed in order from the beam splitter 50 side through lens frames. The bottom surface of the lens L52 faces the surface of the wafer W. The optical axis AX3 of the second objective portion 52 is parallel to the common optical axis AX1 of the first objective portion 41 and the optical axis turn portion 43 and perpendicular to the optical axis AX2 of the optical axis deflecting portion 46.

In this case, the rectangular illumination area 15 on the reticle R, illuminated by the illuminating light IL, is set at a position decentered in the direction −Y from the optical axis AX1. Illuminating light passing through the illumination area 15 (the light will hereinafter be referred to as "image-forming light beam") passes through the lenses L1, L2, . . . , L4 in the first objective portion 41 and further passes through the inside of the lens barrel 47 of the optical axis deflecting portion 46 to enter the optical axis turn portion 43. The image-forming light beam entering the optical axis turn portion 43 passes through the lenses L11, L12, . . . , L20 and L21 to be incident on the concave mirror 45. The image-forming light beam reflected and condensed by the concave mirror 45 passes through the lenses L21, L20, . . . , L12 and L11 and is then deflected to travel in the direction +Y by the small-sized mirror 48 in the lens barrel 47 of the optical axis deflecting portion 46.

In the optical axis deflecting portion 46, the image-forming light beam reflected by the small-sized mirror 48 passes through the lenses L31 and L32 and the correcting optical system 49 to enter the beam splitter 50. At this time, an image (intermediate image) approximately equal in size to the pattern in the illumination area 15 on the reticle R is formed near the beam splitter 50 in the lens barrel 47. Accordingly, a composite system formed from the first objective portion 41 and the optical axis turn portion 43 is referred to as "1:1 optical system". The image-forming light beam deflected to travel in the direction −Z by the beam splitter 50 enters the second objective portion 52, in which the image-forming light beam passes through the lenses L41, L42, . . . , L51 and L52 to form in the exposure area 16 on the wafer W a demagnified image of the pattern in the illumination area 15 on the reticle R. Accordingly, the second objective portion 52 will be hereinafter occasionally referred to as "reduction projection system".

As stated above, the image-forming light beam passing through the illumination area 15 on the reticle R approximately in the direction −Z is turned back approximately in the direction +Z through the first objective portion 41 and the optical axis turn portion 43 in the projection optical system PL according to this embodiment. The image-forming light beam is then successively turned approximately in the directions +Y and −Z by the optical axis deflecting portion 46. During the course of being turned, the image-forming light beam forms an intermediate image approximately equal in size to the pattern in the illumination area 15, and thereafter, forms a demagnified image of the illumination area 15 in the exposure area 16 on the wafer W through the second objective portion 52. By virtue of this arrangement, the projection optical system PL according to this embodiment can use axially symmetric lenses for all the lenses L2 to L4, L11 to L21, L31, L32, and L41 to L52. Moreover, achromatization can be achieved with high accuracy over the range of about 100 pm, which is the bandwidth of the broad band illuminating light IL, by forming almost all the lenses from quartz and forming only three or four of the lenses from fluorite.

The projection optical system PL according to this embodiment is optically divided into three parts, i.e. the 1:1 optical system consisting essentially of the first objective portion 41 and the optical axis turn portion 43; the optical axis deflecting portion 46; and the reduction projection system consisting essentially of the second objective portion 52. From the viewpoint of a mechanical structure, the small-sized mirror 48 is interposed between the lens L4 of the first objective portion 41 and the lens L11 of the optical axis turn portion 43. Therefore, if the lens L4, the small-sized mirror 48 and the lens L11 are incorporated into the same lens barrel, the small-sized mirror 48 and the beam splitter 50 in the optical axis deflecting portion 46 will be necessary to incorporate into respective lens barrels from the viewpoint of adjustment. However, if the small-sized mirror 48 and the beam splitter 50 are incorporated into different lens barrels, it is likely that perpendicularity between the reflecting surfaces of the two members will vary. A variation in the perpendicularity between the two reflecting surfaces causes the image-forming characteristics to be degraded. In this embodiment, therefore, the 1:1 optical system is divided into the first objective portion 41 and the optical axis turn portion 43 through the lens barrel 47 of the optical axis deflecting portion 46, and the small-sized mirror 48 and the beam splitter 50 are secured in the lens barrel 47.

To assemble the projection optical system PL, the first objective portion 41, the optical axis turn portion 43, the optical axis deflecting portion 46, and the second objective portion 52 are assembled and adjusted separately in advance. Thereafter, the lower part of the lens barrel 44 of the optical axis turn portion 43 and the lower part of the lens barrel 53 of the second objective portion 52 are inserted into respective through-holes provided in a plate of the column 25. Then, washers are put between a flange 44a of the lens barrel 44 and the plate of the column 25 and between a flange 53a of the lens barrel 53 and the plate of the column 25, and the flanges 44a and 53a are temporarily screwed to the plate. Then, the lens barrel 47 of the optical axis deflecting portion 46 is placed on the upper ends of the lens barrels 44 and 53. A washer is put between a flange 47a of the lens barrel 47 and a flange 53b at the upper end of the lens barrel 53, and the flange 47a is temporarily screwed to the flange 53b.

Then, a laser beam for adjustment is applied to the inside of the lens barrel 44 from above the lens L11 in the lens barrel 44 to monitor a position passed by the laser beam emanating from the lowermost lens L52 in the lens barrel 53 (i.e. a position on a plane corresponding to the surface of the wafer W), and the thicknesses of the washers under the bottoms of the flanges 44a, 53a and 47a are adjusted and the lens barrels 42, 53 and 47 are transversely moved so that the monitored position coincides with the target position. In a state where the position of the laser beam reaches the target position, the flanges 44a, 53a and 47a are properly screwed, thereby securing the optical axis turn portion 43, the second objective portion 52, and the optical axis deflecting portion 46. Finally, the lens barrel 42 of the first objective portion 41 is moved to a position above that end of the lens barrel 47 which faces in the direction −Y. A washer is put between a flange (not shown) of the lens barrel 42 and the corresponding flange (not shown) of the lens barrel 47, and the lens barrel 42 is placed on the lens barrel 47. Then, a laser beam for adjustment is applied from above the lens L1 in the lens barrel 42, for example, to thereby perform optical axis adjustment. Thereafter, the lens barrel 42 is screwed onto the lens barrel 47. Thus, the incorporation of the projection optical system PL into the projection exposure apparatus is completed.

Further, in this embodiment., the center 54 of gravity of the whole projection optical system PL is set at a position in the projection optical system PL and outside the optical path of the image-forming light beam by taking into consideration the stability of image-forming characteristics with respect to vibrations and the balance of the projection optical system PL. That is, in FIG. 2, the center 54 of gravity of the projection optical system PL is set a position (in the plate of the column 25) near the middle between the optical axis turn portion 43 and the second objective portion 52 and slightly lower than the flange 44a of the lens barrel 44 and the flange 53a of the lens barrel 53. Thus, by setting the center 54 of gravity of the projection optical system PL closer to the flanges 44a and 53a, the projection optical system PL has a structure that is not readily affected by vibrations and exhibits high rigidity.

In the projection optical system PL according to this embodiment, an intermediate image plane conjugate with the pattern surface of the reticle R exists in the optical axis deflecting portion 46 and near the beam splitter 50, and the correcting optical system 49 is disposed near the intermediate image plane. It is possible to correct image-forming characteristics such as the projection magnification and distortion of the demagnified image of the reticle, which is projected onto the wafer W, by slightly moving, for example, a lens unit serving as the correcting optical system 49 in the direction of the optical axis AX2 or adjusting the tilt angle of the lens unit with respect to a plane perpendicular to the optical axis AX2. In the conventional apparatus, such an image-forming characteristic correcting mechanism has been provided approximately directly below the reticle R. In this embodiment, there is no image-forming characteristic correcting mechanism directly below the reticle R; there is no restriction on the mechanical arrangement. Therefore, the rigidity of the reticle support 18, shown in FIG. 1, can be advantageously increased in design. If a slightly movable optical system similar to the correcting optical system 49 is provided in the optical axis turn portion 43 or the second objective portion 52, it becomes possible to correct aberrations (e.g. astigmatism and coma) of the projected image and also possible to correct curvature of field. It is also possible to correct higher-order magnification errors by a combination of these optical systems.

Next, the positional relationship between the illumination area 15 on the reticle R and the exposure area 16 on the wafer W in FIG. 2 will be described with reference to FIGS. 3(a) to 3(d).

Figure 3A:
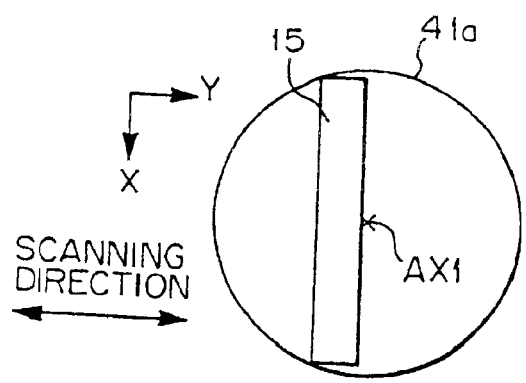
FIGS. 3(a), 3(b), 3(c) and 3(d) show the relationship between an illumination area and an exposure area in the projection optical system shown in FIG. 2.

FIG. 3(a) shows the illumination area 15 on the reticle R in FIG. 2. In FIG. 3(a), a rectangular illumination area 15, which is longer in the direction X, is set in a circular effective illumination field 41a of the first objective portion 41 of the projection optical system PL, shown in FIG. 2, at a position slightly displaced in the direction −Y relative to the optical axis AX1. The. direction (direction Y) of the short side of the illumination area 15 is the scanning direction of the reticle R. In the 1:1 optical system consisting essentially of the first objective portion 41 and the optical axis turn portion 43, as shown in FIG. 2, the image-forming light beam passing through the illumination area 15 on the reticle R is turned back by the concave mirror 45 so as to be led to the small-sized mirror 48. Therefore, the illumination area 15 must be decentered with respect to the optical axis AX1.

Figure 3B:
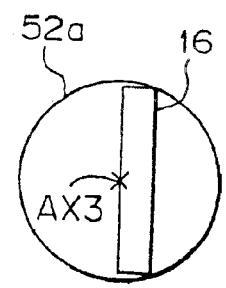

FIG. 3(b) shows the exposure area 16 (conjugate with the illumination area 15) on the wafer W in FIG. 2. In FIG. 3(b), a rectangular exposure area 16, which is longer in the direction X, is set in a circular effective exposure field 52a of the second objective portion 52 (reduction projection system) of the projection optical system PL, shown in FIG. 2, at a position slightly displaced in the direction +Y relative to the optical axis AX3.

Figure 3C:
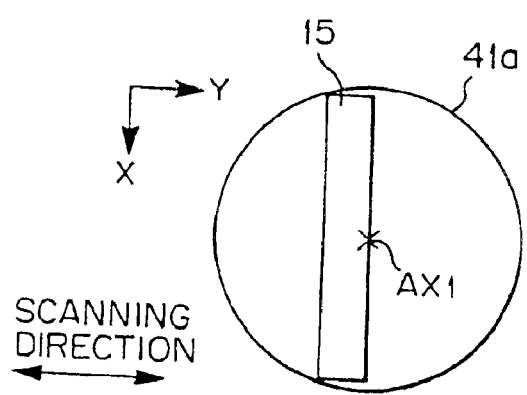
Figure 3D:
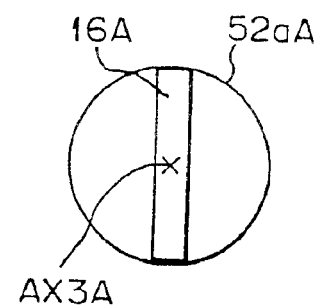

FIG. 3(c) shows a rectangular illumination area 15 set in a circular effective illumination field 41a at a position slightly displaced in the direction −Y relative to the optical axis AX1 as in the case of FIG. 3(a). FIG. 3(d) shows an effective exposure field 52aA of a second objective portion formed by modifying the second objective portion 52 in FIG. 2. In FIG. 3(d), a rectangular exposure area 16A [conjugate with the illumination area 15 in FIG. 3(c)], which is longer in the direction X, is set centered on the optical axis AX3A of the effective exposure field 52aA. More specifically, as shown in FIG. 3(d), the exposure area 16A on the wafer W can be set as an area centered on the optical axis of the effective exposure field 52aA by modifying the arrangement of the second objective portion 52 (reduction projection system), which is the final stage in the projection optical system PL. The arrangements shown in FIGS. 3(b) and 3(d) may be selected according to the ease of designing an arrangement for removing aberrations from the projection optical system PL. The arrangement shown in FIG. 3(b) is advantageous in that the design is easy. The arrangement shown in FIG. 3(d) is advantageous in that the lens diameter of the second objective portion (reduction projection system) can be slightly reduced.

Next, the arrangement of the off-axis alignment sensor 28 shown in FIG. 1 will be described in detail with reference to FIG. 4.

FIG. 4 shows an external appearance of the projection optical system PL in FIG. 2. As shown in FIG. 4, the projection optical system PL is divided into the first objective portion 41, the optical axis deflecting portion 46, the optical axis turn portion 43, and the second objective portion 52, which are necessary to design such that these portions will not be distorted by disturbances such as vibrations and heat, which may occur therebetween. Therefore, the column 25 on which the flanges 44a and 53a are placed requires high rigidity, particularly for a portion 25a of the column 25 that extends between the optical axis turn portion 43 and the second objective portion 52. In order to ensure such high rigidity, the alignment sensor 28 for detecting the position of a wafer mark WM provided on the wafer W as an alignment mark must be installed on that side of the second objective portion 52 which is remote from the portion 25a, which requires high rigidity, that is, on the +Y side of the second objective portion 52. A portion 25b of the column 25 that faces the +Y side and +X and −X sides of the second objective portion 52 has a thickness not more than ½ of that of the high-rigidity portion 25a. The alignment sensor 28 is disposed at the bottom of the thin portion 25b. By virtue of this arrangement, even when the reticle R and the wafer W are scanned in the direction of the arrow (direction Y) during scanning exposure, the first objective portion 41, the optical axis deflecting portion 46, the optical axis turn portion 43, and the second objective portion 52 are supported as an integral structure constituting the projection optical system PL. Thus, satisfactorily high rigidity can be ensured for the projection optical system PL.

In the off-axis alignment sensor 28 shown in FIG. 4, when alignment is to be effected, a halogen lamp (not shown) or the like emits broad-band (white) alignment light AL to which the photoresist on the wafer W is only slightly sensitive, and the alignment light AL is led through a light guide 62 to a lens barrel 61 of the alignment sensor 28. In the lens barrel 61, the alignment light AL passes successively through a condenser lens 63 and a half-mirror 64. Thereafter, the alignment light AL passes through a first objective lens 65 and is reflected by a prism-type deflection mirror 66 to illuminate an observation field over a predetermined range on the wafer W that contains the wafer mark WM. Reflected light from the wafer mark WM passes via the deflection mirror 66 and through the first objective lens 65 and is reflected by the half-mirror 64. Thereafter, the reflected light passes through a second objective lens 67 to form an image of the wafer mark WM on an index board 68. The index board 68 has an index mark formed thereon as a reference for the position detection of the wafer mark WM.

A light beam passing through the index board 68 passes through a first relay lens 69 and is reflected by a deflection mirror 70. The reflected light beam passes through a second relay lens 71 to form an image of the wafer mark WM, together with an image of the index mark, on an image pickup device 72, which is a two-dimensional CCD. The wafer mark WM is, for example, a grating-shaped mark for the Y-axis comprising recesses and projections alternately arranged in the direction Y at a predetermined pitch. An image signal generated from the image pickup device 72 is supplied to the alignment signal processor 29, shown in FIG. 1. The alignment signal processor 29 calculates an amount of positional displacement in the direction Y of the wafer mark WM relative to the index mark on the index board 68 on the basis of the image signal. The alignment signal processor 29 adds the Y-coordinate measured by the laser interferometer 24, shown in FIG. 1, to the calculated amount of positional displacement to obtain a Y-coordinate of the wafer mark WM in the stage coordinate system (X, Y) and supplies the calculated Y-coordinate to the main controller 7. It should be noted that the shot area concerned on the wafer W is also provided with a wafer mark for the X-axis which has a configuration obtained by rotating the wafer mark WM through 90°, and that the alignment sensor 28 also detects the X-coordinate of the wafer mark for the X-axis in the stage coordinate system (X, Y). Thus, alignment of the wafer W is effected by detecting the coordinates of the wafer marks attached to a predetermined shot area on the wafer W through the alignment sensor 28.

It is desirable in order to carry out the measurement by the alignment sensor 28 with high accuracy to minimize the distance (baseline quantity) between the center of detection by the alignment sensor 28 (i.e. the center of the projected image of the index mark onto the wafer W) and the center of exposure by the projection optical system PL (i.e. the center of the exposure area 16). To minimize the baseline quantity, the alignment sensor 28 is disposed as close to the second objective portion 52 of the projection optical system PL as possible.

However, in addition to the off-axis alignment sensor 28, the multipoint AF sensor 26 for detecting the focus position and tilt angle of the surface of the wafer W, which is shown in FIG. 1, also needs to be disposed close to the second objective portion 52. In this embodiment, therefore, the AF sensor 26 is disposed on the ±X sides of the second objective portion 52 to extend perpendicular to the alignment sensor 28 in order to prevent mechanical interference between the alignment sensor 28 and the AF sensor 26.

Figure 5:
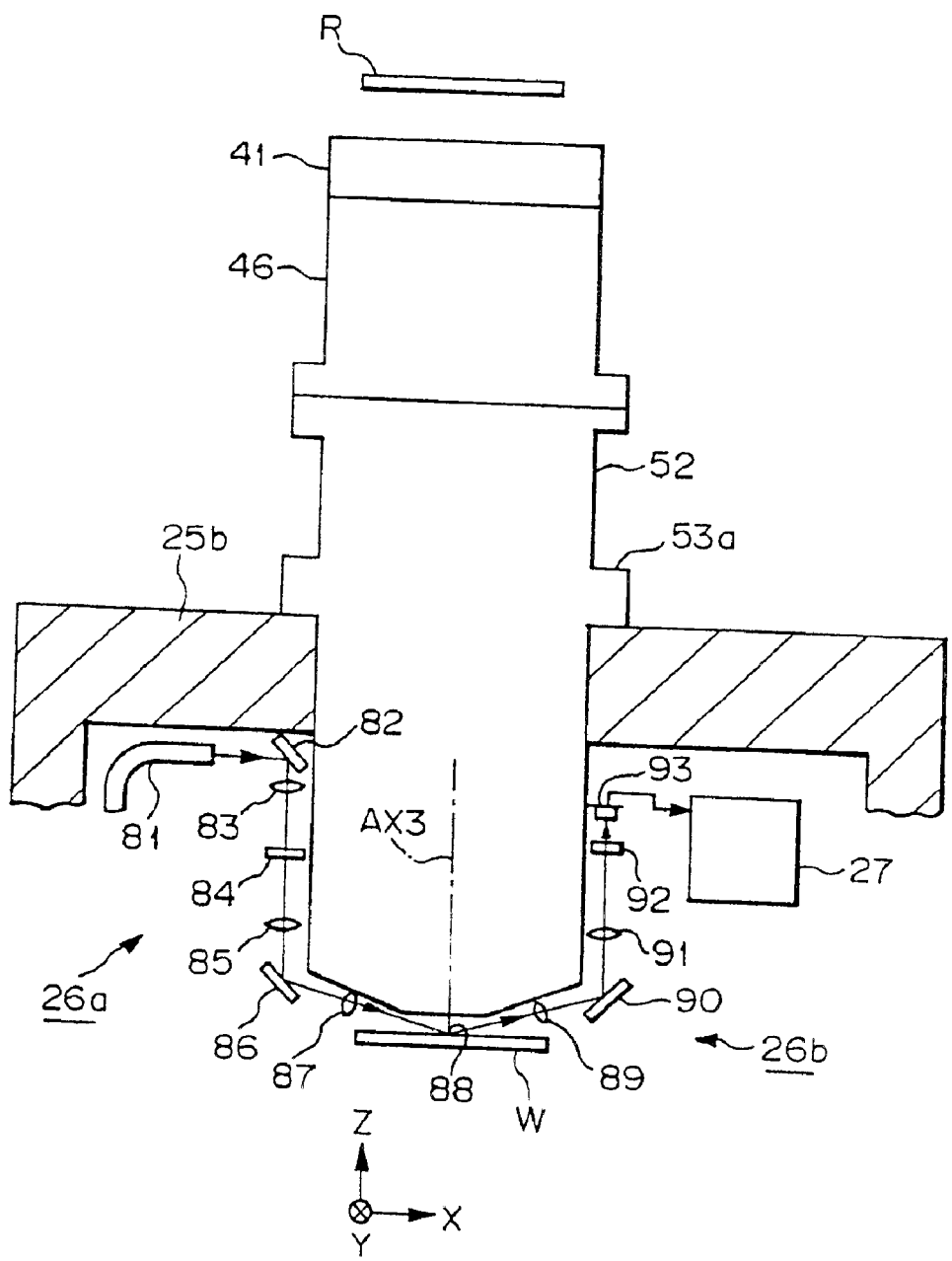
FIG. 5 is a fragmentary sectional view showing the arrangement of a multipoint AF sensor in FIG. 1.

FIG. 5 shows the way in which the AF sensor 26 is arranged. FIG. 5 is a sectional view taken along a plane (XZ-plane) containing the optical axis AX3 of the second objective portion 52, shown in FIG. 4, and perpendicular to the Y-axis. For the convenience of explanation, the upper half of FIG. 5 is a side view of the reticle R and the first objective portion 41 as viewed from the left side thereof in FIG. 4. In FIG. 5, the AF sensor 26 is divided into an irradiation optical system 26a and a condenser optical system 26b. The irradiation optical system 26a and the condenser optical system 26b are disposed on the respective sides of the second objective portion 52 that face in the directions −X and +X, respectively, and at the bottom of the portion 25b of the column 25, shown in FIG. 4, which is thinner than the portion 25a of high rigidity.

First, in the irradiation optical system 26a, a halogen lamp (not shown) or the like emits approximately white illuminating light to which the photoresist is only slightly sensitive. The illuminating light is led to a side of the second objective portion 52 through a light guide 81. Then, the illuminating light is reflected by a mirror 82 and passes through a condenser lens 83 to illuminate a multi-slit plate 84 having a plurality of slit-shaped apertures formed therein in a predetermined array pattern. Illuminating light passing through each slit-shaped aperture of the multi-slit plate 84 passes through a lens 85 and is reflected by an oscillating mirror 86, and the reflected light passes through a lens 87 to project a plurality of slit images (one slit image 88 is representatively shown in FIG. 5), which are conjugate images of the plurality of slit-shaped apertures, onto the surface of the wafer W obliquely to the optical axis AX3. It should be noted that an area where the slit images are projected extends over from the rectangular exposure area 16 on the wafer W, shown in FIG. 1, to a pre-read area which is upstream the exposure area 16 in the scanning direction.

Reflected light from the plurality of slit images on the wafer W enters the condenser optical system 26b. In the condenser optical system 26b, the reflected light passes through a lens 89 and is reflected by a mirror 90. Then, the reflected light passes through a lens 91 to reform the slit images (88 and so forth) on a multi-slit plate 92 having a plurality of slit-shaped apertures corresponding to those of the multi-slit plate 84. A photoelectric detector 93 is disposed on the reverse surface of the multi-slit plate 92. The photoelectric detector 93 consists essentially of photoelectric transducers, e.g. photodiodes, that independently receive reflected light passing through the respective slit-shaped apertures of the multi-slit plate 92. A photoelectrically converted signal (hereinafter referred to as "focus signal") obtained from each photoelectric transducer of the photoelectric detector 93 is supplied to the focus-tilt controller 27.

In this case, in response to the oscillation of the oscillating mirror 86, the slit images formed on the multi-slit plate 92 oscillate over the corresponding slit-shaped apertures in the direction of the short side of the apertures. Moreover, if the focus position (position in the direction Z) of the surface of the wafer W changes, the center of oscillation of each slit image and the center of the corresponding slit-shaped aperture are transversely displaced relative to each other. Therefore, the focus signal, which is obtained by photoelectrically converting the reflected light passing through each slit-shaped aperture, is synchronously rectified by a driving signal of the oscillating mirror 86 in the focus-tilt controller 27, thereby obtaining a signal corresponding to an amount of change of the focus position at the position of projection of each slit image (88, etc.) on the wafer W. Further, the AF sensor 26 has previously been calibrated so that when the surface of the wafer W is coincident with the image-formation plane of the projection optical system PL, the synchronously rectified signals of the focus signals are zero. Accordingly, the focus-tilt controller 27 can obtain a mean value of the focus positions in the exposure area 16 and the pre-read area on the wafer W and also a tilt angle from the synchronously rectified signals. Information concerning the mean value of the focus positions and information concerning the tilt angle are supplied to the stage controller 13 through the main controller 7 substantially in real time. The stage controller 13 effects autofocusing and autoleveling such that the exposure area 16 on the wafer W coincides with the image-formation plate of the projection optical system PL during scanning exposure, as stated above.

In FIG. 1, laser interferometers and moving mirrors, which are actually two-dimensionally arranged, are represented by one laser interferometer 24 and one moving mirror 24m, respectively. Next, one example of a specific arrangement of wafer-side laser interferometers and associated moving mirrors according to this embodiment will be described with reference to FIGS. 6, 7(a) and 7(b).

Figure 6:
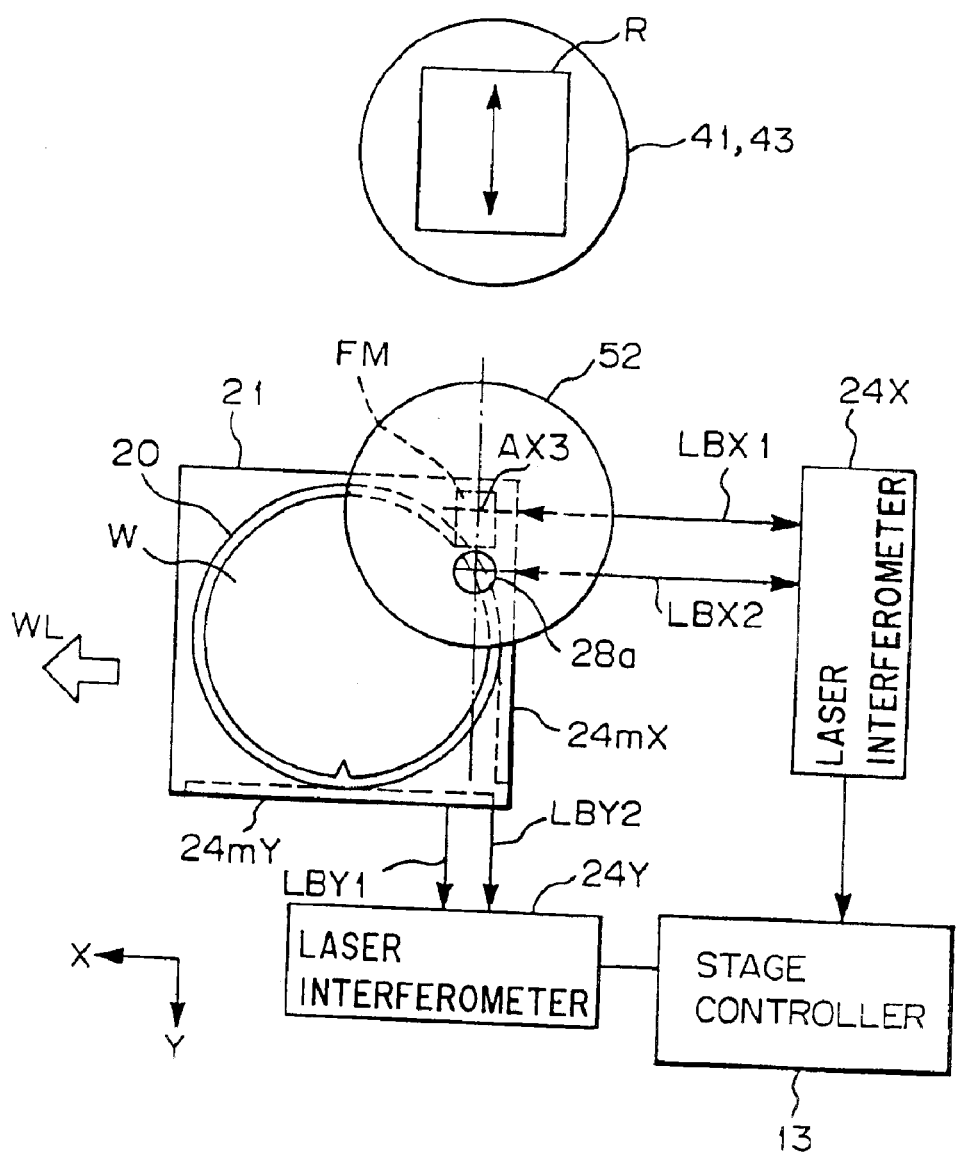
FIG. 6 is a plan view showing the relationship between a wafer-side laser interferometer and the projection optical system in FIG. 1.

FIG. 6 is a plan view of the sample table 21 on which the wafer W is placed, as shown in FIG. 1. For convenience of explanation, in FIG. 6, the external shape of the second objective portion 52 of the projection optical system PL, shown in FIG. 2, and an observation field 28a of the alignment sensor 28, shown in FIG. 4, are shown with an accurate positional relationship to the external shapes of the first objective portion 41 and the optical axis turn portion 43 and the reticle R. Further, in FIG. 6, the system is in a state where the optical axis AX3 of the second objective portion 52 lies in the fiducial mark member FM on the sample table 21.

In this embodiment, as shown in FIG. 2, that portion of the column 25 which extends between, on the one hand, the first objective portion 41 and the optical axis turn portion 43 of the projection optical system PL and, on the other, the second objective portion 52 has a firm structure in order to enhance rigidity. Accordingly, it is difficult to dispose laser interferometers between these two sections of the projection optical system PL. Even if laser interferometers can be disposed therebetween, there will be no sufficient space for performing down-flow air conditioning along the optical axes of the laser interferometers, and the resulting structure will be such that the laser interferometers are readily affected by the fluctuation of air.

To avoid the influence of the air fluctuation, in this embodiment, laser interferometers are disposed, as shown in FIG. 6, at a side of the projection optical system PL opposite to the optical axis turn portion 43 with respect to the second objective portion 52, that is, at respective positions in the directions +Y and −X relative to the second objective portion 52. In FIG. 6, a moving mirror 24mY is secured to that side of the sample table 21 which faces in the direction +Y. The moving mirror 24mY has a reflecting surface perpendicular to the Y-axis. A moving mirror 24mX is secured to that side of the sample table 21 which faces in the direction −X. The moving mirror 24mX has a reflecting surface perpendicularly intersecting the reflecting surface of the moving mirror 24mY (i.e. perpendicular to the X-axis). A laser interferometer 24Y for the Y-axis is disposed to face the moving mirror 24mY for the Y-axis. The laser interferometer 24Y applies laser beams for three axes to the moving mirror 24mY in parallel to the Y-axis. Of the laser beams for three axes, laser beams LBY1 and LBY2 for two axes are shown in FIG. 6. The two laser beams LBY1 and LBY2 are spaced apart from each other in the direction X at a predetermined interval. The two laser beams LBY1 and LBY2 pass through respective positions symmetric about an imaginary straight line intersecting the optical axis AX3 of the second objective portion 52 and the center of the observation field 28a of the alignment sensor 28 and parallel to the Y-axis.

Figure 7A:
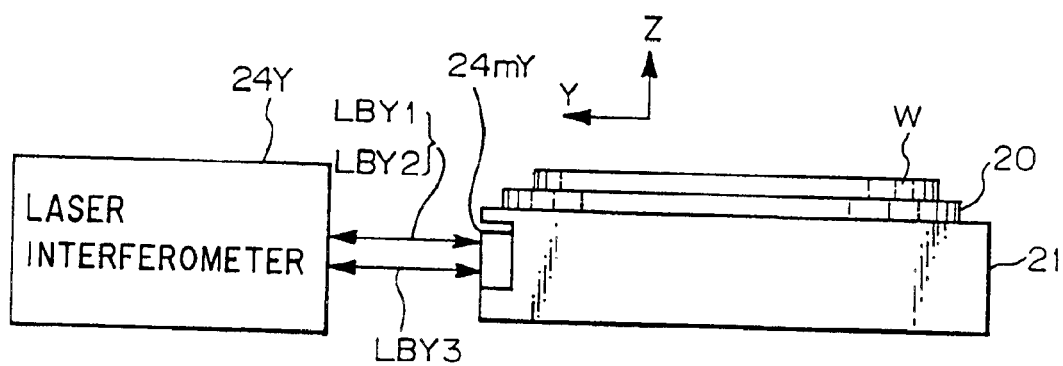
FIG. 7(a) is a side view of a sample table in FIG. 6 as viewed in the direction +X.
Figure 7B:
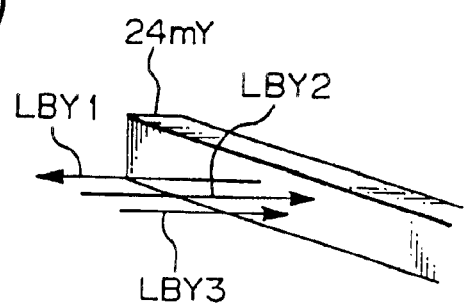
FIG. 7(b) is a perspective view showing laser beams for three axes incident on a moving mirror.

FIG. 7(a) is a side view of the sample table 21 as viewed in the direction +X in FIG. 6. As shown in FIG. 7(a), a laser beam LBY3 for a third axis is applied from the laser interferometer 24Y to the moving mirror 24mY in parallel to the Y-axis at a predetermined distance in the direction Z from the two laser beams LBY1 and LBY2. As shown in FIG. 7(b), the laser beam LBY3 passes through an intermediate position between the two laser beams LBY1 and LBY2 in the direction X. The laser interferometer 24Y constantly detects Y-coordinates Y1, Y2 and Y3 respectively corresponding to the three laser beams LBY1, LBY2 and LBY3 at a resolution of the order of 0.001 μm, and outputs the detected Y-coordinates Y1, Y2 and Y3 to the stage controller 13. The stage controller 13 obtains a mean value of and a difference between the two Y-coordinates Y1 and Y2, for example, as the Y-coordinate and rotation angle (yawing), respectively, of the sample table 21. It should be noted that during the measurement of the rotation angle, the moving mirror 24mY is corrected for bend.

In FIG. 6, a laser interferometer 24X for the X-axis is disposed to face the moving mirror 24mX for the X-axis. The laser interferometer 24X applies laser beams for three axes to the moving mirror 24mX in parallel to the X-axis. Of the laser beams for three axes, laser beams LBXL and LBX2 for two axes are shown in FIG. 6. The two laser beams LBX1 and LBX2 are spaced apart from each other in the direction Y at a predetermined interval. The two laser beams LBX1 and LBX2 pass through respective optical paths. That is, the laser beam LBX1 passes through an optical path intersecting the optical axis AX3 of the second objective portion 52 and parallel to the X-axis, and the laser beam LBX2 passes through an optical path intersecting the center of the observation field 28a of the alignment sensor 28 and parallel to the X-axis.

A laser beam for a third axis is applied from the laser interferometer 24X to the moving mirror 24mX in parallel to the X-axis at a predetermined distance in the direction Z from the two laser beams LBX1 and LBX2 as In the case of FIGS. 7(a) and 7(b). The laser interferometer 24X constantly detects X-coordinates X1 and X2 respectively corresponding to the two laser beams LBX1 and LBX2 and an X-coordinate X3 corresponding to the other axis at a resolution of the order of 0.001 μm, and outputs the detected X-coordinates X1, X2 and X3 to the stage controller 13. During exposure, the stage controller 13 uses the X-coordinate X1 corresponding to the optical axis AX3 as the X-coordinate of the sample table 21. During alignment, the stage controller 13 uses the X-coordinate X2 corresponding to the center of the observation field 28a as the X-coordinate of the sample table 21. Thus, during both exposure and alignment, the so-called Abbe error due to a positional displacement between the object to be measured and the axis of measurement becomes substantially zero, and the position detection can be effected with high accuracy. It should be noted that the moving mirror 24mX can be corrected for bend on the basis of the two X-coordinates X1 and X2 as in the case of the moving mirror 24mY for the Y-axis.

Thus, in this embodiment, the laser interferometers 24Y and 24X are, as shown in FIG. 6, disposed at respective positions in the directions +Y and −X with respect to the sample table 21. Moreover, the projection optical system PL, which consists essentially of the optical axis turn portion 43, the second objective portion 52, etc., is disposed along the direction −Y with respect to the sample table 21. Consequently, it is possible to utilize a space in the direction +X (which is in symmetric relation to the laser interferometer 24X) with respect to the sample table 21. In this embodiment, therefore, a wafer transfer system including a wafer loader WL, etc. for loading and unloading a wafer onto and from the sample table 21 is disposed at a position in the direction +X with respect to the sample table 21.

By virtue of this arrangement, it is possible to effect down-flow air conditioning for the optical paths of laser beams from the laser interferometers 24X and 24Y. More specifically, down-flow air conditioning is performed, for example, by supplying air or other gas of uniform velocity distribution, which has been subjected to temperature control so as to have a uniform temperature distribution, to the floor surface, where the projection exposure apparatus is installed, from above the laser beams LBY1, LBY2, LBX1 and LBX2 and collecting the supplied air at the floor surface.

By doing so, at the laser interferometers 24X and 24Y, the influence of air fluctuation in the laser beam optical paths is minimized, and the accuracy of measurement of the position and rotation angle of the sample table 21 increases, advantageously.

In FIG. 7(a), the sample table 21 is formed from a ceramic material, and the moving mirror 24mY (the same is the case with 24mX) is also formed from the same ceramic material as that of the sample table 21. The moving mirror 24mY is secured to a side of the sample table 21 through fixing screws (not shown). Meanwhile, the wafer W is held through the wafer holder 20 on the sample table 21. Therefore, the position of the wafer W is displaced in the direction Z relative to the position of the optical axes of the laser beams LBY1 and LBY2 from the laser interferometer 24Y. Accordingly, if the sample table 21 pitches, a positional displacement ΔY occurs between the Y-coordinate measured by the laser interferometer 24Y and the actual Y-coordinate of the sample table 21 (more precisely, the wafer W) owing to the so-called Abbe error. In this embodiment, therefore, the laser beam LBY3, which passes through a position displaced in the direction Z relative to the laser beams LBY1 and LBY2, is used to calculate a tilt angle Δθ of the sample table 21 about the X-axis from a difference between a mean value of the Y-coordinates measured by the laser beams LBY1 and LBY2 [i.e. (Y1+Y2)/2] and the Y-coordinate Y3 measured by the laser beam LBY3. Then, the mean value of the Y-coordinates measured by the laser beams LBY1 and LBY2 is corrected on the basis of the tilt angle Δθ, thereby correcting the Abbe error due to the difference in height between the wafer W and the laser beams LBY1 and LBY2.

Regarding the laser interferometer 24X for the X-axis also, the Abbe error mixed in the measured value by the laser beams LBX1 and LBX2 is corrected by using the measured value obtained by the laser beam for the third axis.

By adopting the method wherein the moving mirrors 24mY and 24mX are mounted on two sides of the sample table 21 as stated above, the space above the moving mirrors 24mY and 24mX can be effectively used to dispose, for example, the end portion of the wafer holder 20, as shown in FIG. 6. As a result, the overall size and weight of the sample table 21 can be reduced. Therefore, controllability during scanning and positioning the wafer W improves.

Further, complicated machining of ceramics takes a great deal of time, and the production cost becomes extremely high. In this regard, according to this embodiment, the moving mirrors 24mY and 24mX and the sample table 21, which require high surface accuracy, are produced separately despite the same material and thereafter joined together, thereby simplifying the configuration of each individual component, and thus reducing the overall production cost. In a case where the temperature control is difficult to effect, a material of low thermal expansion coefficient, e.g. Zerodure, may be used in place of ceramics, although rigidity somewhat lowers.

Next, the operations of the reflected light detecting system 30 and the self-measuring device 31, shown in FIG. 1, will be described with reference to FIGS. 2 and 8.

In FIG. 2, illuminating light IL passing through the illumination area 15 on the reticle R is applied to the wafer W through the 1:1 optical system, which consists essentially of the first objective portion 41 and the optical axis turn portion 43, and further through the optical axis deflecting portion 46 and the second objective portion 52 (reduction projection system). If the fiducial mark member FM is set in place of the wafer W, reflected light from the fiducial mark member FM passes, in FIG. 2, through the second objective portion 52 to enter the beam splitter 50 in the optical axis deflecting portion 46. The beam splitter 50 has a transmittance of 5%; therefore, a part of the reflected light passes through the beam splitter 50 and is detected by the reflected light detecting system 30, shown in FIG. 1. In FIG. 2, illustration of the reflected light detecting system 30 is omitted.

Figure 8:
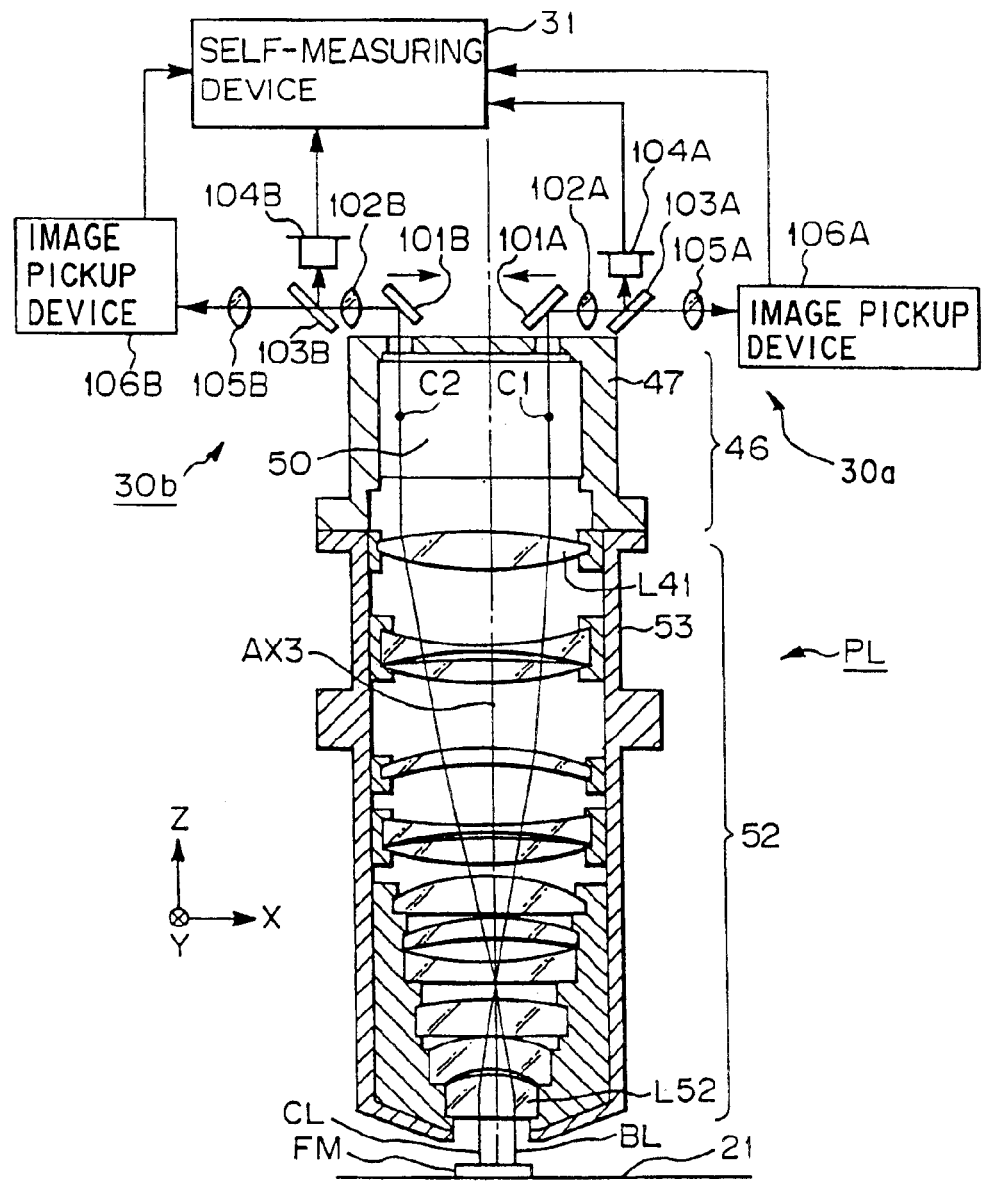
FIG. 8 is a longitudinal sectional view showing the arrangement of a reflected light detecting system that receives reflected light from a fiducial pattern member in FIG. 1.

FIG. 8 is a sectional view of the projection optical system PL taken along a plane containing the optical axis AX3 and perpendicular to the X-axis in a state where the reflected light detecting system 30, shown in FIG. 1, is disposed above the optical axis deflecting portion 46, shown in FIG. 2. In FIG. 8, the reflected light detecting system 30 consists essentially of a first reflected light detecting system 30a and a second reflected light detecting system 30b. The fiducial mark member FM is set in the effective exposure field of the second objective portion 52 of the projection optical system PL. The fiducial mark member FM has fiducial patterns, e.g. slits or pinholes, formed by light-transmitting apertures in a film (e.g. a metal film) of high reflectivity provided on the fiducial mark member FM. The arrangement is such that a desired fiducial pattern on the fiducial mark member FM can be moved to the vicinity of a predetermined position in the effective exposure field by driving the wafer stage 22, shown in FIG. 1.

After the desired fiducial pattern has been set in the vicinity of the predetermined position, illuminating light passing through the reticle R, shown in FIG. 2, is applied to the surface of the fiducial mark member FM through the projection optical system PL, and reflected light CL and BL are produced from respective regions on the fiducial mark member FM, which are approximately symmetric about the optical axis AX3 to travel toward the second objective portion 52.

One reflected light CL passes through the lenses L52 to L41 in the second objective portion 52 to enter the beam splitter 50 in the optical axis deflecting portion 46. Reflected light CL passing through a position C1 on the beam splitter 50 passes through an aperture in the lens barrel 47 to enter the first reflected light detecting system 30a. In the first reflected light detecting system 30a, the reflected light CL is reflected by a deflection mirror 101A and passes through a first relay lens 102A to enter a half-mirror 103A. A light beam reflected by the half-mirror 103A enters a light-receiving surface of a pupil position photoelectric detector 104A consisting essentially of a photodiode or the like, and a detection signal from the pupil position photoelectric detector 104A is supplied to the self-measuring device 31.

In this embodiment, under the reflected light CL, an intermediate image of the fiducial pattern is formed in the vicinity of the beam splitter 50, and a Fourier transform pattern of the intermediate image is produced by the first relay lens 102A and formed on the light-receiving surface of the pupil position photoelectric detector 104A. That is, the light-receiving surface of the pupil position photoelectric detector 104A is a Fourier transform plane (pupil plane) with respect to the surface of the fiducial mark member FM. The self-measuring device 31 detects a positional relationship between the pattern on the reticle R, shown in FIG. 2, and the fiducial pattern on the fiducial mark member FM by utilizing the fact that the detection signal from the pupil position photoelectric detector 104A changes as the reticle R and the fiducial mark member FM are moved relative to each other.

Meanwhile, a light beam passing through the half-mirror 103A passes through a second relay lens 105A to form an image of the fiducial pattern on an imaging surface of an image pickup device 106A consisting essentially of a two-dimensional CCD or the like. That is, the imaging surface of the image pickup device 106A is conjugate with the surface of the fiducial mark member FM. An image signal from the image pickup device 106A is supplied to the self-measuring device 31. The self-measuring device 31 detects a positional relationship between the pattern on the reticle R and the fiducial pattern on the basis of the image signal in a state where the reticle R and the fiducial mark member FM are stationary. The arrangement is such that both the first relay lens 102A and the deflection mirror 101A are movable, to a position above an arbitrary measuring point in the area (illumination field) corresponding to the effective exposure field of the second objective portion 52, and thus it is possible to capture a detection signal from the pupil position photoelectric detector 104A and an image signal from the image pickup device 106A at the arbitrary measuring point.

The second reflected light detecting system 30b is disposed above a position C2 on the beam splitter 50 of the optical axis deflecting portion 46 in symmetric relation to the first reflected light detecting system 30a. The second reflected light detecting system 30b includes a deflection mirror 101B, a first relay lens 102B, a half-mirror 103B, a pupil position photoelectric detector 104B, a second relay lens 105B, and an image pickup device 106B. The second reflected light detecting system 30b is arranged to be capable of receiving the reflected light BL generated from the surface of the fiducial mark member FM in approximately symmetric relation to the reflected light CL. In actuality, the first relay lens 102B and the deflection mirror 101B in the second reflected light detecting system 30b are also arranged to be movable independently of the first reflected light detecting system 30a. Thus, it is possible to carry out measurement at two arbitrary points in the illumination field corresponding to the effective exposure field of the second objective portion 52.

In actual measurement, if the reticle R is of the total transmission type, only reflected light from the periphery of a fiducial pattern (aperture pattern) on the fiducial mark member FM is detected in the reflected light detecting systems 30a and 30b through the second objective portion 52 and the beam splitter 50. Therefore, it is possible to check a light intensity distribution over the fiducial pattern.

In a case where the reticle R has a predetermined pattern formed thereon, an amount of light returning to the reflected light detecting systems 30a and 30b is determined by superposition of the projected image of the reticle pattern onto the fiducial mark member FM and the fiducial pattern. Accordingly, a positional relationship between the pattern on the reticle R and the fiducial pattern on the fiducial mark member FM can be checked by receiving the reflected light passing through the beam splitter 50 with the reflected light detecting systems 30a and 30b.

The self-measuring device 31 processes the detection signals and image signals from the reflected light detecting systems 30a and 30b, thereby effecting various operations, i.e. aligning the reticle R and the fiducial mark member FM; checking the image-forming characteristics of the projection optical system PL on the fiducial mark member FM; monitoring the reflectivity of the wafer W based on the amount of light reflected by the fiducial mark member FM; and detecting illuminance nonuniformity in the exposure area 16 on the wafer W. In the conventional apparatus, an illumination system and a light-receiving system are disposed in the sample table 21 in FIG. 1, for example, to effect measurement of image-forming characteristics, etc.

Therefore, it is possible according to this embodiment to simplify the internal and top structures of the sample table 21, to reduce the weight of the sample table 21 and to prevent generation of heat due to irradiation with illuminating light. Further, the conventional apparatus also uses a detection system that detects the reflectivity of a wafer by receiving reflected light from the wafer at the reticle R. In this regard, this embodiment also makes it possible to simplify the mechanism associated with the reticle R.

In the conventional apparatus, detecting light for measuring image-forming characteristics, etc. and illuminating light for exposure are different from each other; therefore, the measured image-forming characteristics may differ from image-forming characteristics under the illuminating light for exposure owing to a mismatch between the numerical aperture ($\sigma$ value as a coherence factor) of the detecting light and the numerical aperture ($\sigma$ value) of the illuminating light for exposure. The conventional apparatus further suffers from the problem of the insufficient numerical aperture of a light-receiving system for measuring image-forming characteristics, etc. According to this embodiment, illuminating light IL for exposure is also used as detecting light as it is, and the reflected light detecting systems 30a and 30b can be disposed in a space sufficiently wide to increase the numerical aperture. Therefore, image-forming characteristics, etc. can be measured with high accuracy.

Although the off-axis alignment sensor 28 according to the foregoing embodiment is of the field image alignment (FIA) type sensor, it should be noted that it is also possible to use a laser step alignment (LSA) type sensor in which a slit-shaped laser beam and a dot train-shaped wafer mark are scanned relative to each other, or a laser interferometric alignment (LIA) type sensor in which a diffraction grating-shaped wafer mark is illuminated by two coherent light beams, and position detection is performed on the basis of the phase of light resulting from an interference between a pair of diffracted light generated in the same direction from the wafer mark. Although in the foregoing embodiment the image-forming characteristics are corrected by driving an optical system in the projection optical system PL, it is also possible to use a mechanism for varying the pressure or temperature of a gas between a predetermined pair of lenses in the projection optical system PL to correct the image-forming characteristics.

Although in the foregoing embodiment the illumination area 15 on the reticle R is rectangular, it may be arcuate. However, in a case where the shape of the illumination area 15 is a rectangle substantially inscribed in the effective illumination field as in this embodiment, the amount of scanning of the reticle R can be reduced advantageously because the pattern area on the reticle R is also rectangular.

According to the above-described projection exposure apparatus, the projection optical system has a first optical system having a concave mirror to return a light beam toward a mask; a second optical system that deflects the returned light beam toward a photosensitive substrate; and a third optical system that forms on the photosensitive substrate an image of a part of a transfer pattern formed on the mask by the light beam from the second optical system. Accordingly, it is possible to use as the projection optical system a catadioptric system formed from a combination of refracting lenses which are all axially symmetric and a reflecting optical member (e.g. a concave mirror). These refracting lenses can be readily machined with high accuracy and can be achromatized over a relatively wide wavelength width by jointly using a reflecting optical member. Thus, favorable image-forming characteristics can be obtained.

Further, because it is possible to use a broad band laser light source of large output, for example, as a light source for exposure, the lifetime of the exposure light source increases, and the throughput can be increased.

It is also possible to shorten the scanning distance of the mask because a range in which favorable image-forming characteristics are available can be readily formed into an approximately rectangular area.

The arrangement may be such that the first and third optical systems are disposed along the scanning direction of the mask and the photosensitive substrate, and the center of gravity of the projection optical system lies outside the optical path of an image-forming light beam passing through the first and third optical systems. In this case, the projection optical system can be stably supported, and thus the image-forming characteristics are stabilized. Further, it is possible to enhance the rigidity of the projection optical system and to improve the vibration characteristics.

The projection exposure apparatus may further include an off-axis alignment sensor for detecting the position of an alignment mark on the photosensitive substrate. The alignment sensor may be arranged such that the optical axis of its optical system is substantially parallel to the optical axis of the third optical system and a predetermined distance away from the optical axis of the third optical system in the scanning direction of the photosensitive substrate. In this case, if a projection optical system consisting essentially of a catadioptric system as described above is used, the overall structure of the projection exposure apparatus can be made compact.

The arrangement may be such that the optical axes of the first and third optical systems are parallel to each other, and a surface position detecting system is disposed to lie in a direction perpendicularly intersecting a plane containing the optical axes of the first and third optical systems. The surface position detecting system includes an irradiation optical system that applies a light beam obliquely to the surface of the photosensitive substrate, and a light-receiving optical system that photoelectrically converts the light beam reflected from the photosensitive substrate to obtain a photoelectrically converted signal. The surface position detecting system detects a displacement of the surface of the photosensitive substrate on the basis of the photoelectrically converted signal from the light-receiving optical system. In this case, the constituent elements of the projection exposure apparatus can be arranged in a compact form without a mechanical interference between the surface position detecting system and other sensors.

The arrangement may be such that the second optical system has a partially transmitting mirror that directs the light beam from the first optical system toward the photosensitive substrate and that transmits a part of a light beam from the photosensitive substrate, and that a photoelectric detector is provided to receive that part of the light beam from the photosensitive substrate which passes through the partially transmitting mirror. In this case, it is possible to measure image-forming characteristics, etc. of the projection optical system without providing a detecting system in the vicinity of the mask or on the photosensitive substrate-side stage or so. Accordingly, it is possible to simplify the structures of the mask–and photosensitive substrate-side stages and reduce the weights thereof. Thus, controllability during scanning exposure can be improved.

If the photoelectric detector is a light-receiving element that photoelectrically converts reflected light from the photosensitive substrate, it is possible to monitor the reflectivity, etc. of the photosensitive substrate.

The photoelectric detector may be an image pickup device that picks up an image of a fiducial mark in the vicinity of the photosensitive substrate. In this case, it is possible to monitor the image-forming characteristics, etc. of the projection optical system.

The projection optical system may be an image-forming optical system that forms an intermediate image of a part of the transfer pattern of the mask between the mask and the photosensitive substrate, and a device for correcting image-forming characteristics of the projection optical system may be provided in the vicinity of a position where the intermediate image is formed. In this case, distortion, etc. can be readily corrected because the position of the correcting device is close to the intermediate image plane. Moreover, the rigidity of the mask-side stage can be enhanced because it becomes unnecessary to provide an image-forming characteristic correcting device directly under the mask.

Next, an air conditioning system of the projection exposure apparatus according to the present invention will be described with reference to FIG. 9. The projection exposure apparatus according to this embodiment is installed in a given chamber as a whole. The projection exposure apparatus is divided into a plurality of units, and air conditioning is independently carried out for each unit. Such an air conditioning system will hereinafter be referred to as "unit-by-unit air conditioning system".

Figure 9:
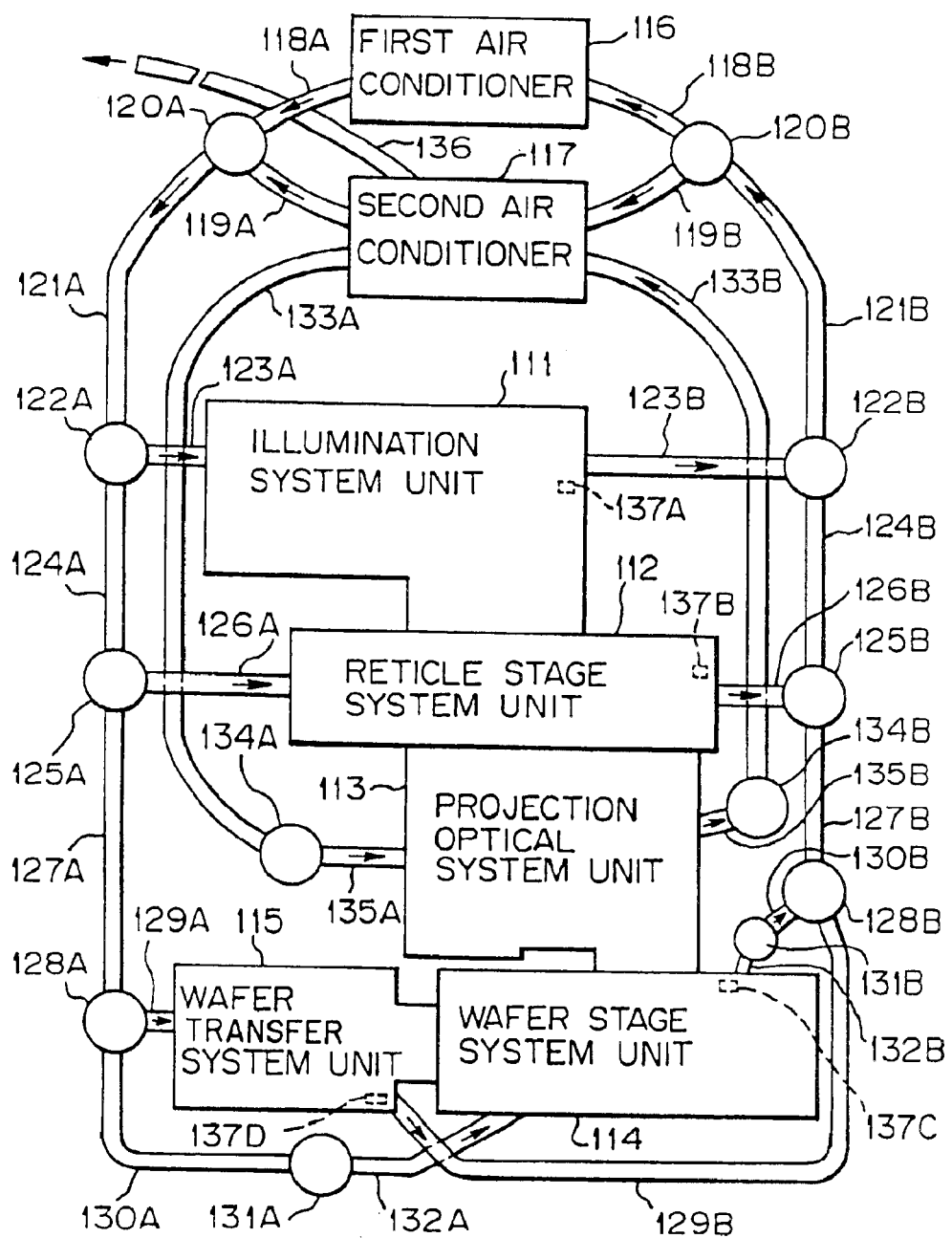
FIG. 9 is a block diagram showing a unit-by-unit airconditioning system according to one embodiment of the present invention.

FIG. 9 shows a unit-by-unit air conditioning system according to this embodiment. In FIG. 9, the projection exposure apparatus shown in FIG. 1 is roughly divided into an illumination system unit 111, a reticle stage system unit 112, a projection optical system unit 113, a wafer stage system unit 114, and a wafer transfer system unit 115. More specifically, the illumination system unit 111 has a box-shaped casing accommodating the illumination optical system, shown in FIG. 1, which includes the excimer laser light source 2, the deflection mirror 3, the first illumination system 4, the switching revolver 5, the beam splitter 8, the integrator sensor 9, the second illumination system 10, the illumination field stop system 11, and the third illumination system 14. The reticle stage system unit 112 has a box-shaped casing accommodating the reticle support 18, the reticle stage 17 (including the moving mirror 19m), the reticle R, the optical path between the reticle R and the third illumination system 14, and the optical path between the reticle R and the projection optical system PL, which are shown in FIG. 1.

The projection optical system unit 113 is the projection optical system PL itself, which is shown in FIG. 2. An integral structure comprising the lens barrels 42, 44, 47 and 53 of the projection optical system PL is regarded as a casing, and the projection optical system unit 113 is arranged to be capable of controlling the flow of a gas between the lens units in this casing. The wafer stage system unit 114 has a box-shaped casing installed on the surface plate 23, shown in FIG. 1, to accommodate the wafer stage 22, the sample table 21 (including the moving mirror 24m and the fiducial mark member FM), the wafer holder 20, the wafer W, and the space portion between the projection optical system PL and the wafer W. The wafer transfer system unit 115 has a box-shaped casing accommodating the wafer transfer system, which is not shown in FIG. 1. The unit-by-unit air conditioning system according to this embodiment is arranged to be capable of supplying and discharging a predetermined gas for each of the illumination system unit 111, the reticle stage system unit 112, the projection optical system unit 113, the wafer stage system unit 114, and the wafer transfer system unit 115 independently of each other.

For this purpose, the unit-by-unit air conditioning system is provided with a first air conditioner 116 incorporating a dust-removing filer and an ozone-removing filter, and a second air conditioner 117 for circulating nitrogen ($N_2$) supplied from a nitrogen gas cylinder (not shown). The first air conditioner 116 removes, through the dust-removing filter, dust, etc. from air taken in from the outside of the chamber and air returned through a piping 118B, controls the temperature and flow rate of air having ozone removed therefrom through the ozone-removing filter, and supplies the ozone-free air, which has been subjected to the temperature and flow rate control, to a gas changeover device 120A through a piping 118A. The second air conditioner 117 controls the temperature and flow rate of a high-purity portion of nitrogen gas returned through pipings 119B and 133B, and circulates the high-purity portion of nitrogen gas through pipings 119A and 133A. Moreover, the second air conditioner 117 releases the low-purity portion of nitrogen gas through a piping 136 into the atmospheric air outside a clean room in which the chamber is installed. Further, the second air conditioner 117 supplements a deficiency of nitrogen gas with nitrogen gas from the nitrogen gas cylinder, that is, carries out purging for the deficiency.

The gas changeover device 120A supplies one of two different kinds of gas (i.e. ozone-free air prepared by the removal of ozone, and nitrogen gas) to a gas volume controller 122A through a piping 121A. The gas volume controller 122A supplies the gas to the inside of the illumination system unit 111 through a piping 123A and also supplies the gas to a gas volume controller 125A through a piping 124A. The gas volume controllers 122A and 125A (the same is the case with other gas volume controllers) each have the function of supplying the gas supplied thereto after controlling the temperature and flow rate (volume) thereof. The gas volume controller 125A supplies the gas to the inside of the reticle stage system unit 112 and a gas volume controller 128A through respective pipings 126A and 127A. The gas volume controller 128A supplies the gas to the inside of the wafer transfer system unit 115 through a piping 129A and also supplies the gas to the inside of the wafer stage system unit 114 through a piping 130A, a gas volume controller 131A and a piping 132A.

The gas circulating through the wafer transfer system unit 115 is discharged to a gas volume controller 128B through a piping 129B. The gas circulating through the wafer stage system unit 114 is discharged to the gas volume controller 128B through a piping 132B, a gas volume controller 131B and a piping 1301B. The gas from the gas volume controller 128B and the gas circulating through the reticle stage system unit 112 are discharged to a gas volume controller 125B through respective pipings 127B and 126B. Similarly, the gas from the gas volume controller 125B and the gas circulating through the illumination system unit 111 are discharged to a gas volume controller 122B through respective pipings 124B and 123B. The gas discharged from the gas volume controller 122B is supplied to a gas changeover device 120B through a piping 121B. When the supplied gas is air, the gas changeover device 120B returns it to the first air conditioner 116 through the piping 118B, whereas, when the supplied gas is nitrogen gas, the gas changeover device 120B returns it to the second air conditioner 117 through the piping 119B. Accordingly, either the ozone-free air or nitrogen gas is selectively supplied in common to the illumination system unit 111, the reticle stage system unit 112, the wafer stage system unit 114, and the wafer transfer system unit 115.

The second air conditioner 117 supplies nitrogen gas, whose temperature and flow rate have been controlled, to the projection optical system unit 113 through the piping 133A, a gas volume controller 134A and a piping 135A. The nitrogen gas circulating through the projection optical system unit 113 is returned to the second air conditioner 117 through a piping 135B, a gas volume controller 134B and the piping 133B. Accordingly, unlike the other units, the projection optical system unit 113 is constantly supplied with nitrogen gas only. The reason for this is that the projection optical system PL does not need particular maintenance. That is, the projection optical system unit 113 is arranged to maintain high hermeticity with respect to the outside, and constantly supplied with nitrogen gas.

In each of the gas volume controllers 134A and 134B, a temperature sensor and a purity sensor for measuring a degree of purity of nitrogen gas are installed. When the measured purity becomes below a predetermined allowable level, the second air conditioner 117 discharges the low-purity portion of nitrogen gas to the outside through the piping 136, and the deficiency of nitrogen gas is supplemented from the nitrogen gas cylinder.

In this embodiment, the excimer laser light source 2, e.g. KrF excimer laser or ArF excimer laser, is used as an exposure light source in FIG. 1. Regarding the absorptances of gases with respect to ArF excimer laser light, for example, ozone ($O_3$) shows the highest absorptance among the ordinary air components, and oxygen ($O_2$) as it changes into ozone shows the next highest absorptance. The absorption of ArF excimer laser light by nitrogen gas is so small as to be substantially negligible. Therefore, if a gas needs to be supplied through the optical path of illuminating light IL for exposure, nitrogen gas should preferably be supplied. By doing so, exposure for the wafer W can be performed most efficiently (with the highest transmittance).

Therefore, when an ordinary exposure sequence is to be carried out, the gas changeover device 120A in FIG. 9 supplies nitrogen gas from the second air conditioner 117 to the piping 121A. Consequently, nitrogen gas is supplied in common to the illumination system unit 111, the reticle stage system unit 112, the wafer stage system unit 114, and the wafer transfer system unit 115. Thus, transfer exposure is carried out for the wafer at a high illumination efficiency.

During maintenance or experimental exposure, the casing of a unit other than the projection optical system unit 113 may be opened by workmen; therefore, nitrogen gas cannot be supplied to any unit other than the projection optical system unit 113 from a safety standpoint. For this reasons, during maintenance or the like, the gas changeover device 120A in FIG. 9 supplies the ozone-free air from the first air conditioner 116 to the piping 121A. Consequently, the ozone-free air is supplied in common to the illumination system unit 111, the reticle stage system unit 112, the wafer stage system unit 114, and the wafer transfer system unit 115. Thus, workmen can safely perform a given operation. Moreover, what is supplied to the units other than the projection optical system unit 113 is air from which ozone has already been removed, and the ozone-free air shows a low absorptance with respect to the illuminating light IL for exposure. Therefore, there is only a slight reduction in the illumination efficiency.

In FIG. 9, concentration sensors 137A to 137D for nitrogen gas are installed in the illumination system unit 111, the reticle stage system unit 112, the wafer stage system unit 114 and the wafer transfer system unit 115 near the respective exhaust openings. Results of detection by the concentration sensors 137A to 137D are supplied to the main controller 7, shown in FIG. 1. When a gas to be supplied to these units has been switched to ozone-free air to perform maintenance or the like, the main controller 7 stops indicating permission to start an operation or locks the cover of the chamber in a closed state until the nitrogen concentration detected by the concentration sensors 137A to 137D reaches the level of nitrogen concentration in ordinary air. Thus, the operation can be safely conducted.

The arrangement may be such that a timer is connected to the main controller 7, and when a gas to be supplied to those units has been switched to ozone-free air to perform maintenance or the like, the main controller 7 gives the indication of permission to start an operation after a predetermined time has elapsed on the timer.

Since the absorptance varies according to the kind of gas in the optical path of illuminating light for exposure, the illuminance on the wafer surface for each gas has previously been stored in the main controller 7 as parameters, and when gases are switched from one to another, the parameters are changed correspondingly.

Although in the example shown in FIG. 9, a gas is supplied in parallel to the illumination system unit 111, the reticle stage system unit 112, the wafer stage system unit 114, and the wafer transfer system unit 115, the arrangement may be such that all or some of these units are connected in series by piping, and a selected gas is supplied in series to the connected units. With this arrangement, the piping arrangement is simplified.

Although ozone-free air can be obtained simply by passing air taken in from the outside (outside air) through the ozone-removing filter, nitrogen gas requires replacing the nitrogen gas cylinder when it is continuously used. Moreover, to perform maintenance after an exposure operation, nitrogen gas in the apparatus needs to be partially replaced by air. Therefore, the arrangement may be such that when the photoresist coated on the wafer requires a relatively large amount of exposure (i.e. the sensitivity is low), nitrogen gas is supplied to all the units, including the illumination system unit 111 through the wafer transfer system unit 115, to lower the rate of absorption of illuminating light with a view to increasing the throughput, whereas, when the photoresist requires a relatively small amount of exposure (i.e., the sensitivity is high), ozone-free air is supplied because a reduction in the light quantity due to absorption has substantially no effect on the throughput. Thus, the throughput and the running cost can be optimized as a whole by selecting a gas to be used according to the sensitivity conditions.

When the photoresist requires a relatively small amount of exposure as in the latter case, air taken in from the outside (outside air) may be used as it is in place of ozone-free air. It is also possible to use, in place of nitrogen gas, another gas (e.g. an Inert gas such as helium) showing a low absorptance with respect to KrF excimer laser light or ArF excimer laser light.

In this embodiment, the amount of illuminating light is controlled by utilizing the absorption of illuminating light by a gas. The light quantity control method according to this embodiment will be described below with reference to FIGS. 10a and 10b.

Figure 10A:
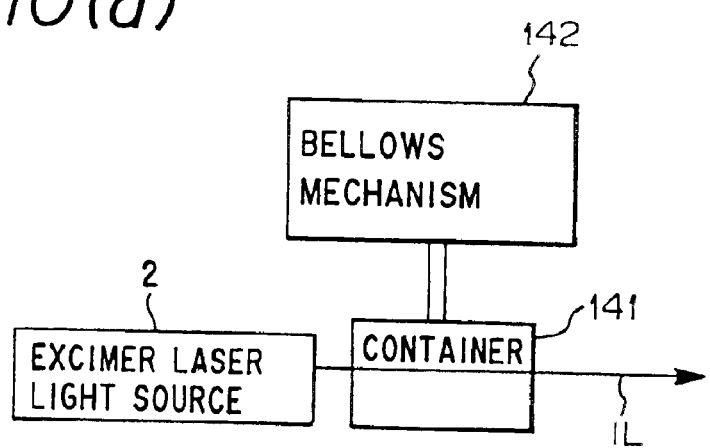
FIG. 10(a) is a block diagram showing an essential part of a system for controlling the quantity of illuminating light according to one embodiment of the present invention.

FIG. 10a shows the excimer laser light source 2 and a part of the first illumination system 4 (illustration of the deflection mirror 3 is omitted), which are shown in FIG. 1. In FIG. 10(a), illuminating light IL from the excimer laser light source 2 passes-through a container 141 which has light-transmitting windows provided in both sides thereof and which is supplied therein with a predetermined gas. In this embodiment, the container 141 is supplied with a gas (e.g. air) containing ozone ($O_3$) at a predetermined concentration through a piping (not shown). The container 141 is connected with a bellows mechanism 142. The amount of extension and contraction of the bellows mechanism 142 is controlled by the exposure controller 1 through the switching device 6, which are shown in FIG. 1, thereby enabling the pressure of the gas in the container 141, that is, the absorptance with respect to the illuminating light IL, to be continuously controlled in a predetermined range. More specifically, when it is desired to reduce the amount of illuminating light IL, the pressure of the gas in the container 141 Is increased to raise the absorptance of the gas. When the light quantity is desired to increase, the pressure of the gas in the container 141 is reduced as far as a level close to a vacuum. Consequently, the transmittance increases, and thus a high power can be obtained. This method enables the light quantity to be continuously varied and minimizes damage to the-control mechanism in contrast to a case where an ND filter is used.

It should be noted that the gas in the container 141 and the bellows mechanism 142 may be replaced in a predetermined proportion at a time because it is likely that the absorption of illuminating light by ozone will be saturated.

Figure 10B:
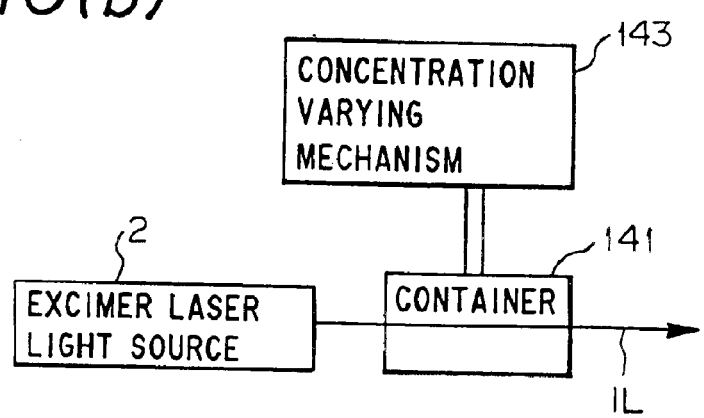
FIG. 10(b) is a block diagram showing a modification of the light quantity control system.

FIG. 10(b) shows an example of changing the concentration of ozone in the gas. In FIG. 10(b), illuminating light IL emitted from the excimer laser light source 2 passes through the container 141. In this example, the container 141 is supplied therein with a gas (e.g. air) wherein the ozone concentration is controlled in the range of from 0 to 100% through a concentration varying mechanism 143. To increase the amount of illuminating light IL, the ozone concentration is reduced toward 0%, whereas to reduce the amount of illuminating light IL, the ozone concentration is increased toward 100%, thereby enabling the amount of illuminating light IL to be continuously controlled. When this system is used, the container 141 must be cooled because of heat generation by absorption of illuminating light. However, the system shown in FIG. 10(b) is advantageous, as in the case of FIG. 10(a), in that the light quantity can be continuously varied, and that damage to the control mechanism is minimized in contrast to a case where an ND filter is used.

It should be noted that in the systems shown in FIGS. 10(a) and 10(b), a gas that absorbs excimer laser light, e.g. oxygen ($O_2$), may be used in place of ozone.

Next, other support mechanisms of the projection exposure apparatus according to the present invention, together with the structure of a laser interferometer for measuring stage coordinates, will be described with reference to FIGS. 11 and 12.

Figure 11:
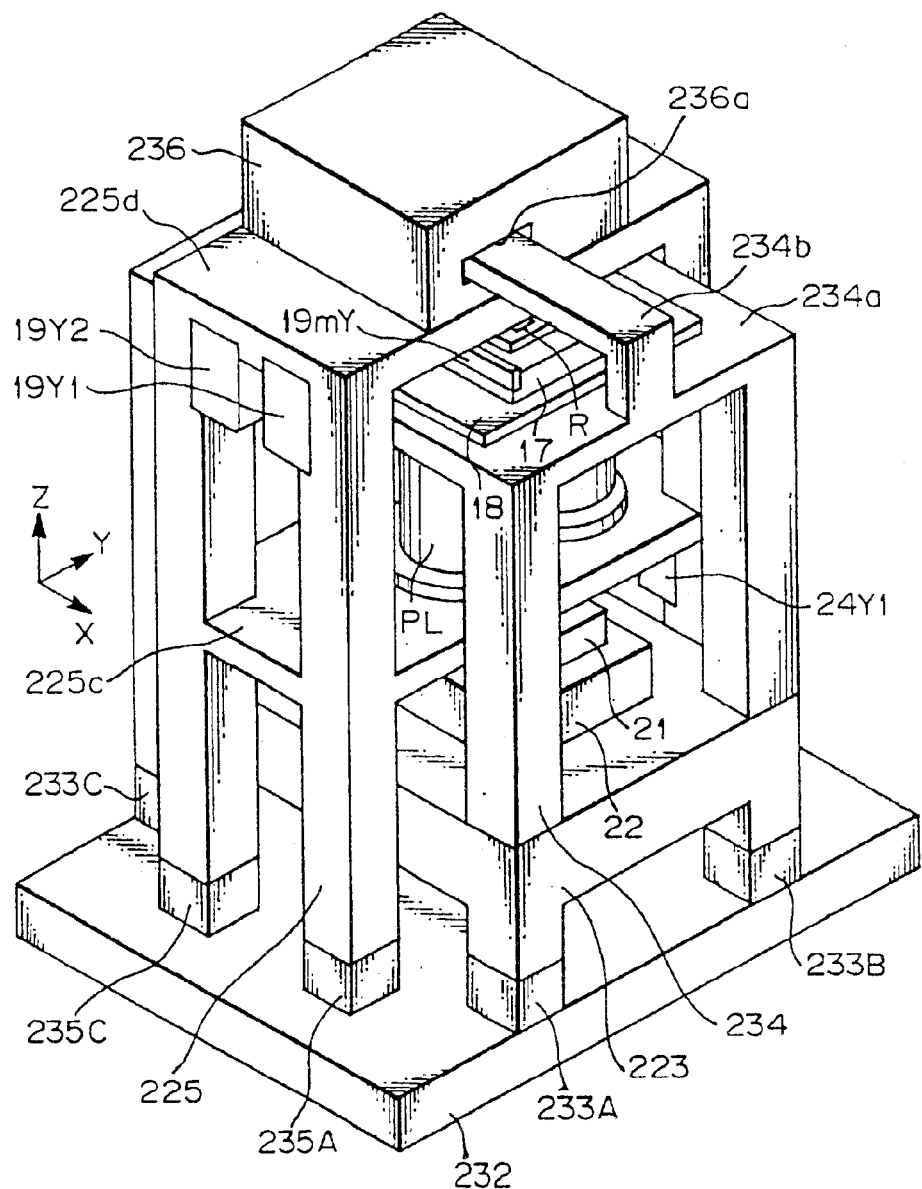
FIG. 11 is a perspective view showing a structure for supporting a mechanical part of the projection exposure apparatus in FIG. 1.

FIG. 11 schematically shows the arrangement of a mechanical part of the projection exposure apparatus according to this embodiment. In FIG. 11, a surface plate 223 for wafer stage is mounted over a large rectangular surface plate 232 through four vibration isolating mechanisms 233A to 233D (only 233A, 233B and 233C are shown in FIG. 11). A four-legged first column 234 is stood on the surface plate 223.

The wafer stage 22, the sample table 21, etc. (see FIG. 1) are mounted on the surface plate 223, and the reticle stage 17 and the reticle R are mounted through the reticle support 18 on an upper plate 234a of the first column 234. An L-shaped support member 234b projects from the upper surface of the upper plate 234a of the column 234, and the movable blind of the illumination field stop system 11 in the illumination optical system, shown in FIG. 1, is secured to the distal end portion of the support member 234b. That is, in this embodiment, all portions that move synchronously during scanning exposure are mounted directly or indirectly through the column 234 on the surface plate 223 supported by the vibration isolating mechanisms 233A to 233D.

A four-legged second column 225 is stood through four vibration isolating mechanisms 235A to 235D (only 235A and 235C are shown in FIG. 11) on the surface plate 232. The vibration isolating mechanisms 235A to 235D are provided outside the vibration isolating mechanisms 233A to 233D. An intermediate plate 225c of the column 225 extends through the space between the upper plate 234a of the column 234 and the upper surface of the surface plate 223. An upper plate 225d of the column 225 extends over the upper plate 234a of the column 234. The vibration isolating mechanisms 233A to 233D and 235A to 235D are each active-type vibration isolating mechanism including an air pad and an electromagnetic damper for vibration damping. The projection optical system PL is secured in the intermediate plate 225c of the second column 225 (see FIG. 2). A casing 236 of the illumination optical system is mounted on the upper plate 225d of the column 225. The illumination optical system including the excimer laser light source 2 through the third illumination system 14, shown in FIG. 1, is secured on the upper plate 225d within the casing 236. It should, however, be noted that only the movable blind of the illumination field stop system 11 in the illumination optical system is secured to the distal end portion of the support member 234b of the column 234, which is inserted into the casing 236 through a window 236a. In other words, portions that are stationary during scanning exposure are mounted on the column 225 supported by the vibration isolating mechanisms 235A to 235D.

In this embodiment, the vibration isolating mechanisms 235A to 235D, which support the stationary members, mainly effects control for damping vibrations from the floor. The vibration isolating mechanisms 233A to 233D, which support the members movable during scanning exposure, effects control for damping vibrations from the floor and for absorbing reaction of the reticle stage 17 and the wafer stage 22 during scanning exposure. In other words, the projection optical system PL and the illumination optical system in the casing 236 have no heavyweight member driven at a high acceleration. Therefore, the vibration isolating mechanisms 235A to 235D are each formed by combining together an air pad for eliminating vibrations due to high-frequency disturbance from the floor and an electromagnetic damper for eliminating low-frequency vibrations resulting therefrom.

The stage system, which includes the wafer stage 22 and the reticle stage 17, includes heavyweight-members driven at a high acceleration. Therefore, the vibration isolating mechanisms 233A to 233D are each provided with an electromagnetic damper having a sufficiently large power to prevent reaction of the heavyweight members. The wafer stage 22 and the reticle stage 17 are each supported with respect to the surface plate 223 directly or indirectly through an air guide and driven by a linear motor. Therefore, although the surface plate 223 itself vibrates in response to vibrations due to high-frequency disturbance from the floor, it is unlikely that the high-frequency disturbance will be transmitted to the stages 17 and 22. Accordingly, the air pads in the vibration isolating mechanisms 233A to 233D need not be of particularly high accuracy. Thus, according to this embodiment, portions that move synchronously and portions that are stationary during scanning exposure are supported by different vibration isolating mechanisms. Therefore, the vibration isolating mechanisms can be optimized according to use application, and a pattern on a reticle can be transferred onto a wafer with high overlay accuracy.

In FIG. 1, the wafer-side laser interferometer 24 represents laser interferometers for a plurality of axes in each of the directions X and Y. Similarly, the reticle-side laser interferometer 19 represents laser interferometers for a plurality of axes in each of the directions X and Y. The moving mirrors 19m and 24m also each represent moving mirrors for the X- and Y-axes. FIG. 11 shows laser interferometers 19Y1 and 19Y2 for two axes in the Y-axis direction (scanning direction) in the reticle-side laser interferometer 19, and a laser interferometer 24Y1 for one axis in the Y-axis direction in the wafer-side laser interferometer 24, together with a reticle-side moving mirror 19mY for the Y-axis.

In FIG. 11, the wafer-side laser interferometer 24Y1 for the Y-axis is secured to one leg portion of the column 225. The reticle-side laser interferometers 19Y1 and 19Y2 for the Y-axis are secured between the upper plate 225d and leg portions of the column 225. Similarly, the other laser interferometers for the Y-axis are also secured to the column 225. Thus, all the laser interferometers for the Y-axis, which is the scanning direction in this embodiment, are mounted on the column 225, which supports stationary members. In FIG. 11, it seems difficult to mount the laser interferometers for the X-axis on the column 25. The laser interferometers for the X-axis may be mounted on a frame or the like (not shown) provided on a side of the column 225.

Figure 12:
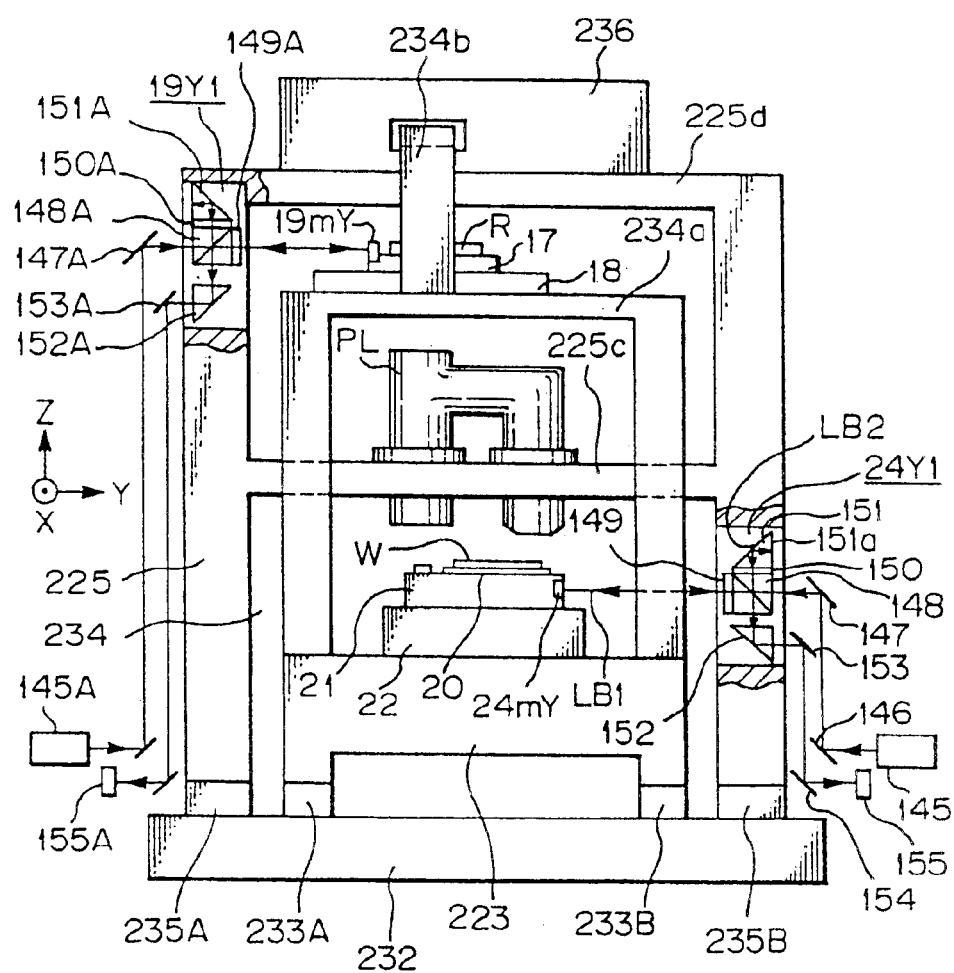
FIG. 12 is a partly-sectioned side view of the support structure shown in FIG. 11 as viewed in the direction –X.

FIG. 12 is a partly-sectioned side view of the support structure shown in FIG. 11 as viewed in the direction −X. In FIG. 12, the wafer-side laser interferometer 24Y1 is secured in a leg portion of the column 225. An external laser light source 145 emits a laser beam containing components which are different in frequency and whose polarization directions perpendicularly intersect each other. The laser beam is reflected successively by mirrors 146 and 147 to enter a polarization beam splitter (hereinafter referred to as "PBS") 148 in the laser interferometer 24Y1. At this time, a laser beam LB1 of p-polarized light component passes through the PBS 148 and then passes through a quarter-wave plate 149 to travel toward the moving mirror 24mY for the Y-axis, which is mounted on a side of the sample table 21. The laser beam LB1 reflected by the moving mirror 24mY passes through the quarter-wave plate 149 and is reflected by the PBS 148 as s-polarized light.

Meanwhile, a laser beam LB2 of s-polarized light component in the laser beam entering the PBS 148 passes through a quarter-wave plate 150 and is reflected by a reflecting surface 151a of a prism-type mirror 151. Thereafter, the reflected laser beam LB2 passes through the quarter-wave plate 150 and then passes through the PBS 148 as p-polarized light. The laser beams LB1 and LB2 having different frequencies are coaxially combined together by the PBS 148 and reflected by a prism-type mirror 152 to emanate from the laser interferometer 24Y1 to the outside thereof. The emanating laser beams LB1 and LB2 are reflected successively by mirrors 153 and 154 and received by a receiver 155, e.g. a photodiode. In this case, the mirror 151 operates as a reference mirror. A photoelectrically converted signal from the receiver 155 is a beat signal having a predetermined frequency. As the sample table 21 (the moving mirror 24mY) moves in the direction Y, the phase or frequency of the beat signal changes. By utilizing this fact, the Y-coordinate of the sample table 21 is measured with respect to the reference mirror (i.e. the mirror 151).

Similarly, the reticle-side laser interferometer 19Y1 for the Y-axis is secured between the upper plate 225d and leg portion of the column 225. The laser interferometer 19Y1 includes a PBS 148A, quarter-wave plates 149A and 150A, and mirrors 151A and 152A as in the case of the laser interferometer 24Y1. The mirror 151A having a prism-type reflecting surface operates as a reference mirror. A laser beam from an external laser light source 145A is led to the laser interferometer 19Y1 via a mirror 147A, etc. The laser beam from the laser interferometer 19Y1 is received by a receiver 155A via a mirror 153A, etc. The position of the reticle stage 17 (i.e. the moving mirror 19mY) is measured on the basis of a beat signal from the receiver 155A with respect to the reference mirror.

Thus, according to this embodiment, the laser interferometers 24Y1 and 19Y1, together with the mirrors 151 and 151A serving as reference mirrors, are mounted on the column 225, which supports stationary members such as the projection optical system PL. This makes it possible to realize an interferometer monitor system that is not affected by vibrations from the floor. In this regard, it is also conceivable to provide the laser interferometers 24Y1 and 19Y1 on the column 234, which supports movable portions. With this method, it is easy to synchronize the reticle stage 17 and the wafer stage 22 with each other on the basis of measured values by the laser interferometers. However, since the column 234 itself is distorted by acceleration due to the movement of the stage system, the confidence as to whether the reticle R and the wafer W are accurately aligned with each other is not always high.

In this embodiment, the laser interferometers 24Y1 and 19Y1, the other laser interferometers, and the projection optical system PL are secured to the column 225 different from the column 234, which may be distorted by the acceleration of the stage system. Accordingly, the position of each of the reticle and wafer stages 17 and 22 can be measured with high accuracy, and consequently, the accuracy of alignment of the reticle R and the wafer W increases.

In the foregoing embodiment, the mirrors 151 and 151A, which operate as reference mirrors of the laser interferometers, are provided on the column 225. However, the column 225 may expand or contract with changes in temperature, etc. In such a case, mirrors serving as reference mirrors may be provided on a side of the projection optical system PL. In the foregoing embodiment, the projection optical system PL and the stage system are provided on the independent columns 225 and 234, respectively. Therefore, it is possible to combine the constituent portions of the projection exposure apparatus after each of them has been adjusted with high accuracy, Thus, the period of time required to produce the apparatus is advantageously shortened. In this case, however, it is necessary to assemble the components by properly detaching and attaching a part of the stage-side column 234, which does not require such rigorous accuracy as in the column 225.

In the foregoing embodiment, the projection exposure apparatus has a system in which the projection exposure apparatus is divided into a plurality of units, and gases are replaced independently for each unit as shown in FIG. 9, and a system in which the intensity of illuminating light for exposure is controlled according to the absorptance of a gas as shown in FIGS. 10(a) and 10(b). These systems are applicable not only to scanning projection exposure apparatuses but also to static exposure type (one-shot exposure type) projection exposure apparatuses such as steppers.

According to the projection exposure apparatus having the above-described structure, there is provided a gas supply device for selectively supplying a gas into each of a plurality casings accommodating an illumination optical system, a projection optical system and a substrate stage of the projection exposure apparatus separately from each other. Therefore, during ordinary exposure, for example, a gas showing a low absorptance with respect to illuminating light for exposure is supplied. To perform experimental exposure in a state where workmen are present near the apparatus during maintenance or the like; for example, a gas showing a low absorptance with respect to illuminating light for exposure is supplied into the projection optical system, whereas a gas (e.g. air) that is harmless to workmen is supplied to the other portions. Thus, during exposure, the absorption of illuminating light for exposure is minimized, and during maintenance or the like, the safety of workers can be ensured.

In a case where the plurality of different kinds of gas used in the apparatus are those selected from the group consisting of nitrogen, air, and air having ozone removed therefrom, nitrogen or air having ozone removed therefrom is used during ordinary exposure. By doing so, it is possible to minimize the absorption of illuminating light for exposure particularly when the illuminating light is ultraviolet light. During maintenance or the like, air or air having ozone removed therefrom is used to thereby ensure the safety of workmen.

The gas supply device may be provided with a device for confirming that a gas in a casing to be supplied with another gas has been substantially completely replaced by the substituting gas. In this case, when the gas in the casing is changed over from a gas that only slightly absorbs illuminating light to a gas harmless to workmen, for example, it is possible to confirm that the gas in the casing has been substantially completely replaced by the harmless gas. Accordingly, the safety of workmen improves advantageously. Examples of the confirming device include a gas. concentration sensor, a timer, etc. When a concentration sensor is used, for example, there is no useless waiting time, and the safety is improved in comparison to a case where a timer is used.

According to another aspect of the present invention, the projection exposure apparatus uses a laser light source that oscillates at a wavelength in the ultraviolet region or shorter wavelength region as an exposure light source. The apparatus has a casing with light-transmitting windows disposed in the optical path of the illuminating light between the exposure light source and the photosensitive substrate. The apparatus further has a gas controller that supplies into the casing a gas in which the amount of ozone per unit volume is variable. The illuminance of illuminating light on the photosensitive substrate, which is emitted from the light source and applied to the photosensitive substrate, is controlled by changing the amount of ozone in the gas supplied into the casing from the gas controller.

Accordingly, the illuminance of illuminating light for exposure is continuously controlled without damaging any optical member by changing the amount of ozone per unit volume in the gas in a predetermined casing. Since ozone absorbs ultraviolet light, when ultraviolet light is used as illuminating light for exposure, the amount of ultraviolet light can be accurately controlled at all times.

According to the above-described projection exposure apparatus, a movable part that moves synchronously with scanning exposure and a stationary part that is not synchronous with scanning exposure are secured to different anti-vibration plates. Therefore, the projection optical system is not affected by vibrations due to synchronous scanning of a mask (reticle) and a photosensitive substrate (wafer), and thus favorable image-forming characteristics can be obtained.

In this case, the projection exposure apparatus may be provided with an interferometer to measure the position of the mask-side stage or the substrate-side stage. The interferometer has a moving mirror mounted on the mask-side stage or the substrate-side stage; a reference mirror mounted on the antivibration plate to which the stationary part is secured; and an interferometer body part that detects a relative displacement between the moving mirror and the reference mirror by using a light beam. With this arrangement, since the reference mirror is not affected by vibrations of the stage system, it is possible to improve controllability (control accuracy, etc.) for the position and speed of the stage system during scanning exposure.

Next, an embodiment of the projection exposure apparatus according to another aspect of the present invention will be described with reference to FIGS. 13 to 21. In this embodiment, the present invention is applied to a step-and-scan type projection exposure apparatus.

Figure 13:
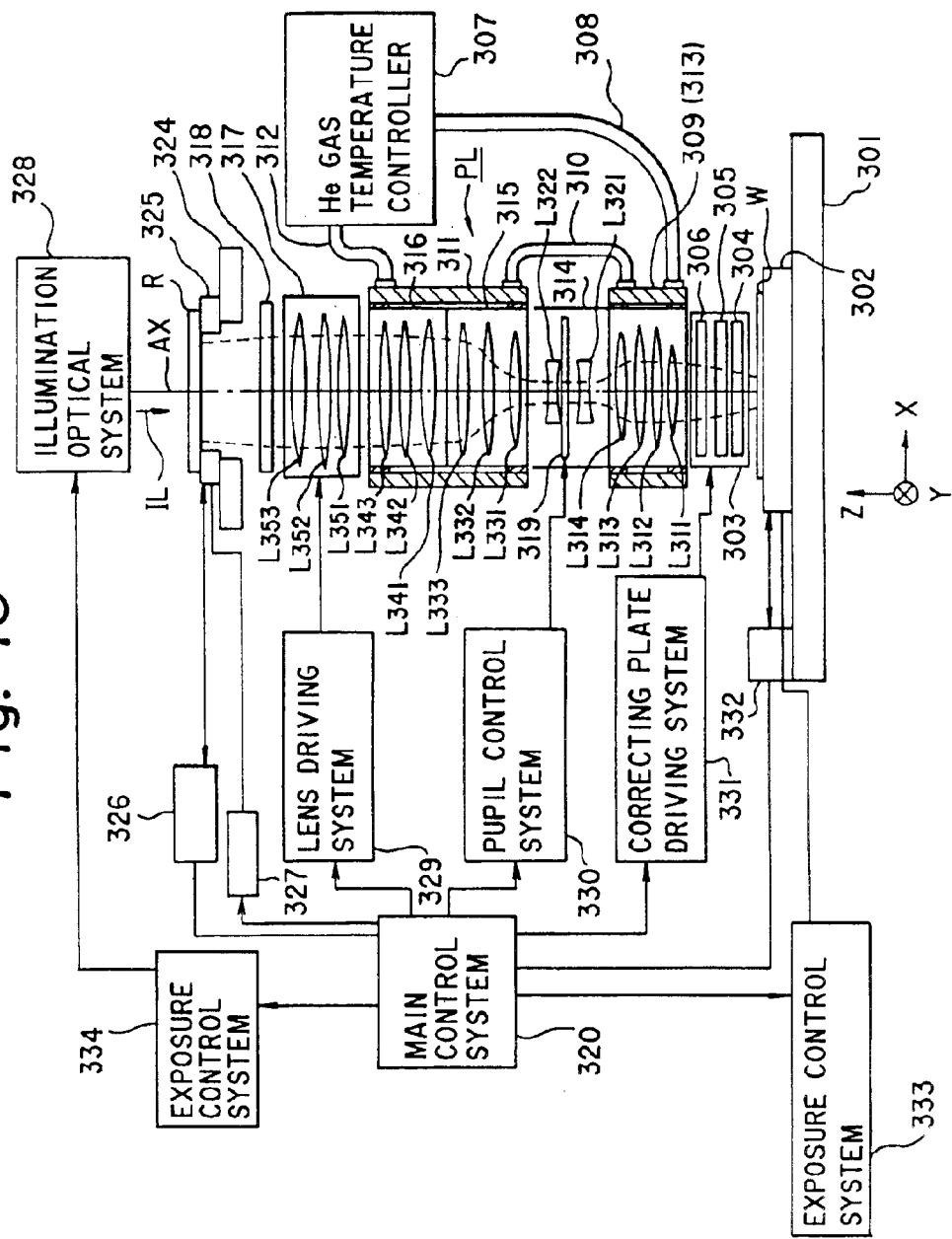
FIG. 13 is a partly-sectioned block diagram showing one embodiment of the projection exposure apparatus according to the present invention.

FIG. 13 shows a projection exposure apparatus used in this embodiment. In FIG. 13, an illumination optical system 328 includes an ArF excimer laser light source for exposure, an attenuator, a fly's-eye lens, an illumination system aperture stop, a field stop (reticle blind), a condenser lens system, and so forth. The light source emits ultraviolet pulsed light of wavelength 193 nm as exposure light. The attenuator controls the intensity of the exposure light. The fly's eye lens uniformizes the illuminance distribution of the exposure light. The field stop defines a slit-shaped illumination area on a reticle R. To carry out exposure, the illumination optical system 328 illuminates the slit-shaped illumination area on the reticle R by exposure light IL having a predetermined coherence factor (σ value) with a uniform illuminance distribution.

Under the exposure light IL, an image of a pattern on the reticle R within the illumination area is projected onto a slit-shaped exposure area on a wafer W within a shot area to be exposed through a projection optical system PL with a projection magnification β (β is ¼ or ⅕, for example) which is telecentric on both sides (or on the wafer side only). The wafer W has a resist coated thereon. The illumination optical system 328 is provided therein with a measuring system that monitors indirectly the amount of exposure light applied to the resist. An exposure control system 334 controls the attenuation index of the attenuator in the illumination optical system 328 on the basis of the result of measurement by the measuring system and under the control of a main control system 320. The main control system 320 consists essentially of a computer that controls operations of the whole apparatus. In this way, the exposure control system 334 uniformizes the illuminance of exposure light on the resist.

In the following description, a Z-axis is taken in a direction parallel to an optical axis AX of the projection optical system PL. A Y-axis is taken in a direction parallel to the scanning direction (direction perpendicular to the plane of FIG. 13) of the reticle R and wafer W during scanning exposure in a plane perpendicular to the Z-axis. An X-axis is taken in a direction parallel to a non-scanning direction perpendicular to the scanning direction. Under these conditions, the reticle R is held by vacuum on a reticle stage 325. The reticle stage 325 is supported through an air bearing to levitate over a reticle base 324. The reticle stage 325 is continuously movable in the direction Y by a driving mechanism (not shown), e.g. a linear motor. The reticle stage 325 is also finely movable in the directions X and Y and also in the direction θ (rotational direction). The X–and Y-coordinates and rotational angle of the reticle stage 325 are measured by a reticle-side laser interferometer 326. The measured values are supplied to the main control system 320. The main control system 320 controls the operation of the reticle stage 325 through a reticle stage driving system 327 on the basis of the measured values and the position of a wafer stage (described later).

The wafer W is held by vacuum on a wafer holder (not shown). The wafer holder is fixed on a wafer stage 302. The wafer stage 302 is supported through an air bearing to levitate over a surface plate 301. The wafer stage 302 controls the position of the wafer W with 6 degrees of freedom, including the positions (rotational angle) in the directions X, Y and θ, the position in the direction Z, and two-dimensional tilt angles. The X–and Y-coordinates and rotational angle of the wafer stage 302 are measured by a wafer-side laser interferometer 332. The measured values are supplied to the main control system 320. The main control system 320 controls scanning and stepping operations of the wafer stage 302 through a wafer stage driving system 333 on the basis of the measured values and the position of the reticle stage 325. Moreover, the wafer stage driving system 333 controls the tilt angles-and so forth of the wafer stage 302 on the basis of a value measured with an autofocusing sensor (not shown) so that the surface of the wafer W is made coincident with the image plane of the projection optical system PL by an autofocusing system.

During scanning exposure for the wafer W, the reticle R is moved relative to the slit-shaped illumination area (i.e. relative to the projection optical system PL) in the direction +Y (or −Y) at speed $V_R$. In synchronism with the movement of the reticle R, one shot area on the wafer W is moved relative to the slit-shaped exposure area in the direction −Y (or +Y) at speed $\beta \cdot V_R$, thereby sequentially transferring the pattern image of the reticle R onto the shot area. Upon completion of the exposure for the shot area, the wafer stage 302 is stepped to move the next shot area on the wafer W to an approach start position to carry out scanning exposure. This operation is repeated in the step-and-scan manner. Thus, exposure is carried out for each shot area on the wafer W. During the scanning exposure, exposure control is performed such that while each point on the wafer crosses the slit-shaped exposure area, a predetermined number of pulses of exposure light IL (ultraviolet pulsed light in this case) are applied and, at the same time, the illuminance of exposure light IL is kept uniform.

Next, the arrangement of the projection optical system PL in this embodiment will be described in detail. In FIG. 13, the projection optical system PL is formed by placing the following constituent elements in order from the reticle R toward the wafer W: a distortion correcting plate 318; an image-forming characteristic varying unit 317 including lenses $L_{353}$ to $L_{351}$; a first aspherical unit 316 including lenses $L_{343}$ to $L_{341}$; a second aspherical unit 315 including lenses $L_{333}$ to $L_{341}$; a pupil varying unit 314 having a lens $L_{322}$, a variable aperture stop 319 and a lens $L_{321}$; a third aspherical unit 313 including lenses $L_{314}$ to $L_{311}$; and an image-forming characteristic varying unit 303 including aberration correcting plates 306 to 304. It should be noted that although the projection optical system PL in this embodiment is formed from only refracting optical systems, it is also possible to use a projection optical system consisting essentially of a catadioptric system such as that disclosed in Japanese Patent Application No. 8-45796, for example. A projection optical system using a catadioptric system also comprises a distortion correcting plate, an image-forming characteristic varying unit, an aspherical unit, a pupil varying unit and so forth as in the case of the projection optical system PL. Accordingly, such a projection optical system can be handled in the same way as in this embodiment.

In the projection optical system PL in this embodiment, the distortion correcting plate 318, which is located directly below the reticle R, corrects a residual distortion after assembly of each lens unit below it. The distortion correcting plate 38 is capable of switching according to illumination conditions and so forth. The lenses $L_{353}$ to $L_{351}$, which form the image-forming characteristic varying unit 317, are each formed from a spherical lens. The lenses $L_{353}$ to $L_{351}$ can be moved and tilted in the directions X, Y and Z independently of each other by finely moving respective lens frames (not shown) through control elements, e.g. piezoelectric elements. By driving each lens of the image-forming characteristic varying unit 317, mainly the magnification of the projected image (including higher-order components) and curvature of field can be corrected. A lens driving system 329 sets a position and tilt angle for each of the lenses $L_{353}$ to $L_{351}$ according to a correction quantity given by an instruction from the main control system 320.

The lenses $L_{353}$ to $L_{351}$ in the image-forming characteristic varying unit 317 are installed in an atmosphere filled with nitrogen gas ($N_2$) to reduce the absorption of ArF excimer laser light (for example) by oxygen. The lens driving-system 329 also incorporates a mechanism for purging with nitrogen gas. The gas pressure, temperature and humidity of the atmosphere filled with nitrogen gas are substantially the same as the conditions of air (outside air) outside a chamber (not shown) enclosing the projection exposure apparatus according to this embodiment. In other words, the gas pressure and other conditions of the atmosphere where the lenses $L_{353}$ to $L_{351}$ are installed are substantially equal to the atmospheric conditions in a case where the image-forming characteristic varying unit 317 is open to the outside air. It should be noted that dry air may be used as a purge gas in place of nitrogen-gas.

Figure 14A:
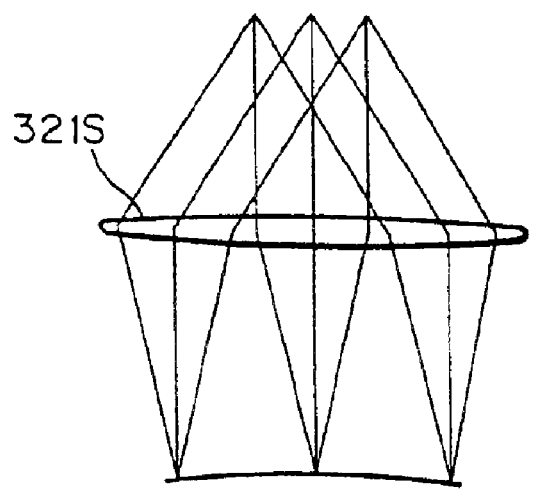
FIG. 14(a) is a diagram showing an image-forming light beam passing through a spherical lens.
Figure 14B:
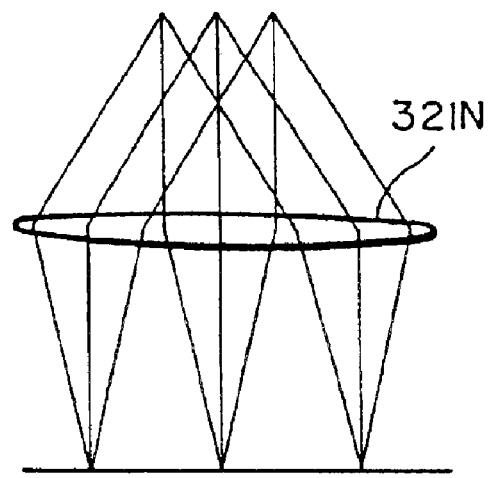
FIG. 14(b) is a diagram showing an image-forming light beam passing through an aspherical lens.

At least one of the lenses $L_{343}$ to $L_{341}$ forming the aspherical unit 316 is an aspherical lens. At least one of the lenses $L_{333}$ to $L_{331}$ forming the aspherical unit 315 is also an aspherical lens. Furthermore, at least one of the lenses $L_{313}$ to $L_{311}$ forming the aspherical unit 313 is an aspherical lens. Let us explain the effect of an aspherical lens with reference to FIGS. 14a and 14b. As shown in FIG. 14(a), when a spherical lens 321S is used, aberration such as curvature of field may remain. However, the aberration can be corrected by using an aspherical lens 321N as shown in FIG. 14(b). Therefore, it becomes easy to design a projection optical system.

Referring to FIG. 13, the projection optical system PL in this embodiment in particular is a high-NA optical system having as high a numerical aperture NA as about 0.7 or more. By using aspherical lenses, the number of lenses needed is reduced despite a high-NA optical system, and the overall distance OWD (in this case, the distance between the reticle R and the wafer W) is shortened. The lens diameter of each lens also decreases. In this case, assuming that the number of lenses forming the projection optical system PL is N (N=2, 3, 4, ...), about N/4 of the total number of lenses are formed from aspherical lenses. By doing so, the projection optical system PL can be formed without making it so large in size even if the numerical aperture NA is of the order of 0.7 or more.

Furthermore, the projection exposure apparatus according to this embodiment is of the step-and-scan type, and it uses an elongate area extending substantially diametrically in the effective field of the projection optical system PL. Therefore, when the exposure field (shot area) has the same width, the projection optical system can be made compact in comparison to a one-shot transfer type projection exposure apparatus (stepper).

The variable aperture stop 319 includes a variable aperture stop member disposed in the vicinity of an optical Fourier transform plane (pupil plane) with respect to the pattern surface of the reticle R. The variable aperture stop 319 further includes a mechanism for controlling the aperture shape of the variable aperture stop member. The numerical aperture NA is variable within a predetermined range by the variable aperture stop member. Furthermore, the illumination optical system 328 in this embodiment is capable of controlling the σ value and shape of the illumination system aperture stop (e.g. an annular zone-shaped stop or a modified stop) according to the resolution required for the pattern to be exposed and the shape of the pattern to be exposed (line-and-space pattern, contact hole, isolated line pattern, or isolated space pattern). Therefore, when the σ value or shape of the illumination system aperture stop is changed, a pupil filter, e.g. a light-blocking filter or a phase contrast filter, can be loaded into or unloaded from the aperture of the variable aperture stop member of the variable aperture stop 319 according to the change in the illumination system aperture stop. A pupil control system 330 controls the aperture diameter of the variable aperture stop 319 and the loading or unloading of a pupil filter under the control of the main control system 320.

Thus, when a pupil filter is used, the size of the pupil varying unit 314 increases. Therefore, the pupil varying unit 314 is installed in an atmosphere filled with nitrogen gas ($N_2$) or dry air as in the case of the image-forming characteristic varying unit 317. The pupil control system 330 incorporates a mechanism for purging with nitrogen gas or dry air. The gas pressure, temperature and humidity of the atmosphere where the pupil varying unit 314 is installed are also substantially the same as the atmospheric conditions in a case where the pupil varying, unit 314 is opened to the outside air surrounding the chamber.

The image-forming characteristic varying unit 303 includes a coma correcting plate 306, astigmatism correcting plates 304 and 305, and driving elements for controlling the positions and tilt angles of predetermined correcting plates. The coma correcting plate 306 is a plate having a curvature in one direction, which is inserted in a position corresponding to image-forming characteristics when the projection optical system PL is assembled. The astigmatism correcting plates 304 and 305 are parallel plane plates capable of being finely moved in the directions X and Y and tilted independently of each other. A correcting plate driving system 331 controls the positions and tilt angles of the correcting plates 304 and 305 according to information concerning illumination conditions from the main control system 320, thereby correcting a variation in astigmatism when illumination conditions (usually a small σ value, annular zone illumination, modified illumination, etc.) are changed.

The correcting plates 304 to 306 in the image-forming characteristic varying unit 303 are also installed in an atmosphere filled with nitrogen gas ($N_2$) or dry air. The correcting plate driving mechanism 331 incorporates a mechanism for purging with nitrogen gas or dry air. The gas pressure, temperature, etc. of the atmosphere where the correcting plates 304 to 306 are installed are also substantially the same as the atmospheric conditions in a case where the image-forming characteristic varying unit 303 is open to the outside air surrounding the chamber.

The projection optical system PL in this embodiment incorporates the aspherical units 313, 315 and 316 as stated above. In a projection optical system using an aspherical member (an optical member having an aspherical surface) such as an aspherical lens or an aspherical mirror, image-forming characteristics such as distortion degrade to a relatively large extent when the refractive index of a gas contacting the aspherical member changes only slightly with changes in the pressure, temperature, humidity, etc. of the gas in response to variations in the atmospheric conditions. Therefore, the aspherical units 313, 315 and 316 in this embodiment are provided with a mechanism for stabilizing the pressure, temperature, humidity, etc. of the gas contacting the lenses therein independently of changes in the atmospheric pressure, etc. of the outside air surrounding the chamber.

More specifically, the first and second aspherical units 316 and 315 are accommodated in series in a first cylindrical purge unit 311. The third aspherical unit 313 is arranged to serve also as a second cylindrical purge unit 309. A He gas temperature controller 307 is installed outside the projection optical system PL. The He gas temperature controller 307 supplies helium gas (He) through a supply tube 312 and a through-hole in the side of the upper part of the purge unit 311 into a space between the purge unit 311 and each lens of the aspherical units 316 and 315. Assuming that temperature-controlled air around the projection optical system PL in this embodiment is a reference gas, the average pressure and average temperature of the reference gas are approximately 1 atmosphere and 20° C. to 23° C., respectively. The pressure and temperature of helium gas supplied into the purge unit 311 are set equal to the average pressure and average temperature of the reference gas. Helium gas is inert and will not be excited by absorbing ArF excimer laser light. Therefore, helium gas has the advantage that the transmittance for exposure light IL is high. In particular, the third aspherical unit contains lenses having a large curvature to achieve high NA and has the possibility that the transmittance will change with a slight change in the atmospheric conditions on account of the characteristics of the lens coating. The supply of helium gas is also intended to prevent the occurrence of such a change In transmittance.

Helium gas flowing through the purge unit 311 flows out of it through a through-hole provided in the side of the lower part of the purge unit 311. Then, helium gas flows through an intermediate tube 310 and a through-hole provided in the side of the upper part of the purge unit 309 and is supplied to the space between the lenses in the purge unit 309 (aspherical unit 313). Helium gas flowing through the purge unit 309 returns to the H gas temperature controller 307 through a through-hole provided in the side of the lower part of the purge unit 309 and further through a discharge tube 308. In this embodiment, helium gas, which is costly, is recirculated through the aspherical units 316, 315 and 313 so as not to waste it. Consequently, helium gas raised in temperature by absorbing heat from the lenses and lens barrels heated by continuous application of exposure light IL is returned to the He gas temperature controller 307. In the He gas temperature controller 307, the temperature of the returned helium gas is lowered to a target value. Then, the helium gas is supplied through the supply tube 312. It should, however, be noted that helium gas is likely to leak through a small gap or the like at a joint of the supply tube 312 or the discharge tube 308. Therefore, the He gas temperature controller 307 replenishes helium gas appropriately to maintain the helium gas pressure at the average pressure of the reference gas.

In this case, because the thermal conductivity of helium gas at ordinary temperatures is more than 5 times higher than that of oxygen gas and nitrogen gas, the amount of temperature change of the lenses in the aspherical units 316, 315 and 313 becomes smaller. Consequently, the amount of temperature change of helium gas flowing around the lenses is also smaller than the amount of temperature change of the gas around the other spherical lenses. Moreover, helium gas has a low molecular weight and a small specific gravity in comparison to oxygen gas and nitrogen gas. Therefore, the amount of change in the refractive index of helium gas when the atmospheric pressure changes is relatively small. In addition, the amount of change in the pressure of helium gas in the embodiment is held lower than the amount of change in the pressure of the gas contacting the other spherical lenses. Accordingly, the amount of change in the refractive index of the gas (helium gas) contacting the aspherical lenses in the projection optical system PL is considerably smaller than the amount of change in the refractive index of the gas contacting the other spherical lenses. Thus, the degradation of the image-forming characteristics due to the aspherical lenses is suppressed to such an extent that it can be almost ignored.

Next, the arrangements of the aspherical unit 313 and the corresponding purge unit 309, which form the projection optical system PL shown in FIG. 13, will be described in detail with reference to FIGS. 15($a$), 15($b$), 15($c$), 16($a$) and 16($b$).

FIG. 15($a$) is a sectional view showing a lens frame 335D for retaining the lens $L_{314}$ in the aspherical unit 313 shown in FIG. 13. FIG. 15($b$) is a bottom view of the lens frame 335D. As shown in FIG. 15($a$), the polished lens $L_{314}$ is retained in the ring-shaped lens frame 335 in a three-point support fashion by projections 336D, 336E and 336F. The outer periphery of the lens $L_{314}$ is polished so that the lens center is coincident with the center of the lens frame 335D. During the polishing process, the tilt angle of the lens $L_{314}$ is so set that the lens $L_{314}$ is parallel to the entrance and exit planes of the lens frame 335D. Furthermore, adjusting screws 336A to 336C capable of adjusting the respective heights are installed on the bottom of the lens frame 335D at three positions spaced at equal angles. The height of a projecting portion of each of the adjusting screws 336A to 336C is so adjusted that when the lens frame 335D is installed in a certain plane., the distance from the plane to the center of the lens. $L_{314}$ in the direction of the thickness thereof coincides with the design value.

FIG. 15($c$) shows a state where the lenses $L_{311}$ to $L_{314}$ in the aspherical unit 313 in FIG. 13 are accommodated in the respective lens frames 335A to 335D, which are stacked on top of another. In FIG. 15($c$), the lens frames 335A to 335C each have an arrangement similar to that of the lens frame 335D. However, the lowermost lens frame 335A is retained by height adjusting screws 313A, 313B and 313C for three-point support provided on the aspherical unit 313. In this case, the load of the lens frames 335A to 335D is applied dispersedly for each unit. Therefore, such a lens support system for each unit as in this embodiment is referred to as "split lens barrel system". According to this system, the lens frames 335A to 335D, which have been adjusted individually, are successively stacked such that the respective optical axes are coincident with each other. Thus, the aspherical unit 313 in FIG. 13 is formed. In this case, the lens frame 335A is retained in a three-point support fashion by the aspherical unit 313. Moreover, each pair of adjacent lens frames 335A to 335D are in contact with each other at three points. With such an arrangement, when it is necessary to finely move each of the lens frames 335A to 335D according to the overall image-forming performance of the projection optical system after it has been assembled, there is no variation in the amount of deflection of the lenses in the lens frames 335A to 335D due to their own weights (such a variation may occur if the contact points change), and adjustment can be performed for each unit independently.

Figures 16A, 16B:
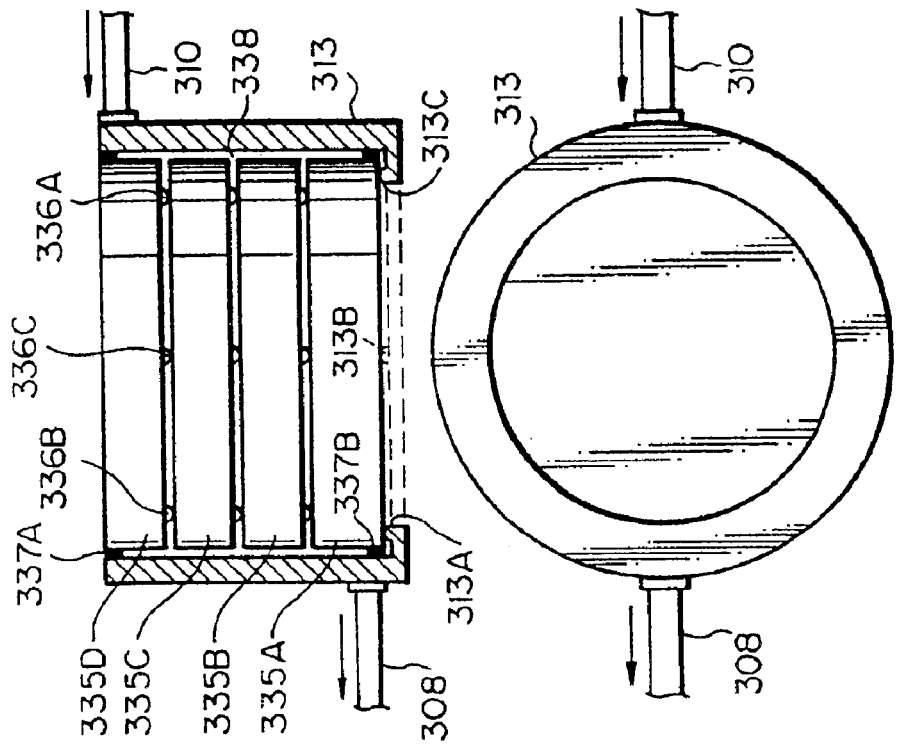
FIG. 16(a) is a sectional view showing an aspherical unit and a purge unit.
FIG. 16(b) is a plan view of the arrangement shown in FIG. 16(a).

In this embodiment, there is a gap due to the adjusting screws 336A and 336C between each pair of adjacent lens frames 335A to 335D because of the three-point support. The gap enables helium or other gas to be supplied to the space contacting each lens. Therefore, in this embodiment, as shown in FIG. 16(a), the aspherical unit 313 including the lens frames 335A to 335D is also used as a cylindrical purge unit 309. That is, the upper and lower gaps in the purge unit 309 are sealed with sealing members 337A and 337B of a silicon resin or the like. The sealing members 337A and 337B use a material that does not cause the lenses in the lens frames 335A to 335D to become cloudy and that prevents leakage of helium gas and changes little with time. Consequently, the space between the inner surface of the purge unit 309 and the peripheries of the lens frames 335A to 335D and the lenses therein becomes a closed space that is completely isolated from the outside of the purge unit 309. The space 338 is supplied with helium gas through the intermediate tube 310, and helium gas flowing through the space 338 is discharged through the discharge tube 308 without stagnating.

In FIG. 13, the aspherical units 315 and 316 are also assembled according to the split lens barrel system. The aspherical units 315 and 316 are accommodated in series in a single purge unit 311 and sealed therein.

Figure 20B:
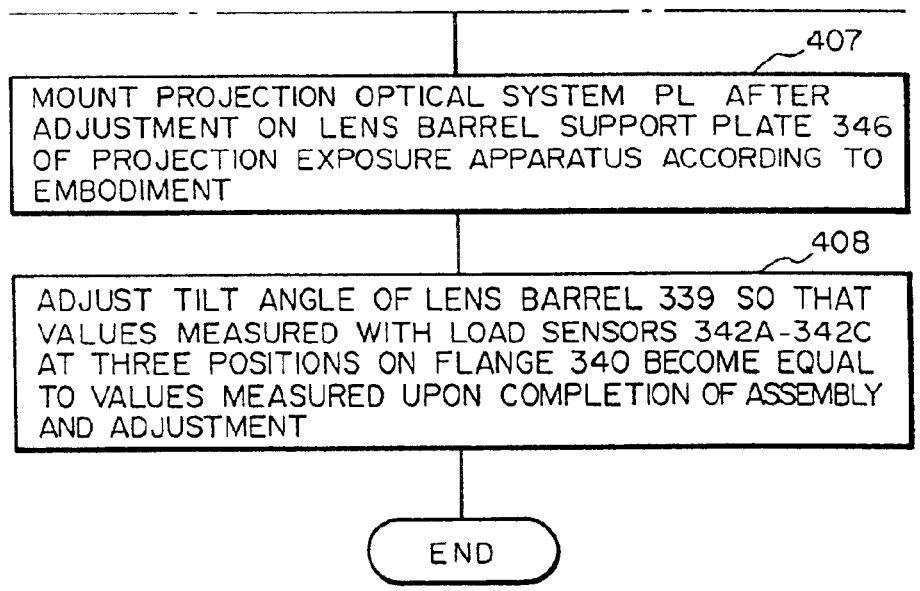
FIG. 20 is a flowchart showing the flow of assembly and adjustment of the projection optical system shown in FIG. 13.

Next, one example of a method of assembling and adjusting the projection optical system PL in this embodiment will be described with reference to the flowchart of FIG. 20. First, at step 401 in FIG. 20, the aspherical units 315 and 316 are placed in the corresponding purge unit 311 such that their respective positional relationships and optical axes are matched with each other as stated above. Then, the upper and lower gaps in the purge unit 311 are sealed. At step 402, other lens units such as the image-forming characteristic varying units 303 and 317 are each assembled. It should, however, be noted that driving elements for finely moving lenses are also mounted in the image-forming characteristic varying units 303 and 317. At step 403, these lens units are stacked on top of another while the spacing and transverse displacement therebetween are being adjusted. Outer casings (purge unit 309 and so forth) for these lens units are lens barrels separate from each other and form a single lens barrel 339 after the lens units have been stacked.

Figure 17A:
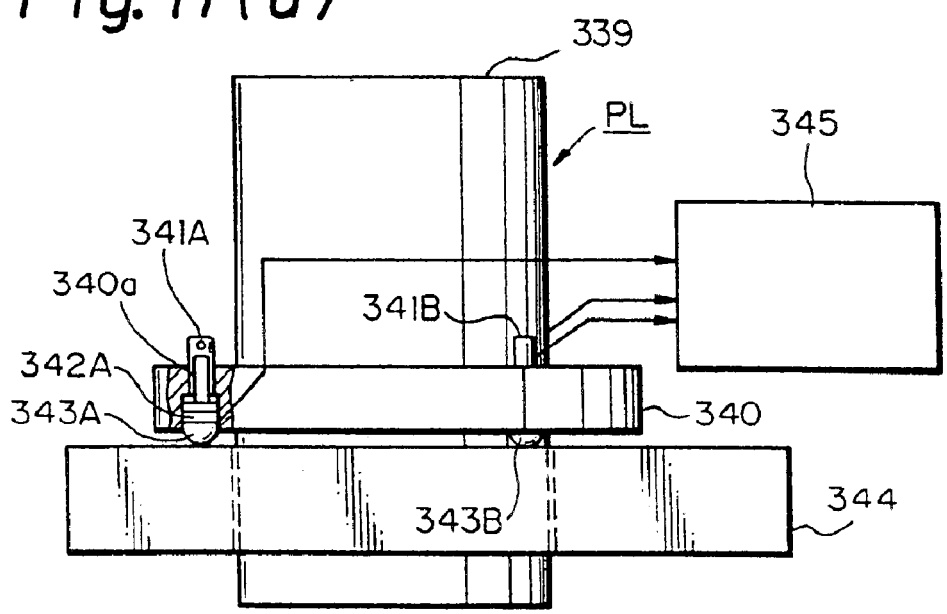
FIG. 17(a) is a front view showing a projection optical system in the state of being assembled and adjusted.
Figure 17B:
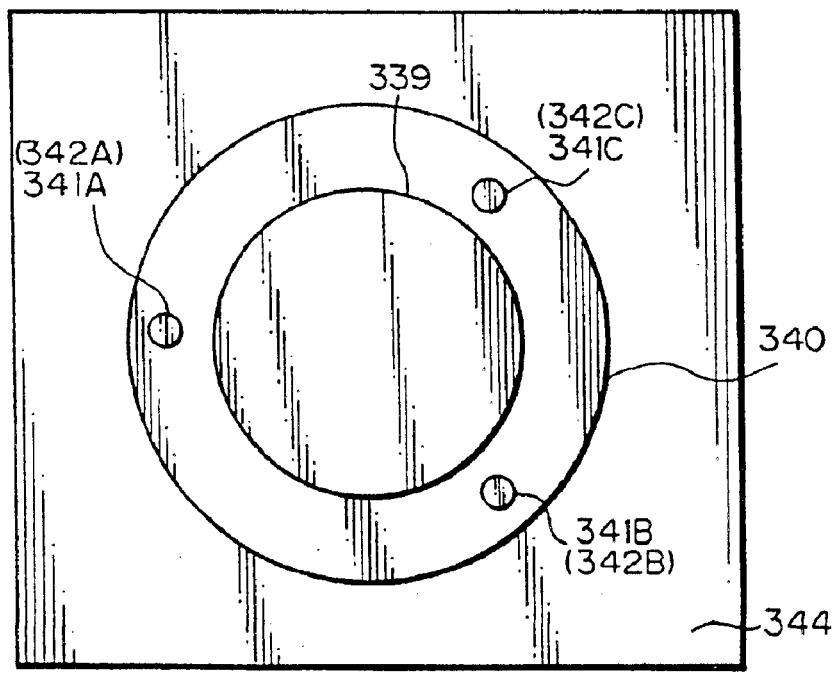
FIG. 17(b) is a plan view of the projection optical system shown in FIG. 17(a).

FIG. 17(a) is a front view showing the projection optical system PL in the state of being assembled and adjusted, and FIG. 17(b) is a plan view showing the projection optical system PL. Each lens unit is secured in the lens barrel 339 of the projection optical system PL so as to be immovable in a predetermined positional relationship. An adjusting screw mechanism is provided on the side of the lens barrel 339 to secure each lens unit after properly shifting it transversely. In addition, a retaining flange 340 is secured to the side of the lens barrel 339. At step 404, for the final adjustment of the image-forming characteristics, the lens barrel 339 is passed through a through-hole in a support plate 344 for adjustment, and the flange 340 is placed on the support plate 344. An illumination optical system for adjustment is installed on the support plate 344, and an image-forming characteristic measuring system is installed on the bottom of the support plate 344.

As shown in FIGS. 17(a) and 17(b), adjusting screws 341A to 341C for height adjustment are screwed into three screw-receiving holes provided in the flange 340 at equal angular intervals. The bottoms of the adjusting screws 341A to 341C are provided with load sensors 342A to 342C, e.g. load cells, serving as pressure sensors. Projection members 343A to 343C (343C is not shown) with spherical end portions are provided between the load sensors 342A to 342C and the support plate 344. In this embodiment, the gap between the flange 340 and the support plate 344 can be adjusted by turning the adjusting screws 341A to 341C. Outputs from the load sensors 342A to 342C are supplied to an adjustment controller 345. The adjustment controller 345 stores loads detected by the load sensors 342A to 342C according to an instruction from the operator as occasion demands.

At step 405, exposure light is applied to the projection optical system PL from the illumination optical system for adjustment (not shown) to measure the image-forming characteristics of the projection optical system PL by the image-forming characteristic measuring system (not shown). While doing so, the positional relationship of each lens unit is adjusted by using the adjustment screw mechanism provided on the lens barrel 339'. If necessary, the tilt angle of the lens barrel 339 is adjusted by using the adjusting screws 341A to 341C provided on the flange 340. The measurement and adjustment of the image-forming characteristics are repeated. The adjustment is terminated when the desired image-forming characteristics have been obtained, and load values measured at the three positions of the flange 340, which are detected through the load sensors 342A to 342C, are stored in memory.

At step 407, the projection optical system PL is removed from the support plate 344 and, as shown in FIG. 18, mounted on a lens barrel support plate 346 in the projection exposure apparatus according to this embodiment. The lens barrel support plate 346 is a flat plate having a U-shaped recess 346a. The flange 340 of the lens barrel 339 of the projection optical system PL is mounted on the lens barrel support plate 346 through the adjusting screws 341A to 341C. The projection exposure apparatus has already incorporated various mechanisms, i.e. the illumination optical system 328, the reticle and wafer stages and so forth, which are shown in FIG. 13. Adjustment of these mechanisms is performed in parallel to the adjustment of the projection optical system PL as a single element, which needs a long period of time for assembly and adjustment. Therefore, the illumination optical system and the stages have already been incorporated above and below the lens barrel support plate 346 shown in FIG. 18, and there is no space for loading the projection optical system PL from above the lens barrel support plate 346. For this reason, in this embodiment, the lens barrel support plate 346 is formed in a U-shape to enable the projection optical system PL to be loaded into the U-shaped recess 346a from a side thereof as shown by the arrow.

At step 408, the heights of the adjusting screws 341A to 341C are adjusted so that loads measured with the load sensors 342A to 342C at the three positions on the flange 340 become equal to the loads measured after the completion of the assembly and adjustment. Thus, the tilt angle of the lens barrel 339 of the projection optical system PL becomes equal to the tilt angle after the completion of the assembly and adjustment. In the prior art, no load sensors are used; therefore, when the projection optical system PL is mounted on the lens barrel support plate 346, deformation occurs on two sides of the recess 346a, making it impossible to reproduce the posture of the projection optical system PL on the support plate 344 for adjustment. Accordingly, the prior art requires readjustment to be carried out on the projection exposure apparatus side. In this embodiment, the flange 340 is supported at three points, and the projection optical system PL is mounted such that loads at the three points reproduce the values measured during the adjustment. Therefore, the time required for adjustment on the projection exposure apparatus side is shortened.

When the rigidity of the lens barrel support plate 346 at the two sides of the U-shaped recess 346a is weak, a reinforcing member may be provided to extend across the open end of the recess 346a after the projection optical system PL has been mounted. The height adjustment of the flange 340 may be performed by changing the number of washers to be used instead of adjusting the screws 341A to 341C.

Although in the foregoing embodiment ArF excimer laser light is used as exposure light, it should be noted that the present invention is also applicable in cases where KrF excimer laser light, $F_2$ laser light (wavelength: 157 nm), $Kr_2$ (146 nm) laser light, or KrAr (134 nm) laser light is used as exposure light.

As stated above, according to this embodiment, the aspherical units 313, 315 and 316 having aspherical lenses are introduced into the projection optical system PL of the step-and-scan type projection exposure apparatus. Helium gas is supplied into the aspherical units 313, 315 and 316, and another gas (nitrogen gas or dry air) is supplied into other optical units, thereby correcting variations in the image-forming characteristics due to the atmospheric pressure and the irradiation energy of exposure light. Thus, it is possible to design and produce a high-NA projection optical system having a wide exposure field. As a result, it becomes possible to expose line-and-space patterns with a line width of 150 nm to 90 nm by using ArF excimer laser light (or KrF excimer laser light, for example). Using a laser light source of a shorter wavelength than those stated above makes it possible to expose line-and-space patterns with a line width of 90 nm to 70 nm.

Furthermore, the embodiment uses a split lens barrel system in which adjustment is performed for each lens unit during the assembly of the projection optical system PL. Accordingly, each lens can be incorporated into the projection optical system PL in a short period of time and with a predetermined positional relationship. In addition, the lens barrel support plate 346 of the projection exposure apparatus is formed into a U-shape, and the projection optical system PL is mounted on the lens barrel support plate 346 such that loads measured with load sensors at three points on the flange of the projection optical system PL reproduce the values measured during the adjustment. Therefore, the time required to adjust the projection optical system on the projection exposure apparatus side is reduced. It is also possible to perform the adjustment of the projection optical system as a single element, which takes a long time in process, in parallel to the adjustment of other members of the projection exposure apparatus. Accordingly, the time required to set up the projection exposure apparatus can be shortened. Furthermore, the three projections for supporting each lens, the three projections for supporting each lens frame and the three projections for supporting the flange can be staggered relative to each other or set at the same positions by taking into consideration the arrangement of the projections. By doing so, the effect of strain due to each load can be reduced or equalized at each position.

Furthermore, in this embodiment, helium gas-whose pressure and temperature have been controlled is supplied into the aspherical units 313, 315 and 316 having aspherical lenses, thereby preventing the image-forming characteristics from being degraded by the aspherical lenses. Accordingly, the aspherical units 313, 315 and 316 can be regarded as stable in correcting a magnification error, focus variation, field curvature variation, decentration comatic aberration, astigmatism, etc., due to the influence of the atmospheric pressure and exposure light irradiation energy, through the image-forming characteristic varying units 303 and 317. Accordingly, the correction of image-forming characteristics is facilitated.

In the scanning exposure system, the exposure light illumination area with respect to the lenses placed near the reticle R and wafer W in the projection optical system PL is in the shape of a slit, e.g. a rectangular slit. Therefore, there may be aberration factors that cannot satisfactorily be corrected by only the control of the spherical lens units. In such a case, the image-forming characteristics may be corrected by finely moving some aspherical lenses in the aspherical units 313, 315 and 316 in an atmosphere filled with a gas other than helium gas as in the case of the spherical lenses or by varying the pressure, temperature, etc. of the gas.

It is expected that after the ArF excimer laser light source, a light source of a shorter wavelength such as an $F_2$ laser light source (wavelength: 157 nm) will be used as a light source for exposure. In this case, most or all of the lenses may be fluorite lenses. Fluorite has a high coefficient of linear expansion and is readily deformable. Therefore, it is desirable to supply helium gas (or a gas equivalent to it, which has a high thermal conductivity) around the fluorite lenses to remove heat from the fluorite lenses to the outside. Furthermore, as the wavelength of light used for exposure becomes shorter, the transmittance of the coating provided on the lenses becomes lower. Consequently, it becomes easier for the coating to absorb the heat energy of exposure light. Therefore, when fluorite lenses are used to cope with the situation that the wavelength of exposure light is becoming shorter, it is desirable to supply helium gas or the like in order to remove heat from the coating. In this case also, it is expected that variations in the atmospheric pressure and the irradiation energy of exposure light will cause the image-forming characteristics to be deteriorated. Therefore, it is very useful to control the lens units covered with a gas other than helium gas according to aberration variations in the projection optical system. Furthermore, $F_2$ (157 nm) laser light and light of shorter wavelength are not transmitted by any gas other than helium gas. Therefore, helium gas is supplied near the fluorite lenses, and a purge gas is supplied through the other portions. By doing so, the amount of helium gas supplied can be reduced.

Similarly, when fluorite lenses are used for achromatization, it is possible to stabilize the image-forming characteristics by placing the fluorite lenses in a helium gas atmosphere.

In this embodiment, helium gas is supplied to flow through the aspherical units 313, 315 and 316 including aspherical lenses. In this regard, the lens units including spherical lenses are also affected by variations in the atmospheric pressure and temperature. Therefore, the image-forming characteristic control accuracy is improved by supplying helium gas for the spherical lenses, exclusive of those for which the position control is actively performed to maintain the required image-forming characteristics.

In the above-described embodiment, predetermined lenses and correcting plates are driven positively to control the image-forming characteristics. However, the image-forming characteristics may be controlled by changing the pressure and/or temperature of a gas present between the predetermined lenses and correcting plates.

FIG. 19 shows a modification as stated above, in which members or portions corresponding to those in FIG. 13 are denoted by the same reference characters. In FIG. 19, a gas control system 331A controls the pressure, temperature and humidity of nitrogen gas (or dry air, for example) in a hermetic chamber 303a between aberration correcting plates in the image-forming characteristic varying unit 303, which constitutes the projection optical system PL. A gas control system 329A controls the pressure, temperature and humidity of nitrogen gas (or dry air, for example) in a hermetic chamber 301a between predetermined lenses in the image-forming characteristic varying unit 301. A gas control system 330A controls the pressure, temperature and humidity of nitrogen gas (or dry air, for example) in a hermetic chamber 314a between predetermined optical members in the pupil varying unit 314. Thus, the image-forming characteristics are corrected. In this case also, helium gas is supplied to flow through the aspherical units 313, 315 and 316 including aspherical lenses. It should be noted that the control of the pressure, etc. of a gas in each hermetic chamber may be combined with a control operation in which lenses or other optical elements are driven.

Next, another embodiment of the present invention will be described with reference to FIG. 21. In this embodiment, a cleaning light source that emits laser light for optically cleaning optical members forming an illumination optical system and projection optical system is provided independently of a light source for exposure.

Figure 21:
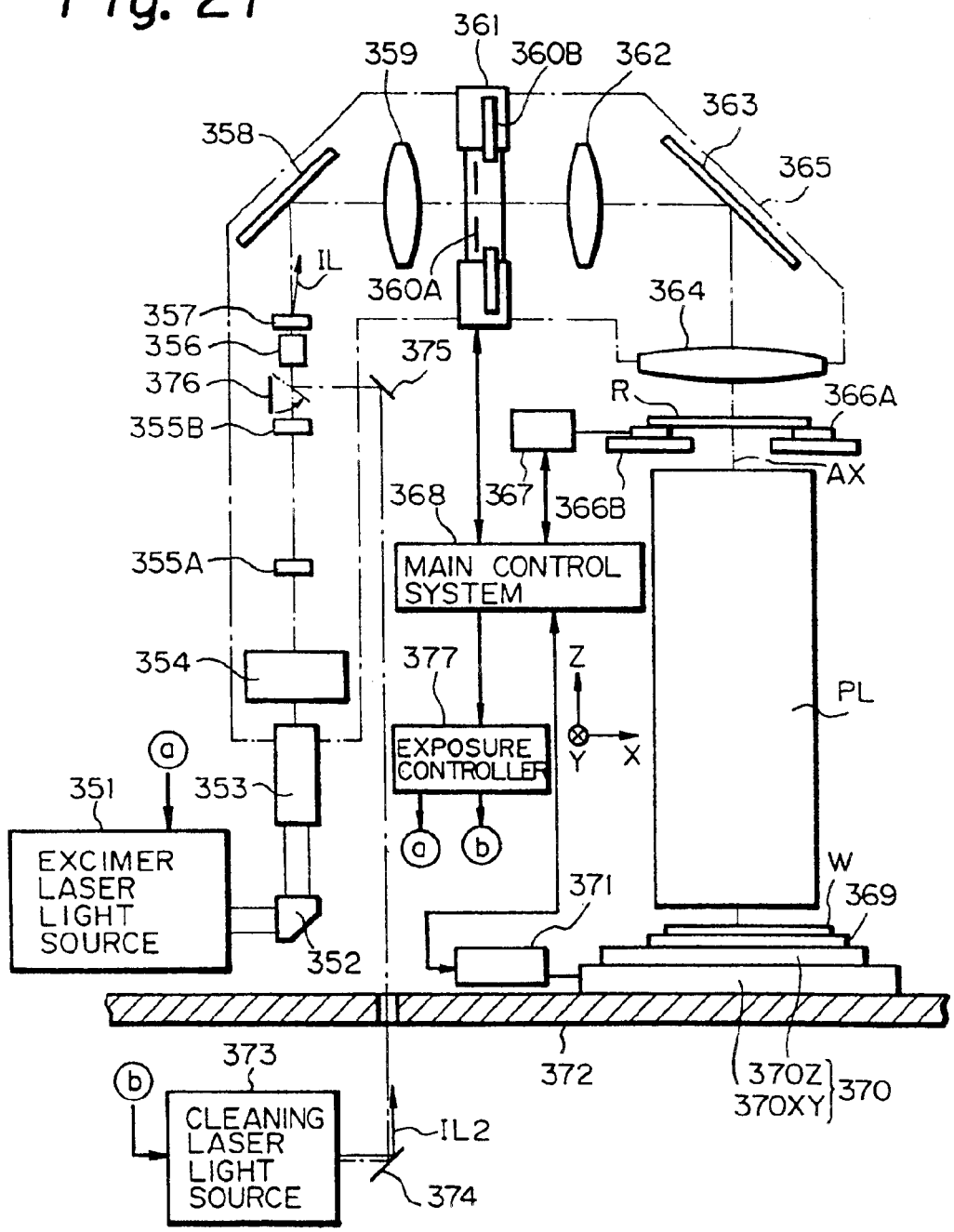
FIG. 21 is a diagram schematically showing the arrangement of a projection exposure apparatus according to another embodiment of the present invention.

FIG. 21 schematically shows the arrangement of a projection exposure apparatus in this embodiment. In FIG. 21, an ArF excimer laser light source 351 emits exposure light IL that is narrow band ultraviolet pulsed light of wavelength 193 nm. The exposure light IL passes through a beam matching unit (BMU) 352 including a movable mirror and so forth for positional matching of the optical path between the light source 351 and the exposure apparatus main body. Then, the exposure light IL enters a variable light-reducing device 354 as an optical attenuator through a lightproof pipe 353. An exposure controller 377 for controlling the amount of exposure light applied to a resist on a wafer controls the start and stop of the emission of light from the ArF excimer laser light source 351 and the oscillation frequency thereof. The exposure controller 377 also controls the output of the light source 351 that is determined by the pulse energy. Furthermore, the exposure controller 377 adjusts stepwisely or continuously the rate of reduction of ultraviolet pulsed light in the variable light-reducing device 354. It should be noted that the present invention is also applicable in cases where KrF excimer laser light of wavelength 248 nm, the i-line (wavelength: 365 nm) from a mercury lamp or the like is used as exposure light.

Exposure light IL passing through the variable light-reducing device 354 enters a fly's-eye lens 356 through a beam shaping optical system consisting essentially of lens systems 355A and 355B disposed in series along a predetermined optical axis. Although a single fly's-eye lens 356 is provided in this embodiment, two fly's-eye lenses may be disposed in series as disclosed, for example, in Japanese Patent Application Unexamined Publication (KOKAI) No. 1-235289. An illumination system aperture stop system 357 is placed in the exit plane of the fly's-eye lens 356. The aperture stop system 357 has various aperture stops such as a circular aperture stop for ordinary illumination, an aperture stop for modified illumination that consists of a plurality of decentered small apertures, and an aperture stop for annular zone illumination. The aperture stop system 357 is arranged such that these aperture stops can be switched from one to another. Exposure light IL emanating from the fly's-eye lens 356 and passing through a predetermined aperture stop in the aperture stop system 357 is reflected by a mirror 358. The reflected exposure light IL passes through a condenser lens system 359 and enters a fixed illumination field stop (fixed blind) 360A in a reticle blind mechanism 361. The fixed blind 360A has an aperture extending in a straight-line slit shape or rectangular shape (hereinafter referred to as a "slit shape" collectively) in a direction perpendicular to the scanning exposure direction in the center of a circular field of a projection optical system PL as disclosed, for example, in Japanese Patent Application Unexamined Publication (KOKAI) No. 4-196513. Further, the reticle blind mechanism 361 is provided therein with a movable blind 360B for varying the width of the illumination field area in the scanning exposure direction separately from the fixed blind 360A. The movable blind 360B is used to shorten the scanning stroke of the reticle stage and to reduce the width of the light-blocking frame of a reticle R.

Exposure light IL is shaped into a slit shape by the fixed blind 360A in the reticle blind mechanism 361. Then, the slit-shaped exposure light IL passes via a lens system 362 for image formation, a reflecting mirror 363 and a main condenser lens system 364 and illuminates an illumination area over a circuit pattern area of the reticle R with a uniform intensity distribution. The illumination area is similar to the slit-shaped aperture of the fixed blind 360A. In other words, the aperture of the fixed blind 360A, or a plane where the aperture of the movable blind 360B is placed, is made approximately conjugate with the pattern surface of the reticle R by a composite system of the image-forming lens system 362 and main condenser lens system 364.

The projection optical system PL is telecentric on both sides (or on the wafer side only). A wafer W is placed in the image-formation plane of the projection optical system PL. Under the exposure light IL, an image of a circuit pattern on the reticle R within the illumination area is transferred onto a slit-shaped exposure area of a resist layer on the wafer F through the projection optical system PL with a predetermined projection magnification $\beta$ ($\beta$ is ¼ or ⅕, for example). The exposure area lies on one of a plurality of shot areas on the wafer W. The projection optical system PL in this embodiment is a dioptric system. However, a catadioptric system is also usable as the projection optical system PL. In the following description, a Z-axis is taken in a direction parallel to an optical axis AX of the projection optical system PL. An X-axis is taken in a direction parallel to the scanning direction (a direction parallel to the plane of FIG. 21) in a plane perpendicular to the Z-axis. A Y-axis is taken in a direction parallel to a non-scanning direction (a direction perpendicular to the plane of FIG. 21) perpendicular to the scanning direction.

The reticle R is held by vacuum on a reticle stage 366A. The reticle stage 366A is mounted on a reticle base 366B so as to be movable in the direction X with constant velocity and finely movable in the directions X and Y and also in the direction of rotation. The two-dimensional position and rotational angle of the reticle stage 366A (reticle R) are measured in real time by laser interferometers provided in a drive control unit 367. Driving motors (linear motors, voice coil motors, etc.) in the drive control unit 367 control the scanning speed and position of the reticle stage 366A on the basis of the results of measurement by the laser interferometers and control information from a main control system 368 consisting essentially of a computer that controls operations of the whole apparatus.

The wafer W is held by vacuum on a wafer holder 369 mounted on a Z-tilt stage 370Z. The Z-tilt stage 370Z is fixed on an X-Y stage 370XY which is two-dimensionally movable in an XY-plane parallel to the image plane of the projection optical system PL. The Z-tilt stage 370Z and the X-Y stage 370XY constitute a wafer stage 370. The Z-tilt stage 370Z controls the focus position (position in the direction Z) and tilt angle of the wafer W to make the surface of the wafer W coincident with the image plane of the projection optical system PL by autofocusing and autoleveling systems. The X-Y stage 370XY performs constant-velocity scanning of the wafer W in the direction X and stepping of the wafer W in the directions X and Y. The two-dimensional position and rotational angle of the Z-tilt stage 370Z (wafer W) are measured in real time by laser interferometers in a drive control unit 371. Drive motors (linear motors or the like) in the drive control unit 371 control the scanning speed and position of the X-Y stage 370XY. A rotational error of the wafer W is corrected by rotating the reticle stage 366A through the main control system 368 and the drive control unit 371.

The main control system 368 sends various information, such as the travel position, speed and acceleration and position offset of each of the reticle stage 366A and X-Y stage 370XY, to the drive control units 367 and 371. During scanning exposure, the reticle R is scanned in the direction +X (or −X) at speed VR relative to the exposure light illumination area through the reticle stage 366A. In synchronism with the scanning of the reticle R, the wafer W is scanned in the direction −X (or +X) at speed β VR (β is the projection magnification for image transfer from the reticle R to the wafer W) relative to the reticle pattern image exposure area through the X-Y stage 370XY.

Further, the main control system 368 effects control such that the movement of each blade of the movable blind 360B, which is provided in the reticle blind mechanism 361, is synchronized with the movement of the reticle stage 366A during the scanning exposure. Furthermore, the main control system 368 sets various exposure conditions to carry out scanning exposure for the resist in each shot area on the wafer W with a correct amount of exposure light and executes an optimum exposure sequence in cooperation with the exposure controller 377. More specifically, when an instruction to start scanning exposure for one shot area on the wafer W is issued from the main control system 368 to the exposure controller 377, the exposure controller 377 starts emission of light from the ArF excimer laser light source 351. Upon completion of the scanning exposure for the shot area concerned, the emission of light from the ArF excimer laser light source 351 is stopped.

In this embodiment, because the ArF excimer laser light source 351 is used, a sub-chamber 365 is provided to shut off the illuminating light paths, which extend from the pipe 353 through the variable light-reducing device 354, the lens systems 355A, 355B and the fly's-eye lens 356 to the main condenser lens system 364, from the outside air. Dry nitrogen gas ($N_2$) having an oxygen content reduced to an extremely low level is supplied throughout the sub-chamber 365 through piping (not shown).

Furthermore, the wafer stage 370 in this embodiment is installed on a floor 372, and a laser light source 373 for cleaning is installed under the floor 372. The cleaning laser light source 373 is an ArF excimer laser light source. Ultraviolet pulsed light IL2 from the cleaning laser light source 373 is reflected by a mirror 374 to pass through a hole provided in the floor 372. Thereafter, the ultraviolet pulsed light IL2 is reflected by a mirror 375 to travel toward a position between the fly's-eye lens 356 and the relay system 355B. A movable mirror 376 is provided at that position such that the movable mirror 376 can withdraw from the optical path of exposure light IL. By placing the movable mirror 376 in front of the fly's-eye lens 356 at 45 degrees to the optical axis, the ultraviolet pulsed light IL2 enters the fly's-eye lens 356 via the movable mirror 376.

The exposure controller 377 in this embodiment operates as follows. During exposure, the exposure controller 377 controls the emission of light from the ArF excimer laser light source 351 while suspending the emission of light from the cleaning laser light source 373. When there is no wafer under the projection optical system PL during the time between successive exposure processes, for example, the exposure controller 377 suspends the emission of light from the ArF excimer laser light source 351 and places the movable mirror 376 in front of the fly's-eye lens 356. Then, the exposure controller 377 allows the cleaning laser light source 373 to emit light. Consequently, ultraviolet pulsed light IL2 passes through the fly's-eye lens 356 to the main condenser lens system 364 and then passes through the projection optical system PL. If extreme ultraviolet pulsed light such as ArF excimer laser light is applied to an optical member, e.g. a lens or a mirror, a foreign matter on the surface of the optical member, such as a clouding substance, volatilizes, and thus the transmittance or reflectivity of the optical member is improved. Therefore, by allowing the cleaning laser light source 373 to emit light periodically, the transmittances of the illumination optical system and projection optical system PL are maintained at high level, and the utilization efficiency of exposure light IL used thereafter is improved.

In this embodiment, the cleaning laser light source 373 is provided outside the chamber accommodating the projection exposure apparatus. Therefore, vibrations and heat generated from the cleaning laser light source 373 will not affect the projection exposure apparatus.

According to a projection exposure apparatus of the present invention, at least a part of optical members having aspherized surfaces or made of fluorite are placed in a gas that is not readily affected by variations in the atmospheric conditions. Therefore, high image-forming characteristics can be obtained in the projection optical system. Furthermore, because an image-forming characteristic correcting member is provided, the high image-forming characteristics can be maintained even if there is a change in the environmental conditions, e.g. atmospheric pressure. In particular, when an optical member having an aspherized surface is used, the numerical aperture can be raised to a level of the order of 0.65 or higher without increasing the size of the projection optical system. Therefore, it is possible to transfer fine patterns having a line width smaller than 150 nm with high accuracy.

According to another projection exposure apparatus of the present invention, at least a part of optical members having aspherized surfaces or made of fluorite are placed in a gas that is not readily affected by variations in the atmospheric conditions. Therefore, high image-forming characteristics can be obtained in the projection optical system.

In these cases, when the gas that is not readily affected by variations in the atmospheric conditions is helium gas, the optical characteristics of optical members, particularly those which are located around it, are maintained stably because helium gas is inert and does not absorb exposure light and further has a high thermal conductivity.

According to still another projection exposure apparatus of the present invention, the projection optical system can be readily positioned to reproduce the posture thereof during the assembly and adjustment. Therefore, high image-forming characteristics can be obtained.

It should be noted that the present invention is not necessarily limited to the above-described embodiments, but may adopt various arrangements without departing from the gist of the present invention.

The entire disclosure of Japanese Patent Application Nos. 045795 and 045796 each filed on Mar. 4, 1996 and Japanese Patent Application No. 227712 filed on Aug. 25, 1997 including specification, claims, drawings and summary is incorporated herein by reference in their entireties.

What is claimed is:

1. A maintenance method of an exposure apparatus which forms a pattern onto an object by exposure light from a light source, said maintenance method comprising the steps of:
   supply a first gas through a gas supply device into a casing when said pattern is formed onto the object by the exposure light, said casing accommodating at least a light path portion of said exposure light;
   supplying a second gas through said gas supply device into said casing when maintenance of the inside of said casing is conducted, said second gas being different from said first gas.

2. A maintenance method according to claim 1, further comprising a step of confirming that said first gas in said casing has been replaced with said second gas.

3. A maintenance method according to claim 1, wherein maintenance of the inside of said casing is commenced after being confirmed that said first gas in said casing has been replaced with said second gas.

4. A maintenance method according to claim 3, wherein said first gas is a gas which has low absorptance with respect to said exposure light and said second gas is air.

5. A maintenance method according to claim 4, wherein the gas which has low absorptance with respect to said exposure light is a gas selected from the group consisting of nitrogen and helium, and said air is air having dust and ozone removed therefrom.

6. A maintenance method according to claim 1, wherein said casing accommodates a space communicating with the light path of said exposure light.

7. A maintenance method according to claim 1, wherein said casing accommodates an illumination optical system that illuminates a mask having said pattern formed thereon.

8. A maintenance method according to claim 1, wherein said gas supply device includes:
   a first supply device from which said first gas is supplied into said casing when the pattern is formed onto the object by said exposure light; and
   a second supply device from which said second gas is supplied into said casing when the maintenance of the inside of the casing is conducted.

9. A maintenance method according to claim 8, wherein a changeover between said first gas and said second gas is conducted by means of a gas changeover device connected to said first supply device and said second supply device.

* * * * *